United States Patent
Onimaru

(10) Patent No.: US 9,876,060 B2
(45) Date of Patent: Jan. 23, 2018

(54) METHOD OF FABRICATING A BANK REPAIR FOR ORGANIC DISPLAY DEVICE

(71) Applicants: JOLED INC., Tokyo (JP); JAPAN DISPLAY INC., Tokyo (JP)

(72) Inventor: Toshiaki Onimaru, Tokyo (JP)

(73) Assignees: JOLED INC., Tokyo (JP); JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 15/225,887

(22) Filed: Aug. 2, 2016

(65) Prior Publication Data

US 2017/0040393 A1 Feb. 9, 2017

(30) Foreign Application Priority Data

Aug. 4, 2015 (JP) .................................. 2015-153871

(51) Int. Cl.
*H01L 21/00* (2006.01)
*H01L 29/08* (2006.01)
(Continued)

(52) U.S. Cl.
CPC ...... *H01L 27/3246* (2013.01); *H01L 27/3244* (2013.01); *H01L 51/0005* (2013.01);
(Continued)

(58) Field of Classification Search
CPC ............. H01L 51/5012; H01L 27/3246; H01L 27/3244; H01L 51/56; H01L 51/504; H01L 51/0005
See application file for complete search history.

(56) References Cited

U.S. PATENT DOCUMENTS

2012/0264235 A1* 10/2012 Hiraoka .................. H01L 51/56
438/4
2014/0154818 A1* 6/2014 Shimamura ............. H01L 51/56
438/4

(Continued)

FOREIGN PATENT DOCUMENTS

JP 2011-108369 6/2011
WO 2010/013654 2/2010

OTHER PUBLICATIONS

U.S. Appl. No. 15/115,763 to Toshiaki Onimaru et al., filed Aug. 1, 2016.

(Continued)

*Primary Examiner* — Alonzo Chambliss
(74) *Attorney, Agent, or Firm* — Greenblum & Bernstein, P.L.C.

(57) ABSTRACT

A bank repair method in a manufacturing process of an organic EL display device including first and second banks forming a matrix over a substrate. When a defect portion of a first bank is detected, in each of adjacent concave spaces between which the first bank having the defect portion is located, a candidate forming position is set and a dam portion partitioning the concave space into a first space in a vicinity of the defect portion and a second space outside the vicinity of the defect portion is formed. When denoting sub-pixel region surface area as H and denoting a surface area of a region of a candidate first space overlapping with a sub-pixel region as I, the dam portion is formed at the candidate forming position according to a first forming method when $I < \alpha \times H$ is fulfilled, where $0.05 < \alpha < 0.9$.

39 Claims, 26 Drawing Sheets

(51) Int. Cl.
*H01L 27/32* (2006.01)
*H01L 51/56* (2006.01)
*H01L 51/00* (2006.01)
*H01L 51/50* (2006.01)

(52) U.S. Cl.
CPC ........ *H01L 51/504* (2013.01); *H01L 51/5012* (2013.01); *H01L 51/56* (2013.01); *H01L 2227/323* (2013.01); *H01L 2251/568* (2013.01)

(56) References Cited

U.S. PATENT DOCUMENTS

2017/0012246 A1* 1/2017 Onimaru ............. H01L 27/3246
2017/0040393 A1* 2/2017 Onimaru ............. H01L 27/3246

OTHER PUBLICATIONS

U.S. Appl. No. 15/116,055 to Kazuhiro Kobayashi et al., filed Aug. 2, 2016.
U.S. Appl. No. 15/122,716 to Yoshiki Hayashida et al., filed Aug. 31, 2016.

* cited by examiner

FIG. 11A
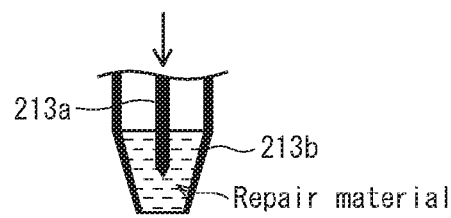
FIG. 11B
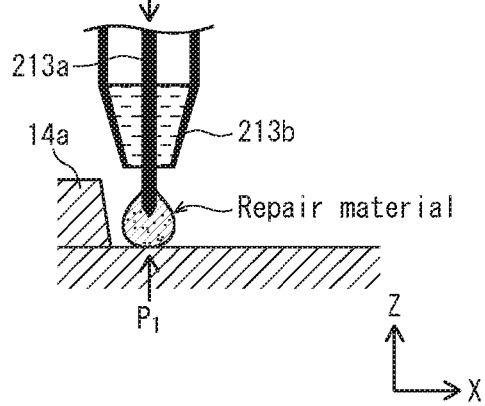
FIG. 11C
FIG. 11D
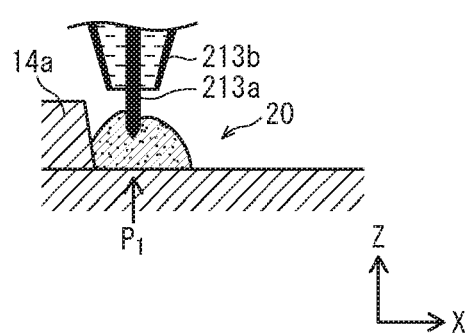
FIG. 11E
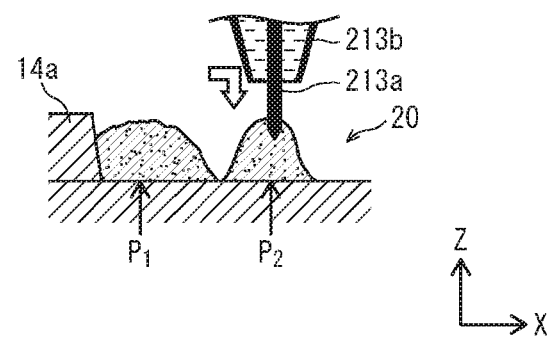
FIG. 11F
FIG. 11G
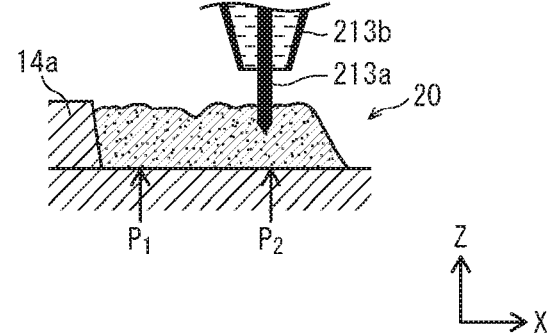
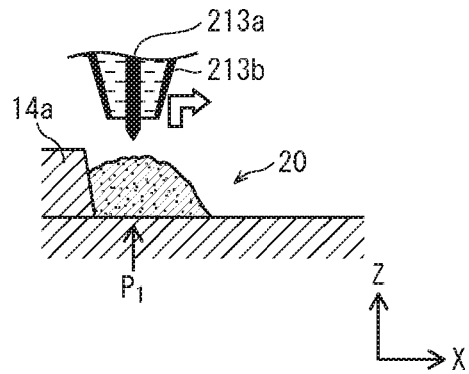
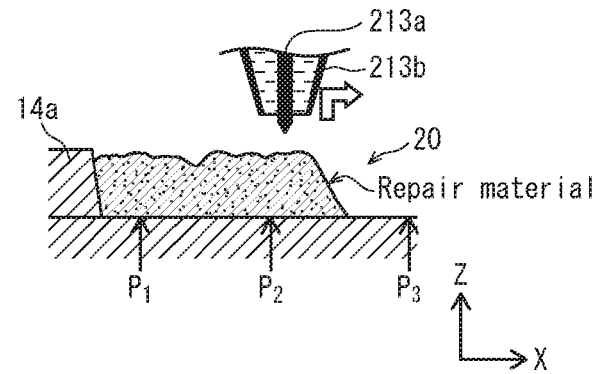

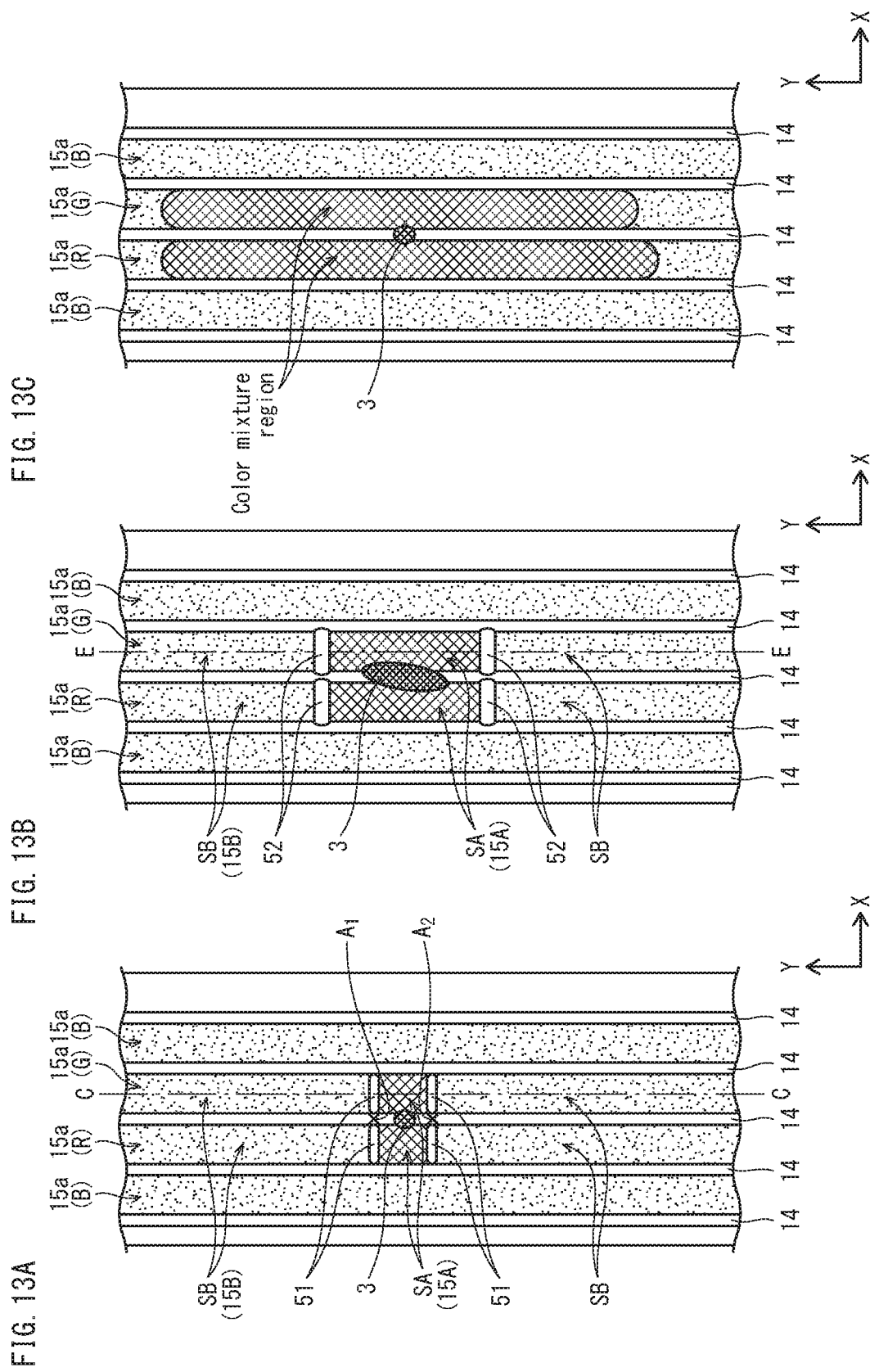

FIG. 15A
FIG. 15B
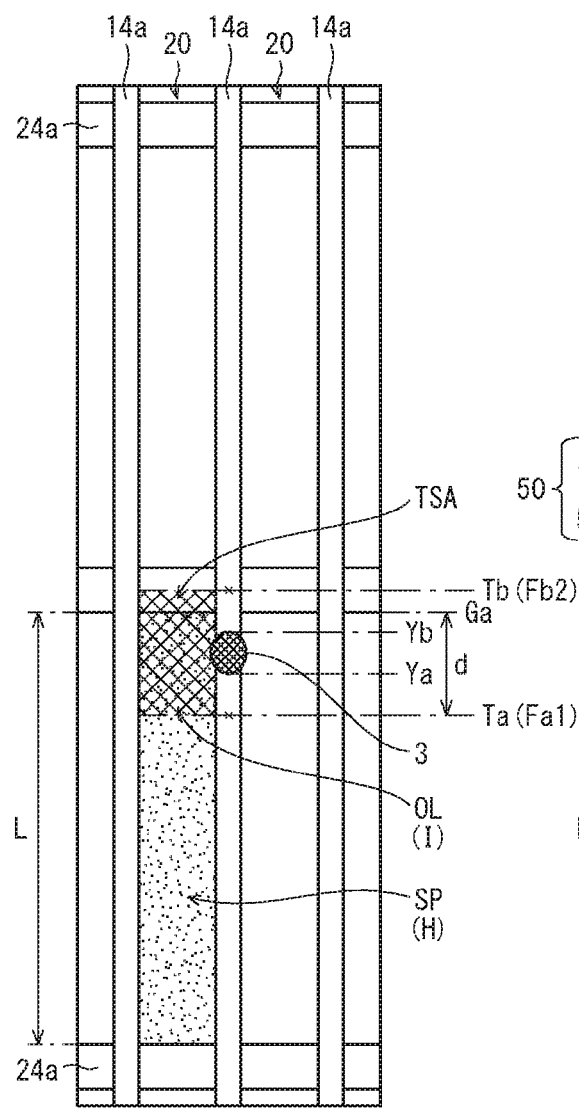
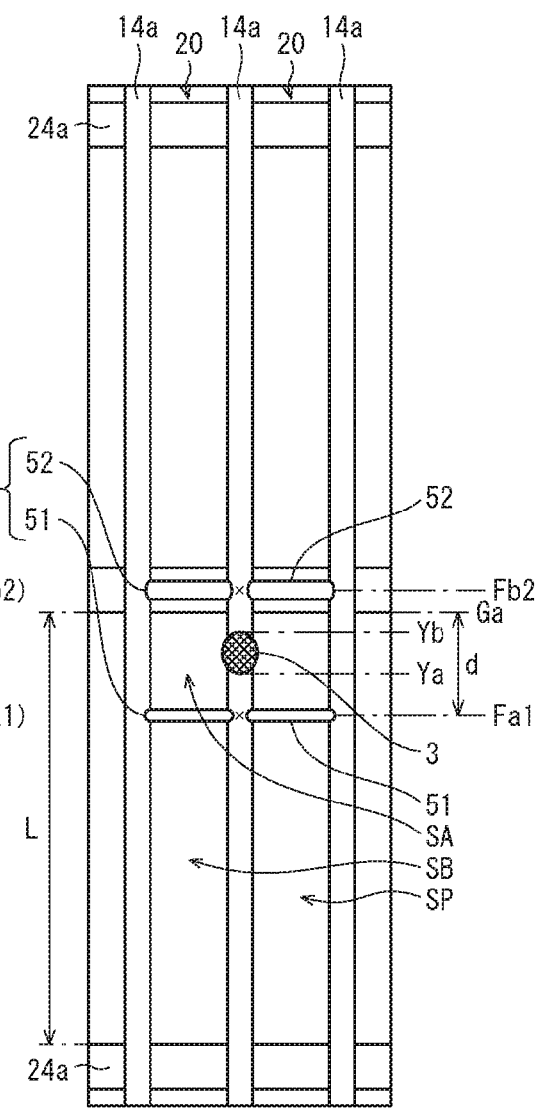

FIG. 16A
FIG. 16B
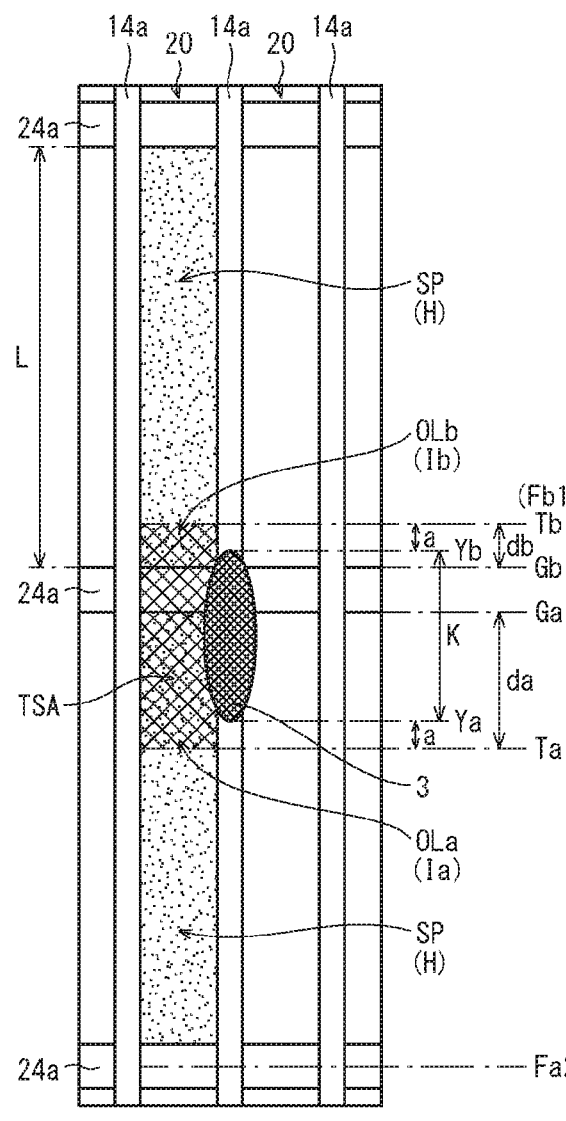
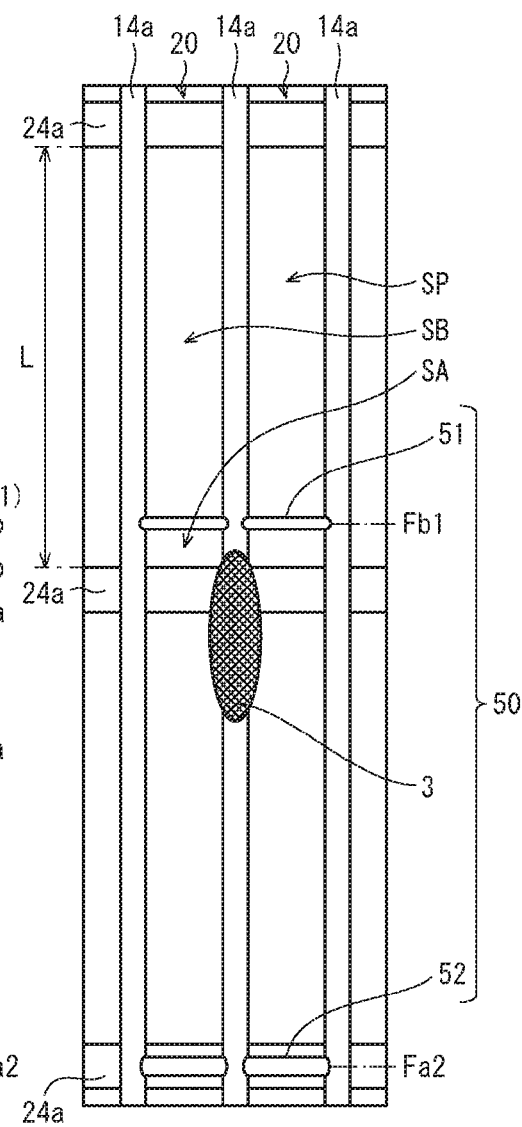

FIG. 21A
FIG. 21B
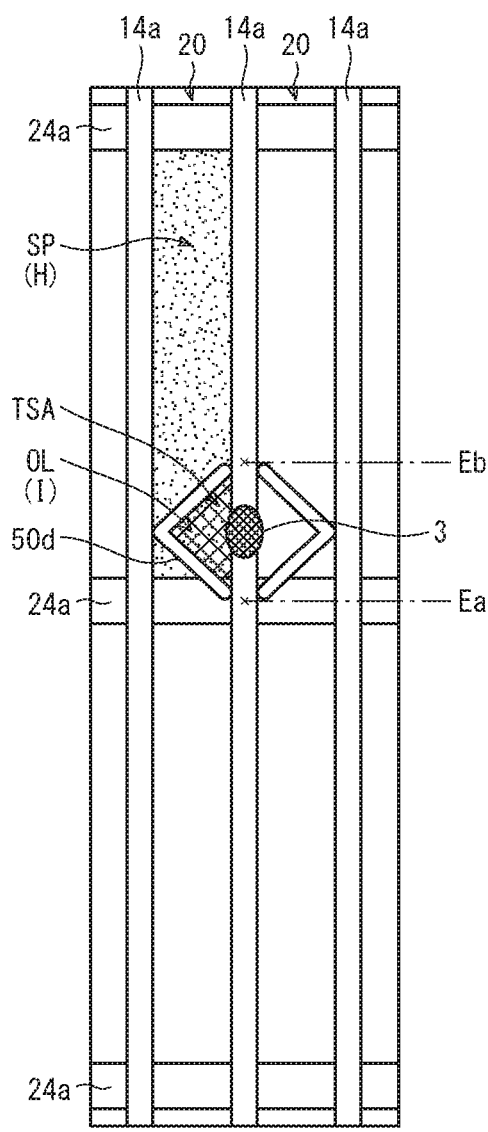
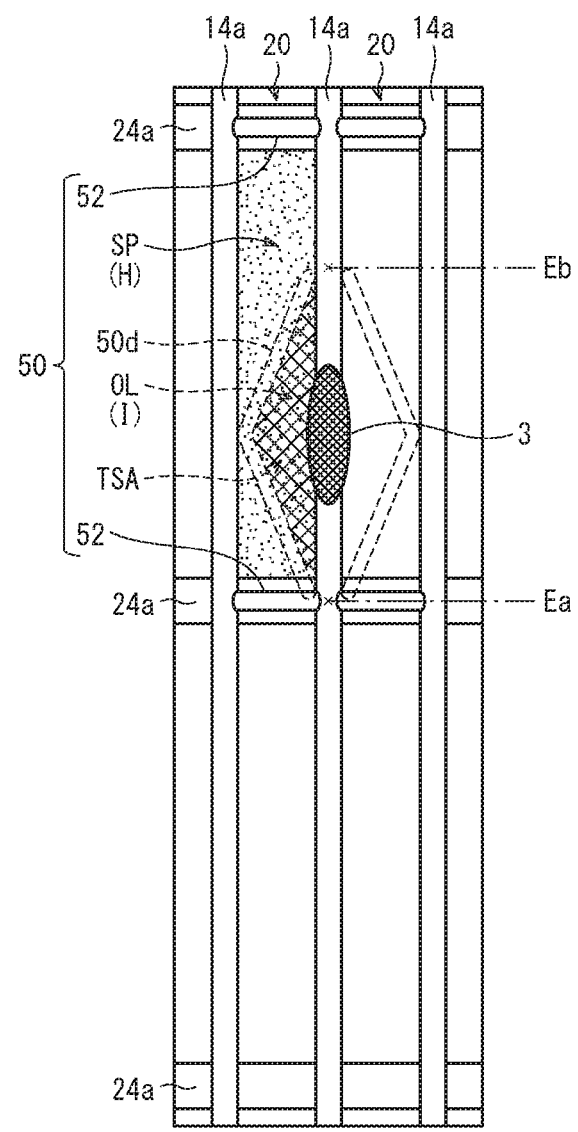

US 9,876,060 B2

METHOD OF FABRICATING A BANK REPAIR FOR ORGANIC DISPLAY DEVICE

This application is based on an application No. 2015-153871 filed in Japan, the contents of which are hereby incorporated by reference.

BACKGROUND OF THE DISCLOSURE (1) Technical Field

The present disclosure is related to a bank repair method, an organic electroluminescence (EL) display device manufacturing method, and an organic EL display device.

(2) Description of Related Art

In recent years, organic EL display panels including a substrate and a matrix of organic EL elements arranged over the substrate have been put into practical use, as one type of a light-emitting display device. Such an organic EL display panel achieves high visibility due to the organic EL elements performing light emission individually. Also, such an organic EL display panel achieves excellent shock resistance due to the organic EL elements being completely solid-state elements.

Organic EL elements in a typical organic EL display panel have a basic structure in which a light-emitting layer containing an organic light-emitting material is disposed between an electrode pair composed of an anode and a cathode. The organic EL elements are driven through voltage application between these electrodes. The organic EL elements are current-driven light-emitting elements, emitting light when holes injected into the light-emitting layer from the anode and electrons injected into the light-emitting layer from the cathode recombine in the light-emitting layer.

In a typical organic EL display panel, a light-emitting layer of one organic EL element is partitioned from a light-emitting layer of an adjacent organic EL element by a bank formed by using an electrically-insulative material.

Further, in an organic EL element of a typical organic EL display panel, one or more organic layers, such as a hole injection layer, a hole transport layer, and a hole injection/transport layer, are disposed as necessary between the anode and the light-emitting layer. Likewise, one or more organic layers, such as an electron injection layer, an electron transport layer, and an electron injection/transport layer are disposed as necessary between the cathode and the light-emitting layer.

These layers, as well as the light-emitting layer, are commonly referred to as functional layers.

In a full-color organic EL display panel, a plurality of organic EL elements having a structure as described above are disposed, and each organic EL element serves as a red sub-pixel, a green sub-pixel, or a blue sub-pixel. Further, each pixel of a full-color organic EL display panel is composed of a set of red, green, and blue sub-pixels disposed next to one another.

The manufacturing of such an organic EL display panel involves a process of forming one or more organic functional layers, including the light-emitting layer, in concave spaces defined by banks, after forming the banks on the substrate. The forming of the organic functional layers is often performed through a wet process of applying, to the concave spaces, an ink containing a macro-molecular material or a low-molecular material suitable for forming a thin film, through an inkjet method or a similar method. Such a wet process enables organic functional layers to be formed relatively easily, even in large panels.

SUMMARY OF THE DISCLOSURE

For a full-color organic EL display panel, inks corresponding to different colors of light are applied with respect to adjacent concave spaces that are partitioned by a bank. Here, if the bank between the adjacent concave spaces has a defect portion having been produced in the manufacturing process of the organic EL display panel, ink applied with respect to one concave space may leak into the adjacent concave space via the defect portion in the process of forming light-emitting layers. This results in inks corresponding to different light-emission colors mixing with one another (referred to in the following as color mixture). Note that in the present disclosure, it is considered that a bank defect portion is produced when, for example, a portion of a bank collapses or a foreign particle adheres to a bank in the manufacturing process of the organic EL display panel.

When an organic EL display device is manufactured using a panel in which such color mixture has occurred, display failures may appear in the manufactured organic EL display device. That is, for example, the region of the organic EL display device where color mixture has occurred may emit light with an undesired color, or may be perceived as a dark spot.

In view of this, there is a demand for a technology of repairing banks having defect portions and thereby preventing such display failures from occurring in display panels.

In view of the above, the present disclosure aims to provide a bank repair method, an organic EL display device manufacturing method, and an organic EL display device that prevent display failures from occurring even if a bank defect portion is produced in the manufacturing process of the organic EL display device.

In order to achieve this arm, one aspect of the present disclosure is a bank repair method in a manufacturing process of an organic EL display device including: a substrate; first banks and second banks disposed over the substrate; and light-emitting layers disposed in concave spaces that the first banks define over the substrate, the first banks elongated in a first direction and spaced away from one another in a second direction, the second banks elongated in the second direction and spaced away from one another in the first direction, the first direction and the second direction being different directions along a top surface of the substrate and intersecting with one another, the bank repair method including: detecting a defect portion of a first bank; when a defect portion of a first bank is detected, setting a candidate forming position for a dam portion in each of adjacent concave spaces between which the first bank having the defect portion is located in the second direction; and forming a dam portion in each of the adjacent concave spaces, a dam portion formed in a concave space partitioning the concave space into a first space in a vicinity of the defect portion and a second space outside the vicinity of the defect portion, wherein when (i) defining a region surrounded by a pair of adjacent first banks and a pair of adjacent second banks as a sub-pixel region, and denoting a plan-view surface area of a sub-pixel region as H, and (ii) defining a region of a candidate first space that overlaps with a sub-pixel region as an overlap region, and denoting a plan-view surface area of the overlap region as I, wherein the candidate first space is the first space when the dam portion is formed at the candidate forming position, when $I < \alpha \times H$ is fulfilled, where $\alpha$ fulfills $0.05 < \alpha < 0.9$, and the candidate first space does not overlap with any second bank in plan view, the dam portion is formed at the candidate forming position according to a first forming method.

According to the bank repair method pertaining to one aspect of the present disclosure, a dam formed in a concave space partitions an ink layer formed in the concave space when inks of different light-emission colors are applied with respect to the adjacent concave spaces to form organic functional layers. Thus, even if a color mixture region is formed in the concave space due to inks of different light-emission colors mixing via the defect portion, the color mixture region is prevented from spreading into the second space, which is outside the vicinity of the defect portion. As such, the spread of the color mixture region is prevented and display failures are prevented from occurring in the organic EL display device.

Further, according to the bank repair method pertaining to one aspect of the present disclosure, bank repair is performed by forming a dam portion around the defect portion. Thus, bank repair can be performed relatively easily even if the detect portion is produced by a foreign particle.

Further, according to the bank repair method pertaining to one aspect of the present disclosure, the dam portion is formed at the provisional forming position when $1<\alpha \times H$ is fulfilled. Thus, it is possible to ensure that the color mixture region has as small a surface area as possible in plan view, and thereby prevent display failures occurring due to display color failure.

BRIEF DESCRIPTION OF THE DRAWINGS

These and other objects, advantages, and features of the technology pertaining to the present disclosure will become apparent from the following description thereof taken in conjunction with the accompanying drawings, which illustrate at least one specific embodiment of the technology pertaining to the present disclosure.

Each of FIG. 5A through FIG. 5E is a schematic cross-sectional view illustrating a procedure of the manufacturing process of the display panel pertaining to the embodiment.

Figure 6A:
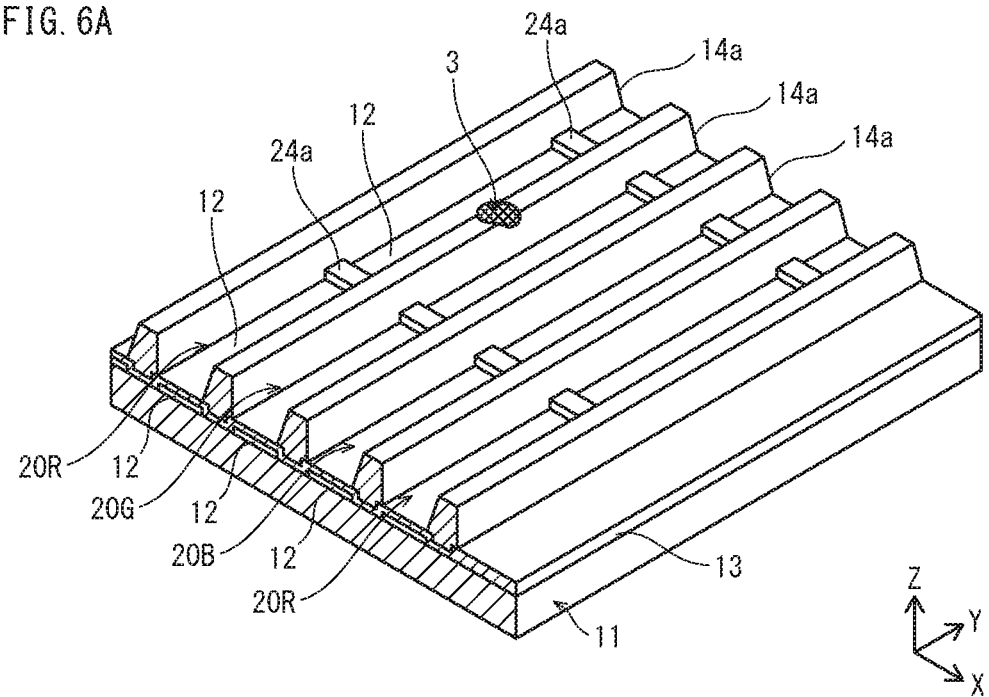
Figure 6B:
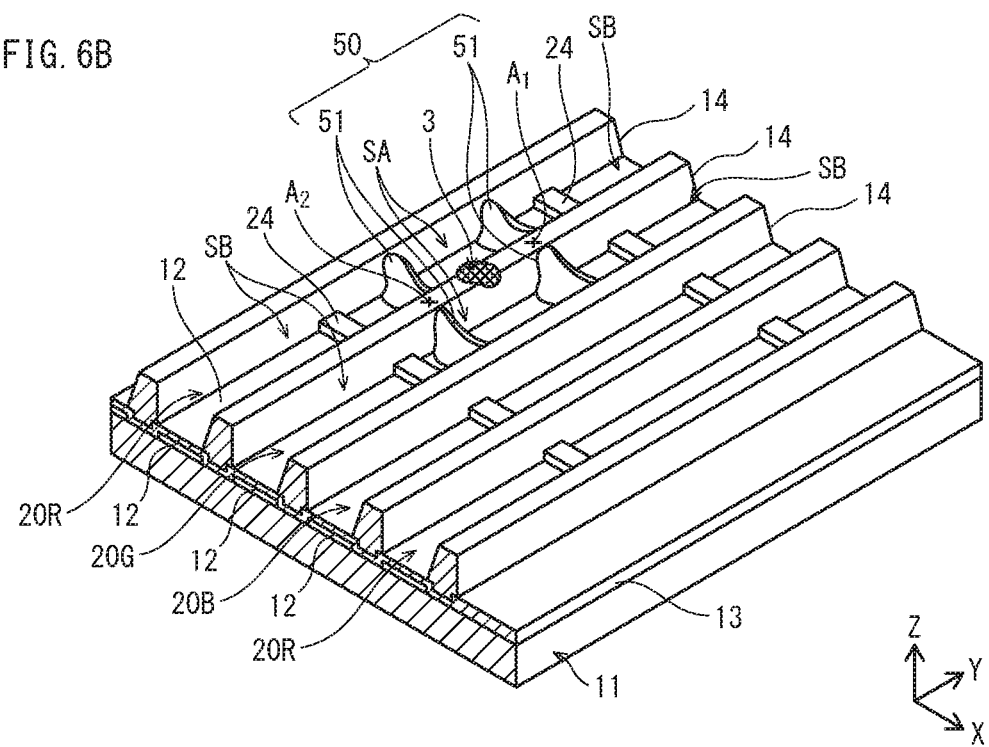

FIG. 6A is a schematic perspective view illustrating one example of a relatively small bank defect portion, and FIG. 6B is a schematic perspective view illustrating a state where dam portions pertaining to a first implementation have been formed around the bank defect portion.

Figure 7A:
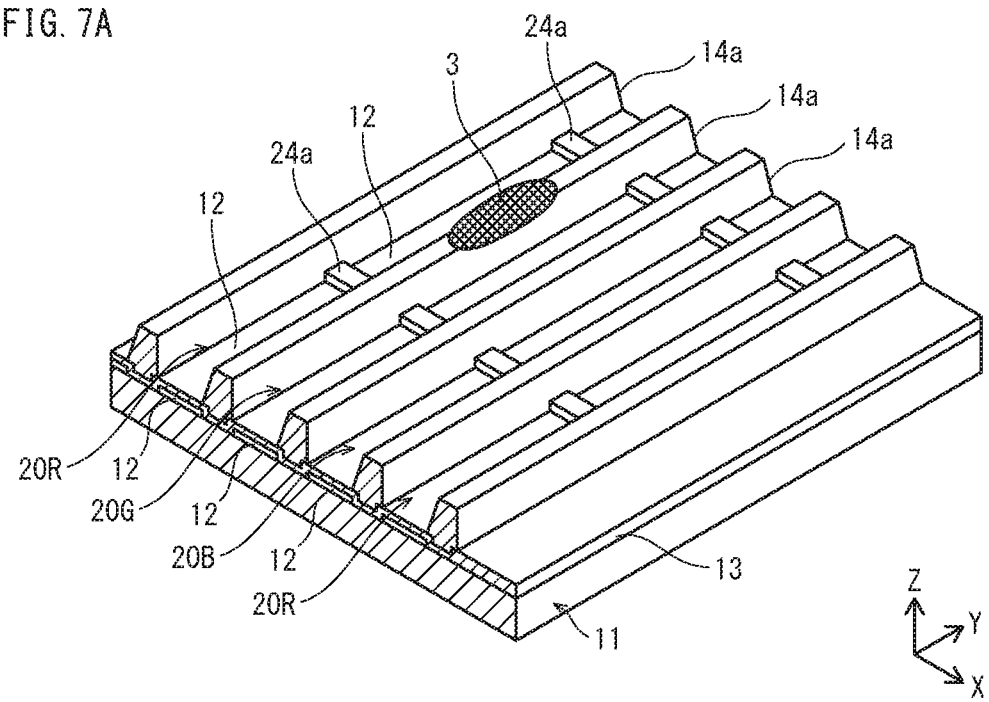
Figure 7B:
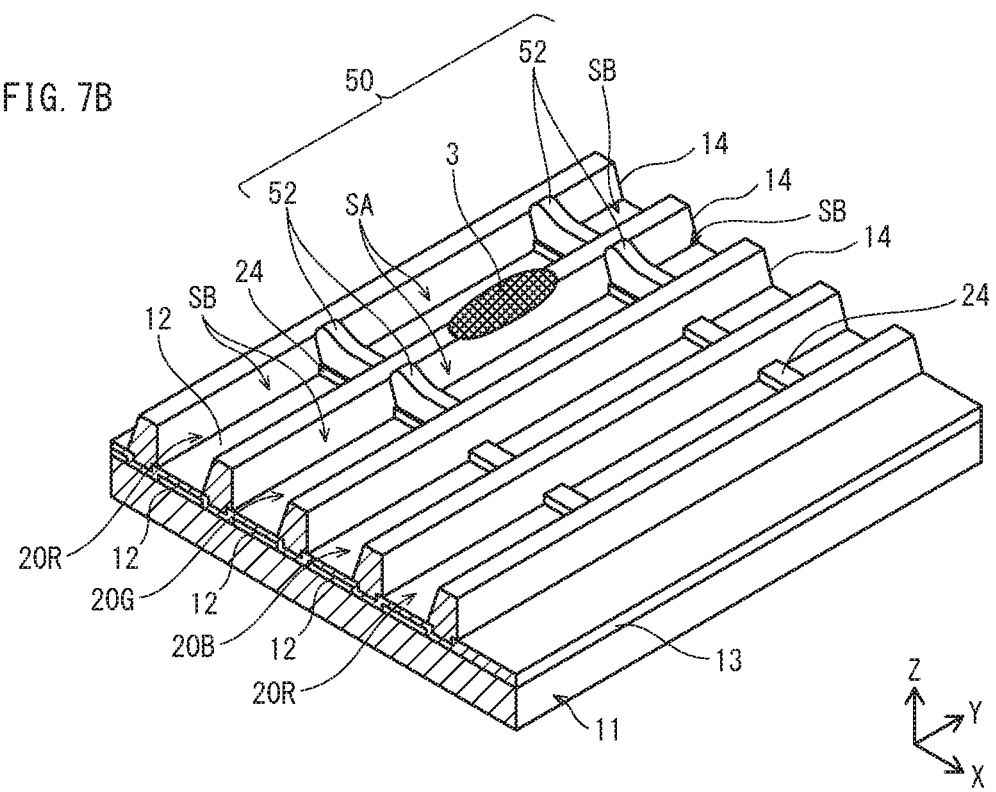

FIG. 7A is a schematic perspective view illustrating one example of a relatively large bank defect portion, and FIG. 7B is a schematic perspective view illustrating a state where dam portions pertaining to a second implementation have been formed around the bank defect portion.

Figure 8A:
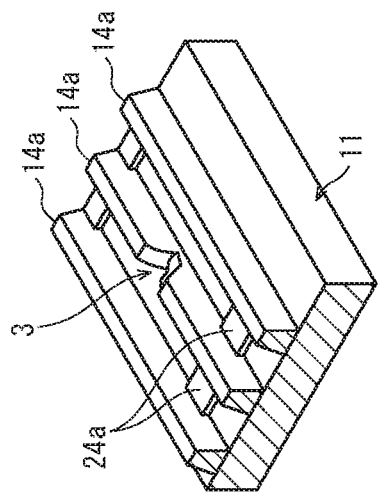
Figure 8B:
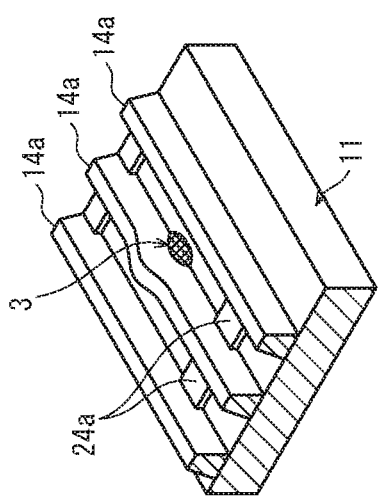
Figure 8C:
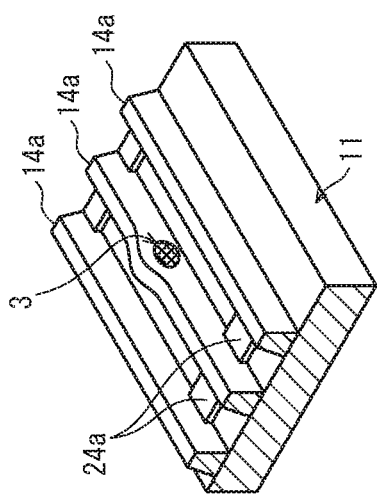

FIG. 8A is a schematic perspective view illustrating an example of a bank defect portion produced by a foreign particle, FIG. 8B is a schematic perspective view illustrating another example of a bank defect portion produced by a foreign particle, and FIG. 8C is a schematic perspective view illustrating one example of a bank defect portion produced by a bank collapsing.

Figure 9:
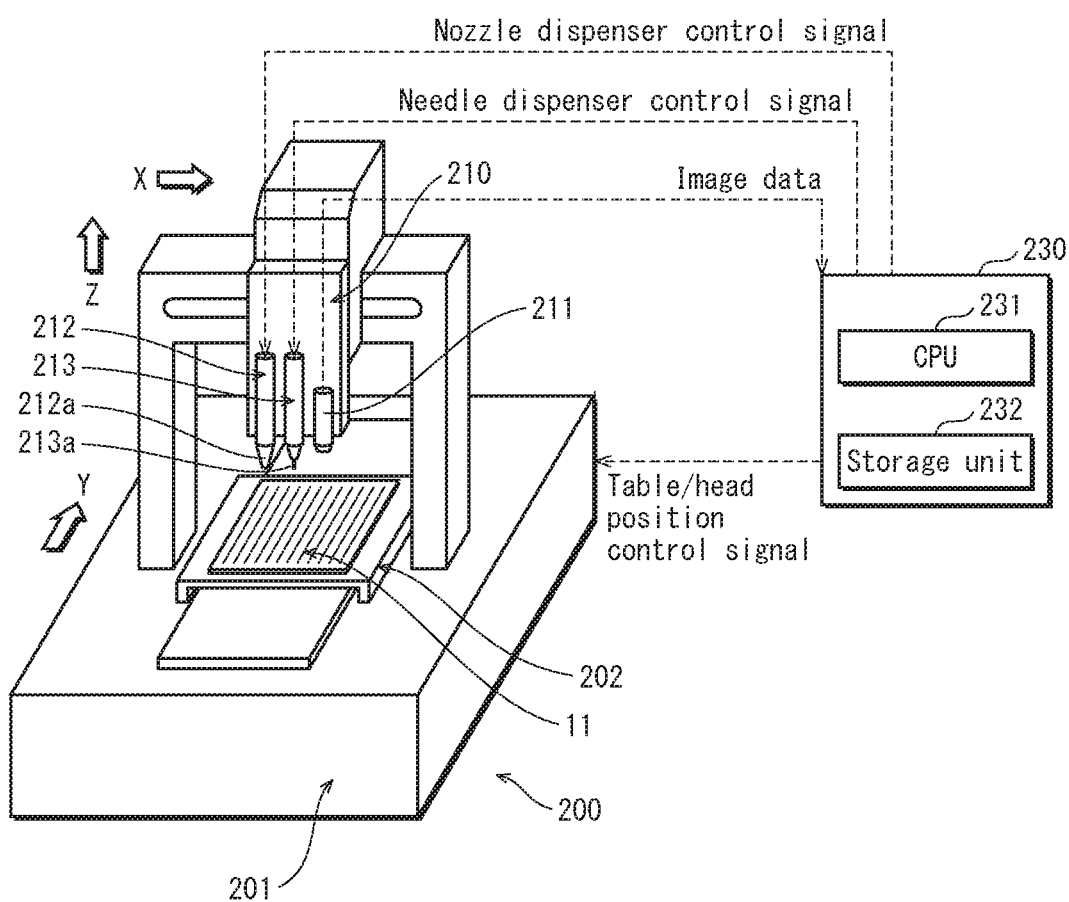

FIG. 9 illustrates the overall structure of one example of a repair device used for bank defect portion detection and bank repair.

Figure 10A:
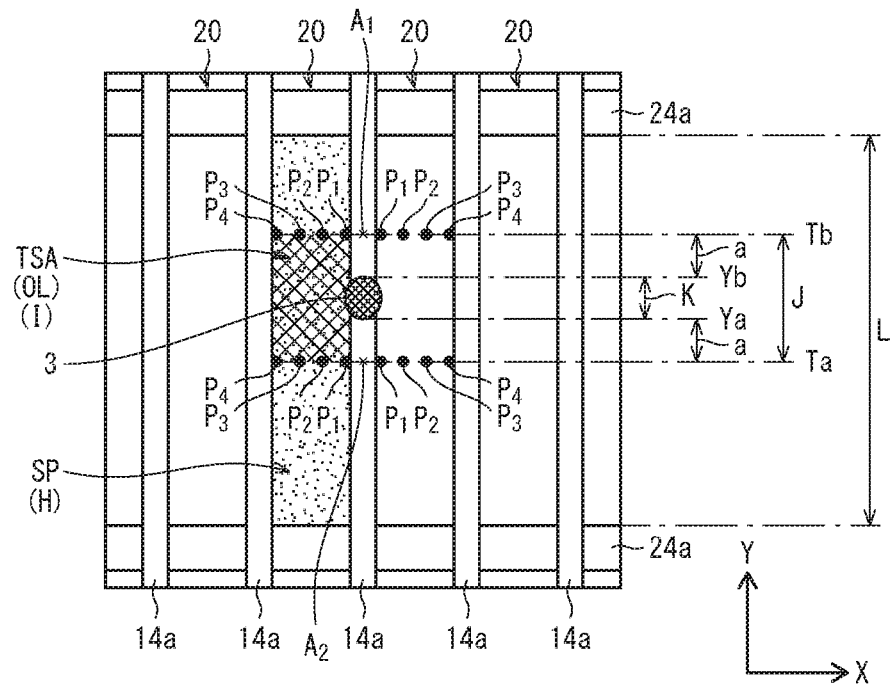
Figure 10B:
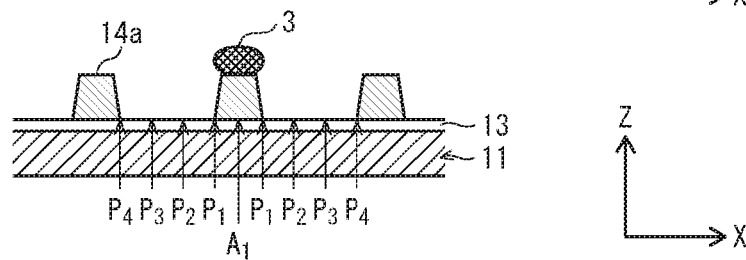
Figure 10C:
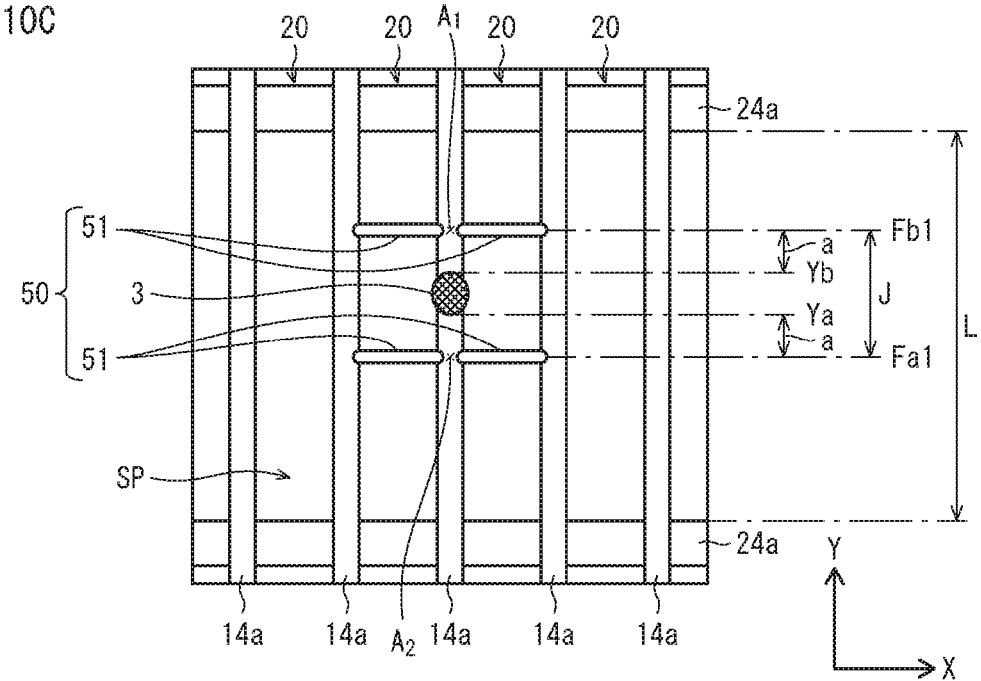

FIG. 10A is a schematic plan view illustrating positions with respect to which repair material is to be applied by using a needle dispenser, set in an image including a relatively small bank defect portion, FIG. 10B is a schematic cross-sectional view showing the positions, and FIG. 10C is a schematic plan view illustrating a state where the dam portions pertaining to the first implementation have been formed.

FIG. 11A through FIG. 11G are schematic cross-sectional views illustrating how a dam portion is formed through application of repair material with the needle dispenser, with FIG. 11A illustrating a state of a tank and a needle before the application of the repair material, FIG. 11B illustrating a state where the repair material has been applied to application point $P_1$ by using the needle dispenser, FIG. 11C illustrating a state where the needle is being moved upward, FIG. 11D illustrating a state where the needle has been moved upward, FIG. 11E illustrating a state where the repair material has been applied to application point $P_2$ after moving the needle and the tank, FIG. 11F illustrating a state where the repair material having been applied to application point $P_1$ and the repair material having been applied to application point $P_2$ have connected, and FIG. 11G illustrating a state where the needle has been moved upward.

Figure 12A:
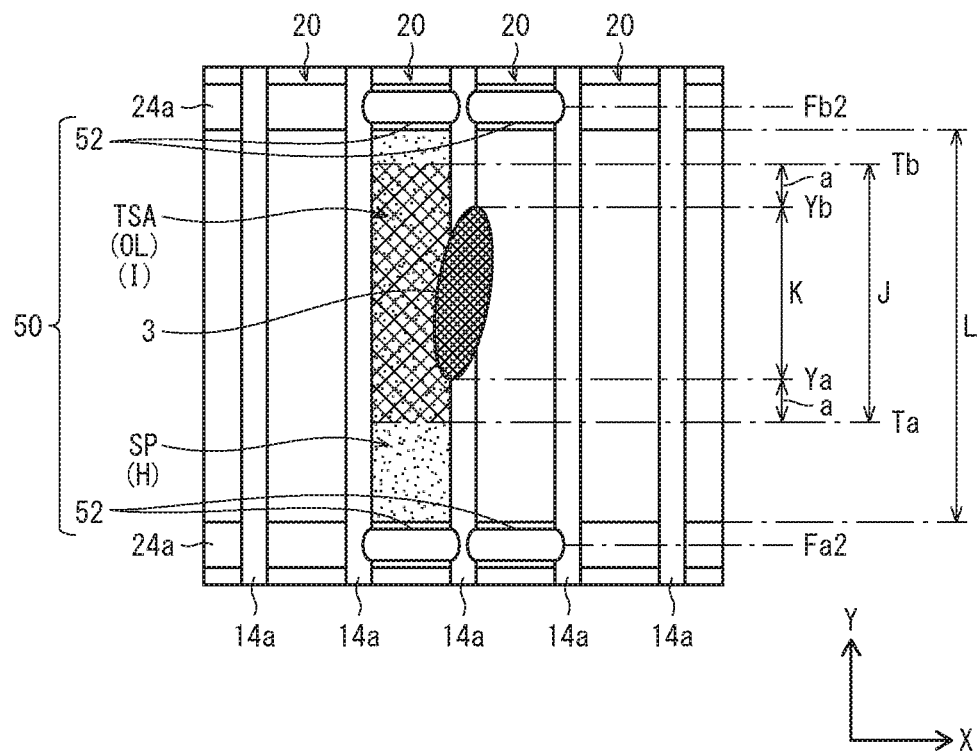
Figure 12B:
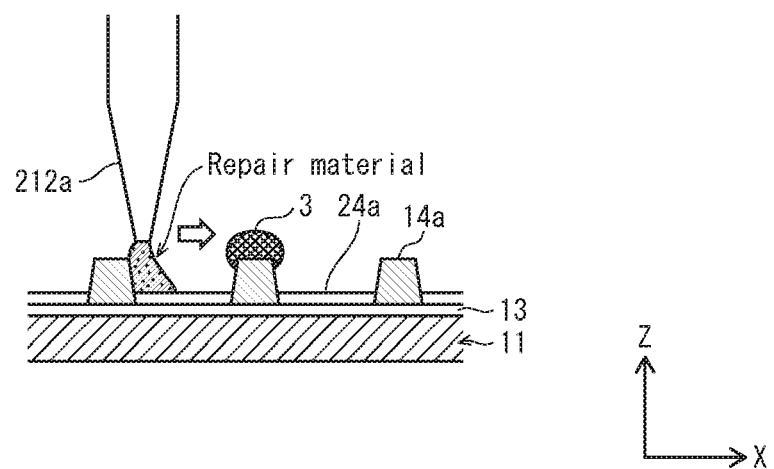

FIG. 12A is a schematic plan view illustrating a state where the dam portions pertaining to the second implementation have been formed in an image including a relatively large bank defect portion, and FIG. 12B schematically illustrates how a dam portion is formed through application of repair material with a nozzle dispenser.

FIG. 13A is a schematic plan view illustrating a state where ink layers have been formed, after the dam portions pertaining to the first implementation have been formed, and FIG. 13B is a schematic plan view illustrating a state where ink layers have been formed, after the dam portions pertaining to the second implementation have been formed, and FIG. 13C is a schematic plan view illustrating a comparative example where no dam portion has been formed.

Figure 14A:
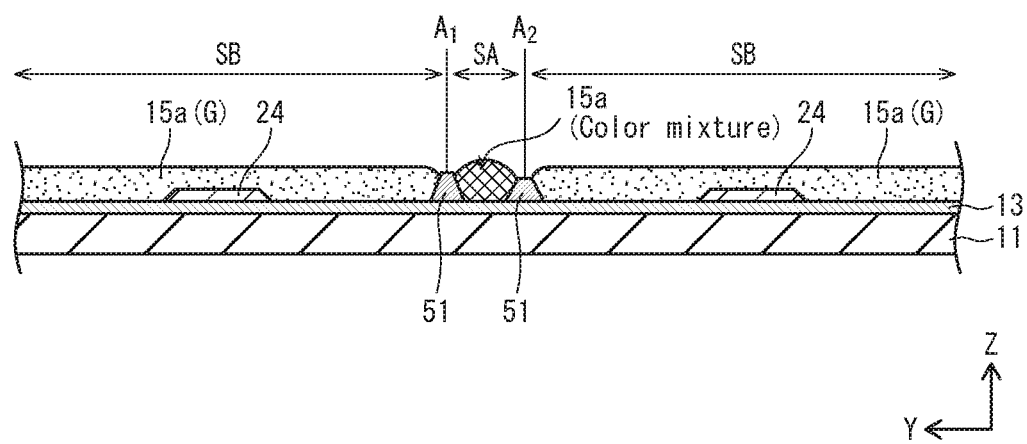
Figure 14B:
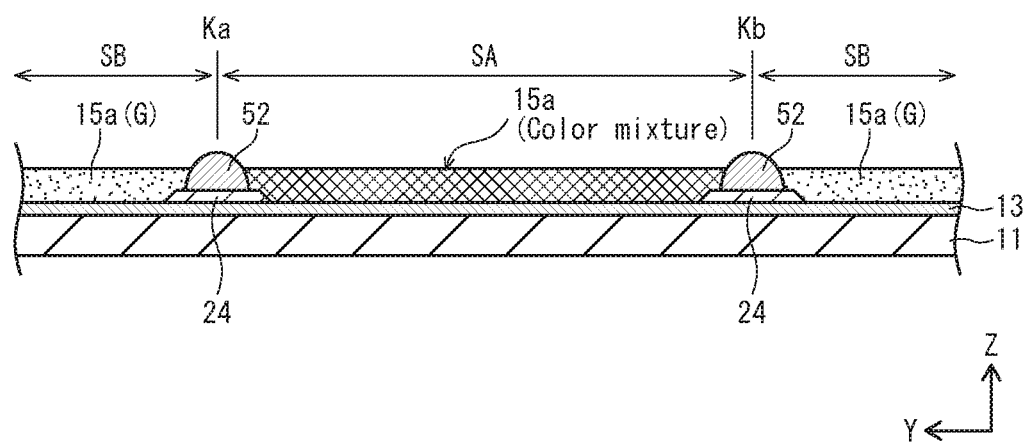

FIG. 14A is a cross-sectional diagram taken along line C-C of FIG. 13A, and FIG. 14B is a cross-sectional diagram taken along line E-E of FIG. 13B.

FIG. 15A is a schematic plan view illustrating candidate forming positions for a dam portion pertaining to a third implementation, and FIG. 15B is a schematic plan view illustrating a state where dam portions pertaining to the third implementation have been formed.

FIG. 16A is a schematic plan view illustrating candidate forming positions for a dam portion pertaining to a fourth implementation, and FIG. 16B is a schematic plan view illustrating a state where dam portions pertaining to the fourth implementation have been formed.

Figure 17:
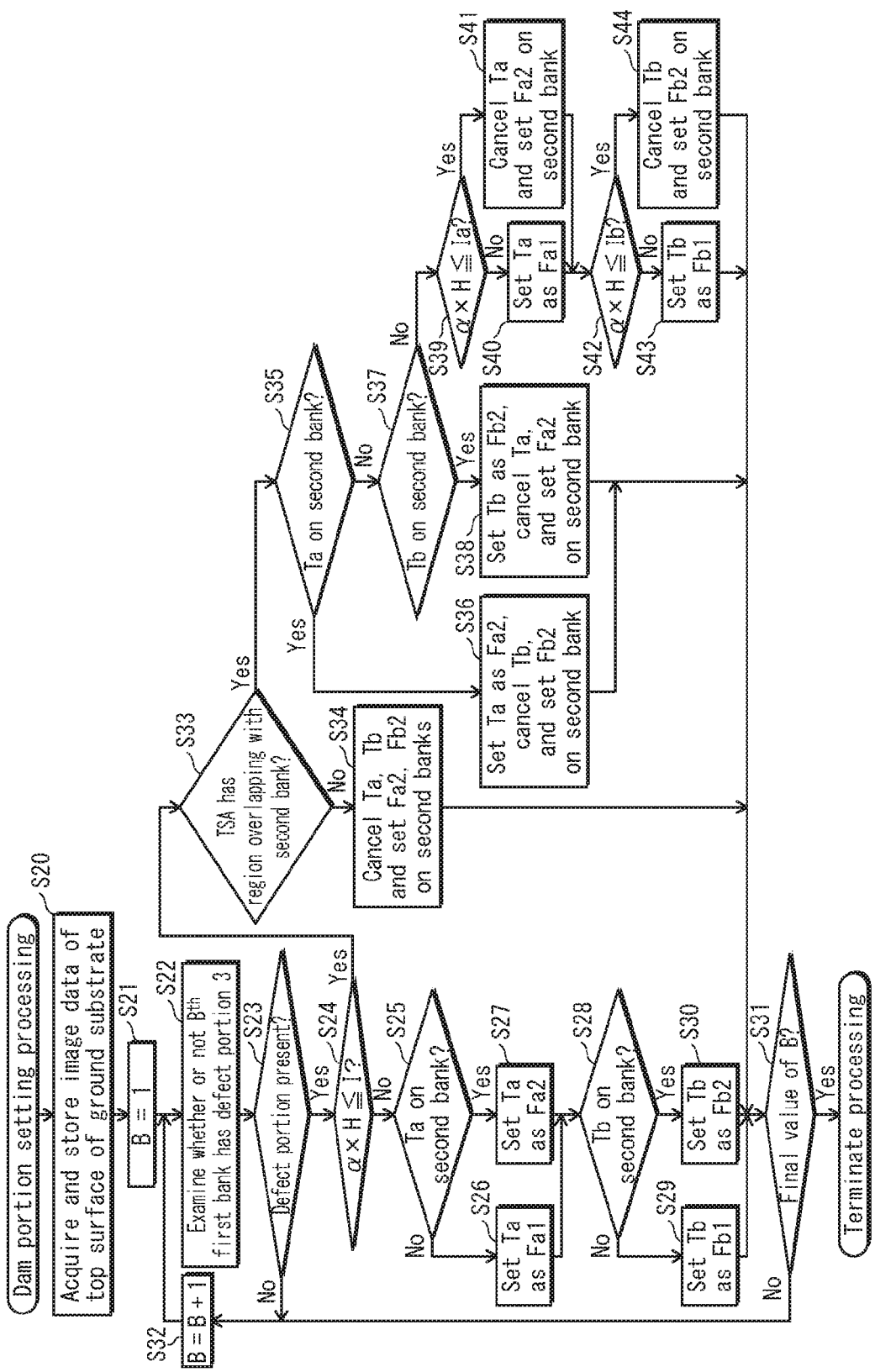

FIG. 17 is a flowchart illustrating one example of the contents of dam portion setting processing performed by the repair device.

Figure 18:
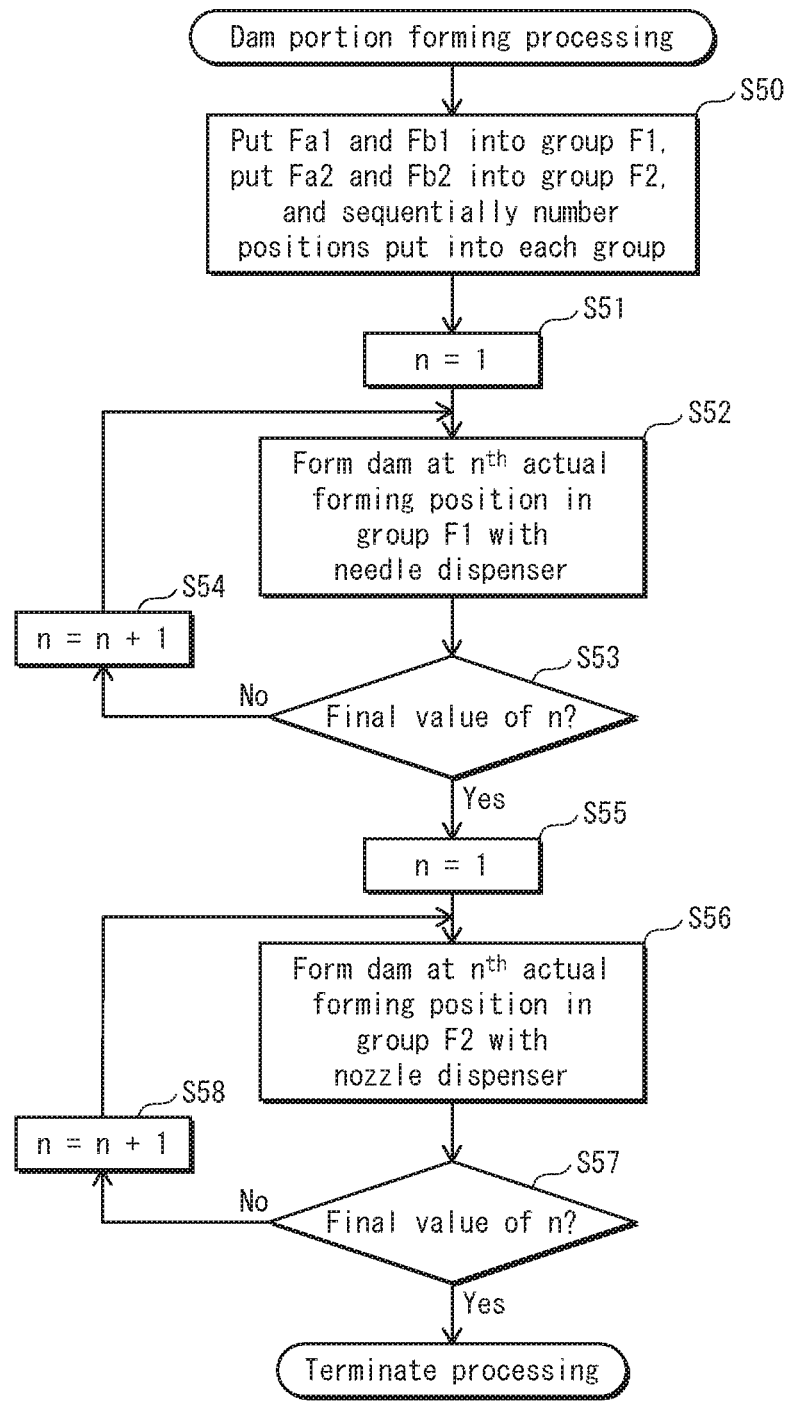

FIG. 18 is a flowchart illustrating one example of the contents of dam portion forming processing performed by the repair device.

Figure 19A:
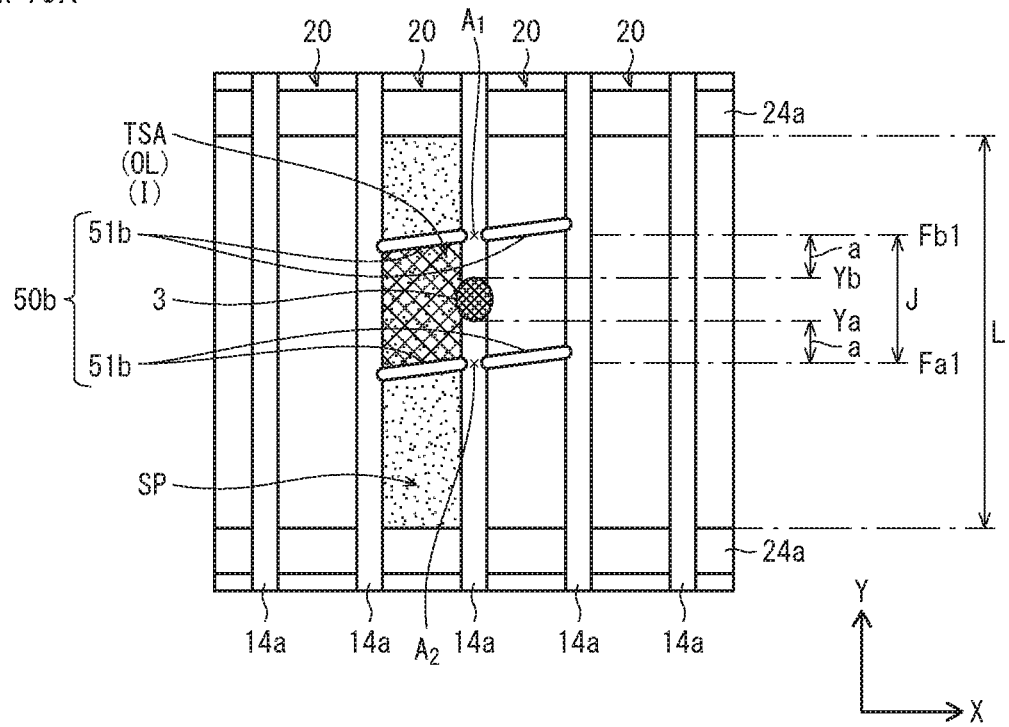
Figure 19B:
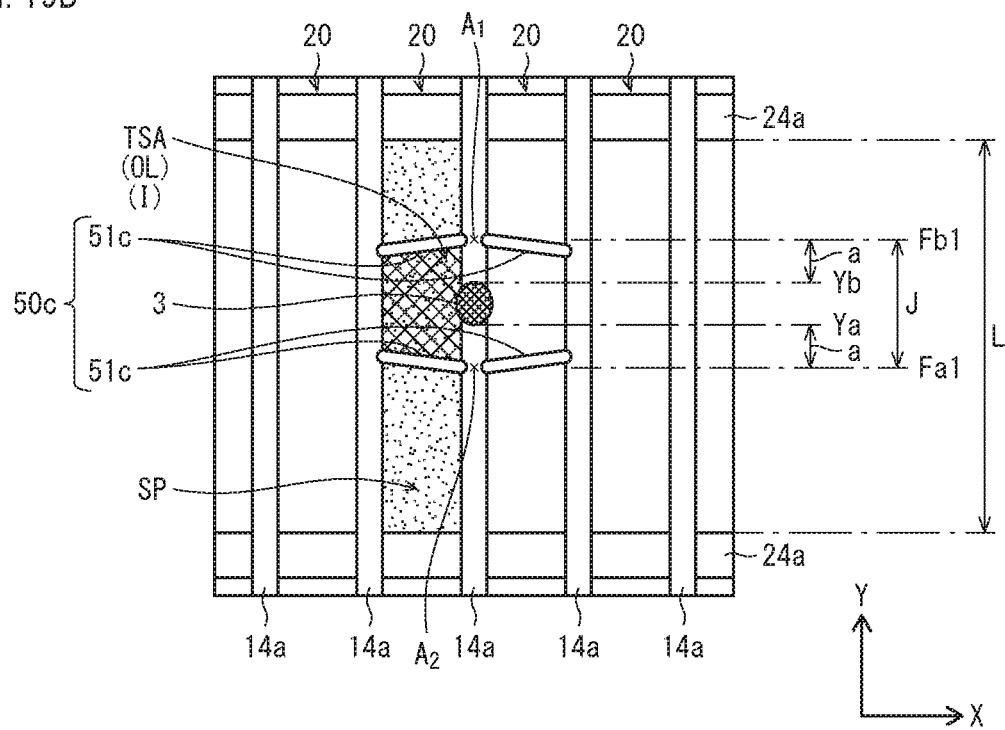

FIG. 19A is a schematic plan view illustrating a state where dam portions pertaining to a first modification have been formed, and FIG. 19B is a schematic plan view illustrating a state where dam portions pertaining to a second modification have been formed.

Figure 20A:
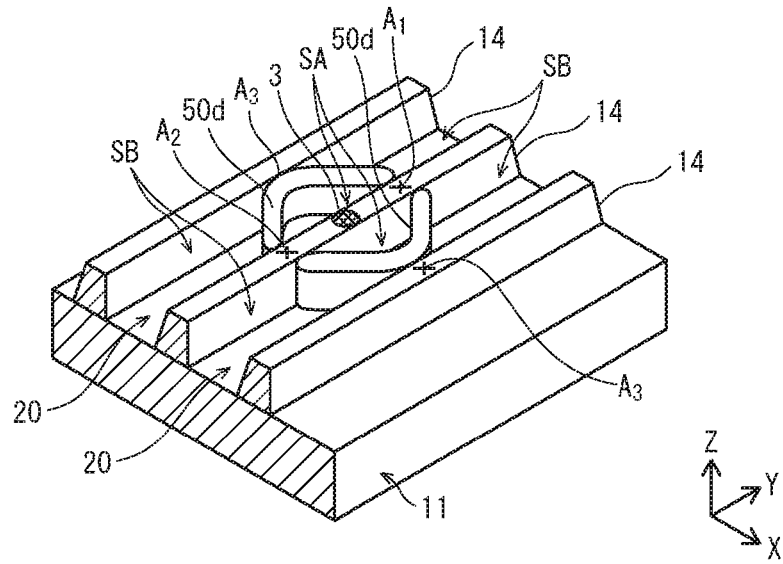
Figure 20B:
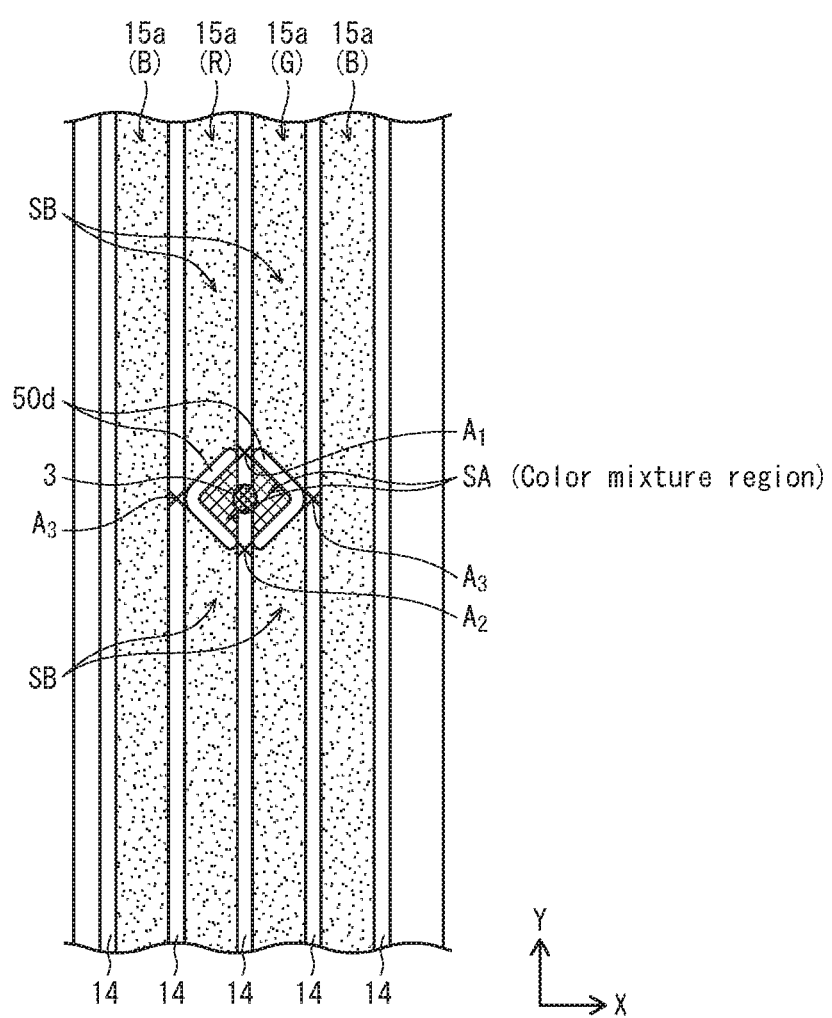

FIG. 20A is a schematic perspective view illustrating the shape of dam portions pertaining to a third modification, and FIG. 20B is a schematic plan view illustrating a state where ink layers have been formed after dam portions have been formed in concave spaces.

FIG. 21A and FIG. 21B are schematic plan views illustrating cases where one plan-view end of a dam portion pertaining to the third modification overlaps with a second bank, with FIG. 21A illustrating a case where the bank defect portion is relatively small, and FIG. 21B illustrating a case where the bank defect portion is relatively large.

Figure 22A:
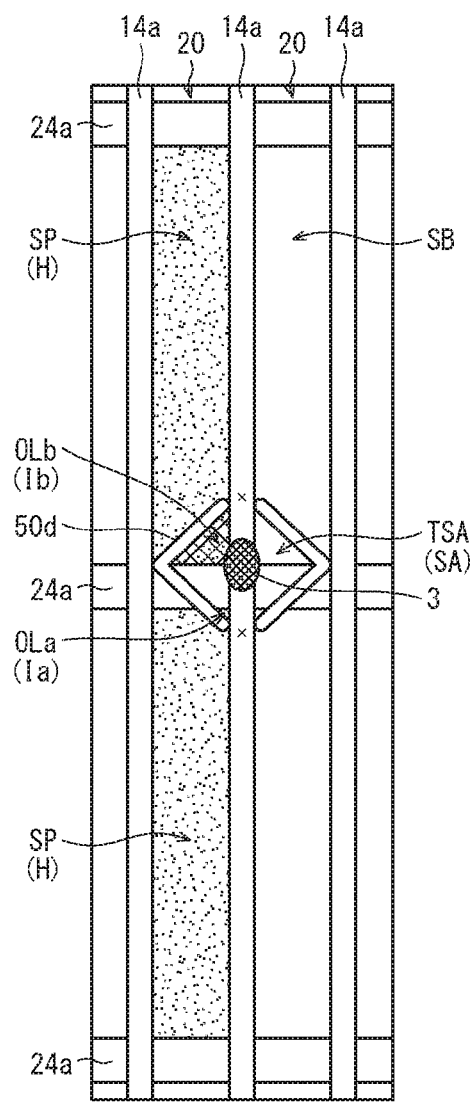
Figure 22B:
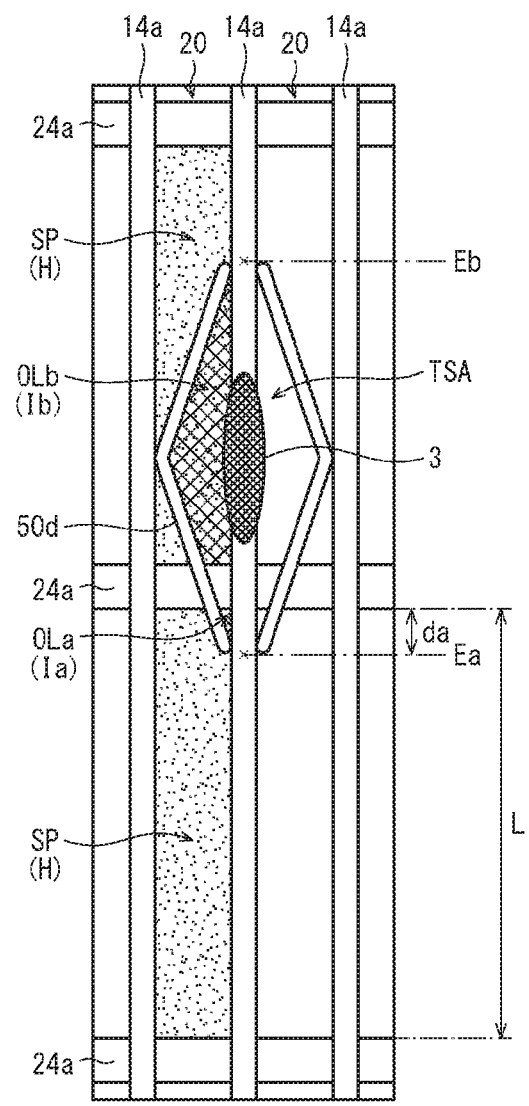

FIG. 22A and FIG. 22B are schematic plan views illustrating cases where a dam portion pertaining to the third modification, in plan view, spans across two sub-pixel regions, with FIG. 22A illustrating an example of a dam portion when both overlap regions, being regions overlapping with the sub-pixel regions, are relatively small, and FIG. 21B illustrating an example of a dam portion when one overlap region is relatively small and the other overlap region is relatively large.

Figure 23A:
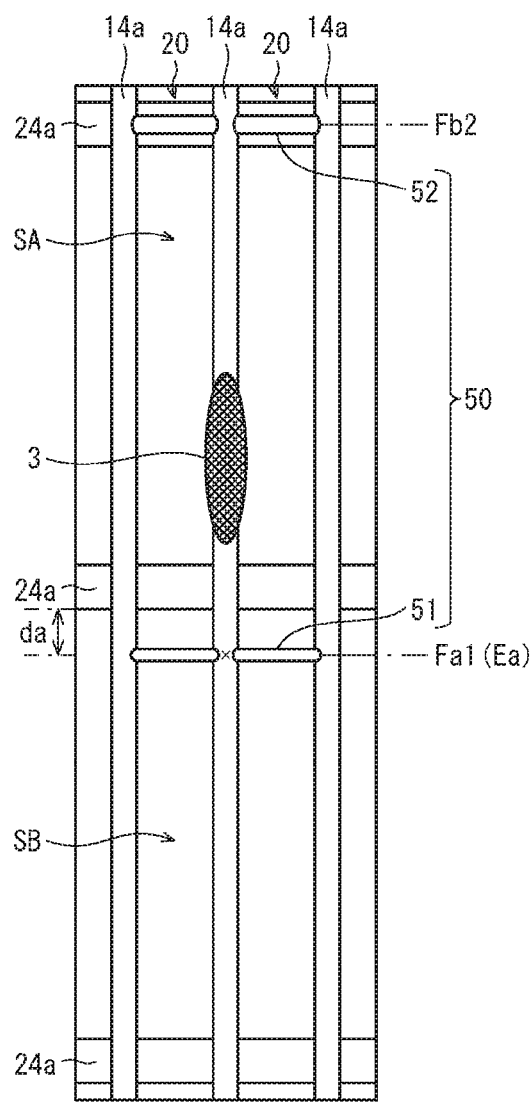
Figure 23B:
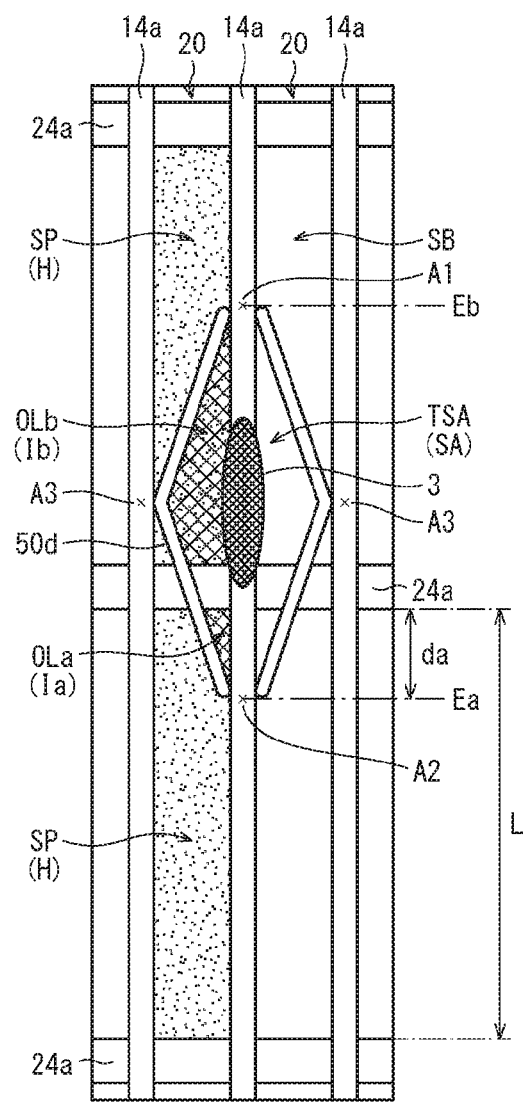

FIG. 23A and FIG. 23B are schematic plan views illustrating cases where a dam portion pertaining to the third modification, in plan view, spans across two sub-pixel regions, with FIG. 23A illustrating another example of a dam portion when one overlap region is relatively small and the other overlap region is relatively large as illustrated in FIG. 22B, and FIG. 23B illustrating yet another example of a dam portion when one overlap region is relatively small and the other overlap region is relatively large as illustrated in FIG. 22B.

Figure 24A:
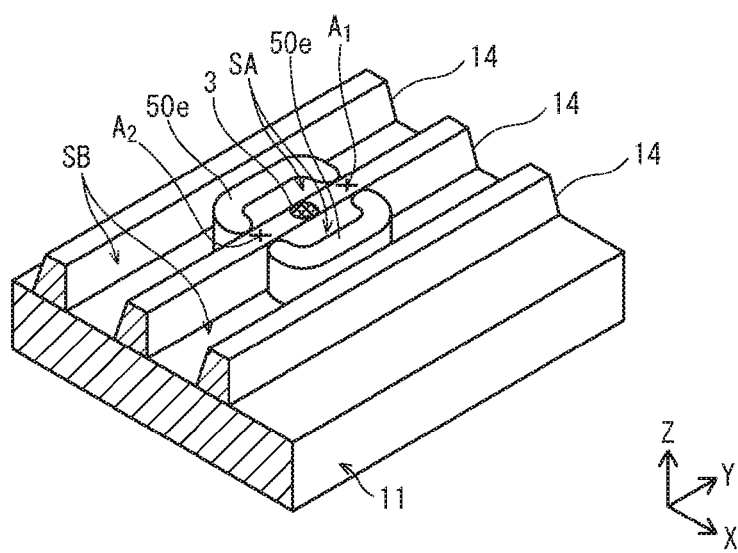
Figure 24B:
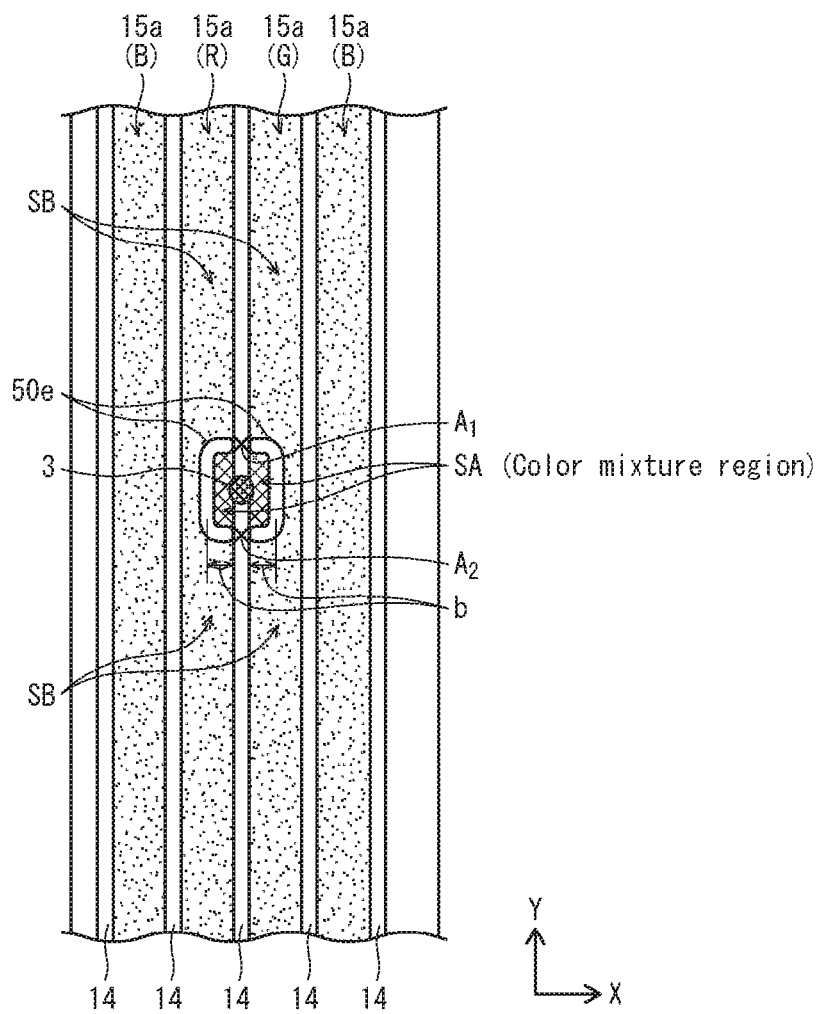

FIG. 24A is a schematic perspective view illustrating the shape of dam portions pertaining to a fourth modification, and FIG. 24B is a schematic plan view illustrating a state where ink layers have been formed after dam portions have been formed in concave spaces.

Figure 25A:
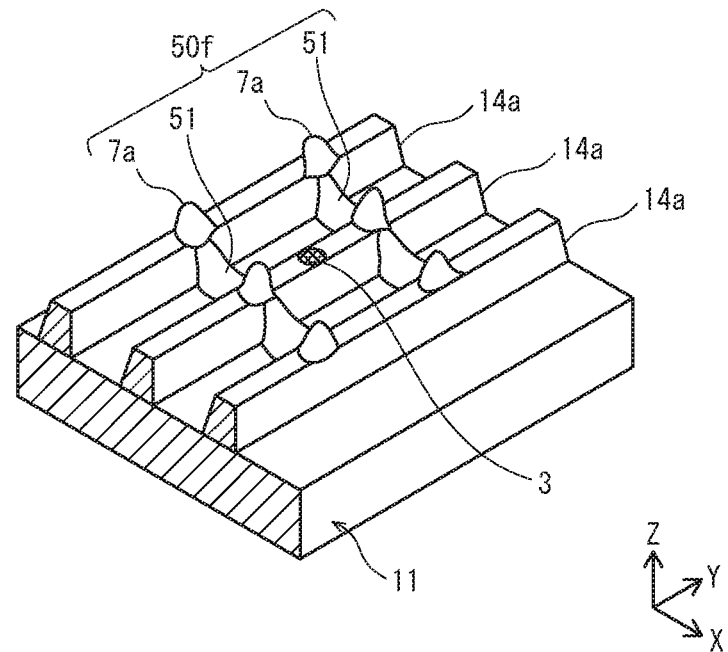
Figure 25B:
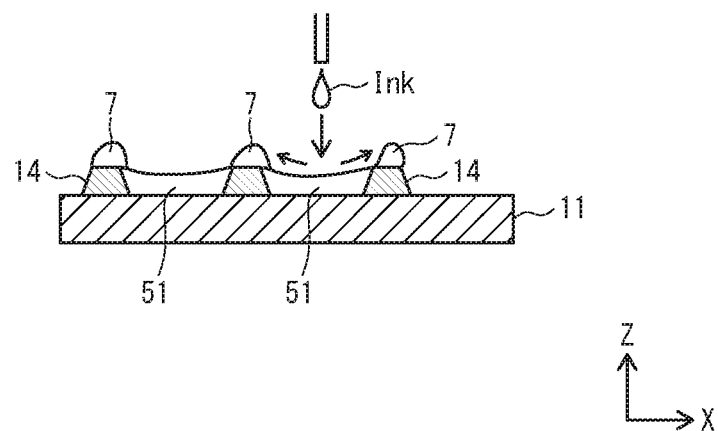

FIG. 25A is a schematic perspective view illustrating the shape of dam portions pertaining to a fifth modification, and FIG. 25B is a schematic cross-sectional view illustrating a state where ink application is performed after dam portions have been formed in concave spaces.

Figure 26A:
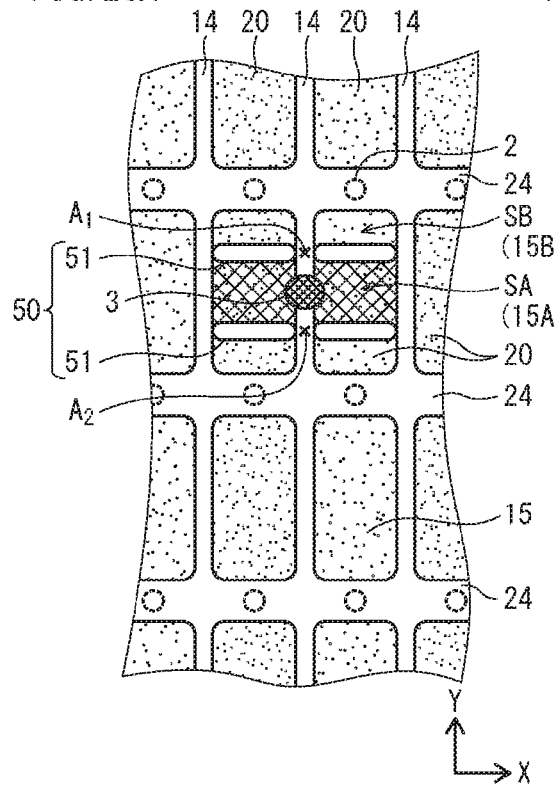
Figure 26B:
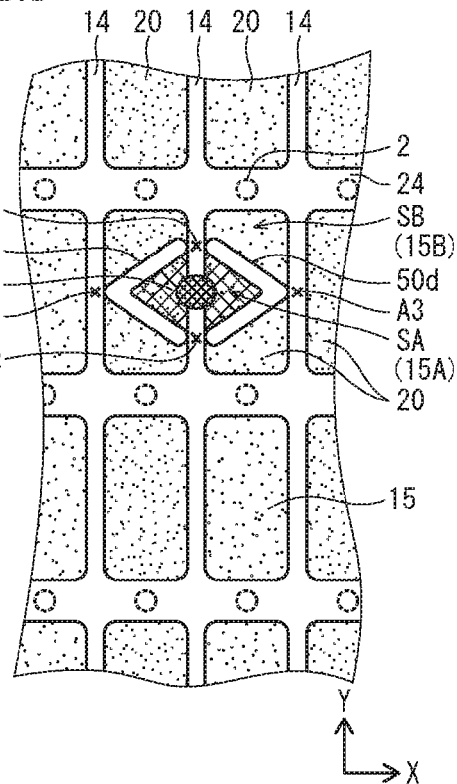
Figure 26C:
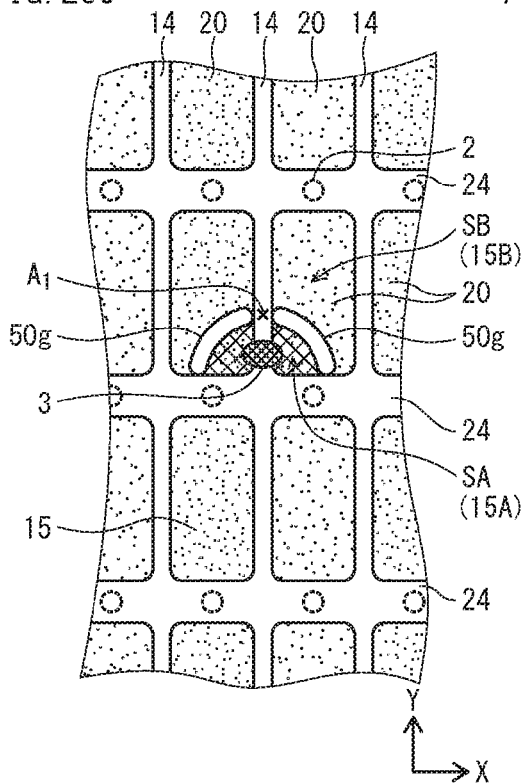
Figure 26D:
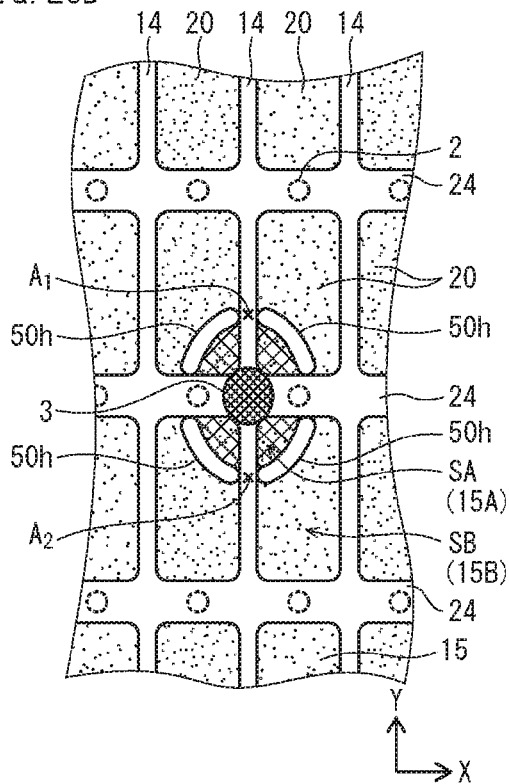

FIG. 26A through FIG. 26D are schematic plan views illustrating modifications where bank defect portions repaired with dam portions, with FIG. 26A illustrating dam portions pertaining to a sixth modification, FIG. 26B illustrating dam portions pertaining to a seventh modification, FIG. 26C illustrating dam portions pertaining to an eighth modification, and FIG. 26D illustrating dam portions pertaining to a ninth modification.

DESCRIPTION OF EMBODIMENT(S)

Conception of Technology Pertaining to Present Disclosure

For example, WO Publication No. 2010/013654 discloses a technology of, after banks have been formed and before ink is applied in the manufacturing of a flat display substrate, repairing a collapsed portion of a bank by removing a portion of the bank around the collapsed portion, and applying a bank repair liquid containing an ink-repellent polymer to the removed portion.

Further, Japanese Patent Application Publication No. 2011-108369 discloses a technology of detecting a foreign particle in an organic EL display device, and repairing the organic EL display device by applying an electrically non-conductive liquid material onto the detected foreign particle by using a needle dispenser.

When a bank has a collapsed portion, it can be expected that the mixture of different inks that would otherwise occur due to the collapsed portion can be prevented by repairing the collapsed portion according to technology such as that disclosed in WO Publication NO. 2010/013654 and then performing ink application.

Meanwhile, when a foreign particle having adhered to a bank constitutes a bank defect portion, it may be difficult to repair the defect portion according to the above-described conventional technology of applying polymer material. For example, the foreign particle may repel the polymer liquid applied for repairing the defect portion.

Meanwhile, organic EL display devices nowadays have very narrow banks, with widths of 20 μm or smaller. Further, it can be expected that bank width will become even smaller in the future as pixel definition increases. Thus, the difficulty of repairing banks through accurate positioning of application needles with respect to bank defect portions is due to increase. In addition, the more precise the repair, the greater the amount of time required for the repair.

In consideration of the above, the present inventor considered how bank defect portions in high-definition EL display devices can be repaired with ease, to prevent display failures from appearing in high-definition EL display devices.

In the process, the present inventor found that this can be achieved without repairing the bank defect portions themselves. Specifically, the present inventor found that even if a bank has a defect portion and color mixture occurs due to different inks mixing with one another via the defect portion, the color mixture can be confined within a certain region. More specifically, the present inventor found that by providing a dam portion in a concave space near the bank defect portion and partitioning the concave space into a first space in the vicinity of the defect portion and a second space outside the vicinity of the defect portion, the color mixture occurring due to the defect portion can be confined within the first space. The present inventor found that such dam portions can prevent color mixture from spreading, and that display failures resulting from emission of light with undesirable color can be consequently resolved by using such dam portions.

Here, in order to achieve good image quality, the smaller the surface area of the color mixture region, the better. In order to keep the surface area of the color mixture region as small as possible, the forming of dams needs to be performed according to a method enabling precise control of the positions where dams are formed, the shapes of the dams, etc. One method fulfilling such conditions is the method of forming dams by using a needle dispenser, which is disclosed for example in Japanese Patent Application Publication No. 2011-108369. However, forming dams by using a needle dispenser requires much time, since with a needle dispenser, a dam is formed by applying putting repair material on a needle tip and applying the repair material one application point at a time.

Meanwhile in an EL display device, it is known that when, for example, a proportion of a surface area of a first space, which is partitioned from a second space by a dam portion formed in a concave space (i.e., a color mixture region), to a surface area of region corresponding to a single sub-pixel (referred to as sub-pixel region in the following) in plan view is equal to a predetermined proportion or higher, the human eye perceives the entire sub-pixel as a dark spot. This means that if the proportion of the surface area of a color mixture region surrounded by a dam portion to the surface area of a sub-pixel region is equal to or greater than the predetermined proportion, the dam portion no longer needs to be formed precisely by using a needle dispenser because it is no longer necessary to provide the color mixture region with as small a size as possible.

As such, the present inventor arrived at the technology pertaining to the present disclosure, which is a bank repair method that prevents the occurrence of a display failure by forming a dam portion surrounding a defect portion, and that can be performed in a relatively short amount of time.

Overview of Aspects of Present Disclosure

One aspect of the present disclosure is a bank repair method in a manufacturing process of an organic EL display device including: a substrate; first banks and second banks disposed over the substrate; and light-emitting layers disposed in concave spaces that the first banks define over the substrate, the first banks elongated in a first direction and spaced away from one another in a second direction, the second banks elongated in the second direction and spaced away from one another in the first direction, the first direction and the second direction being different directions along a top surface of the substrate and intersecting with one another, the bank repair method including: detecting a defect portion of a first bank; when a defect portion of a first bank is detected, setting a candidate forming position for a dam portion in each of adjacent concave spaces between which the first bank having the defect portion is located in the second direction; and forming a dam portion in each of the adjacent concave spaces, a dam portion formed in a concave space partitioning the concave space into a first space in a vicinity of the defect portion and a second space outside the vicinity of the defect portion, wherein when (i) defining a region surrounded by a pair of adjacent first banks and a pair of adjacent second banks as a sub-pixel region, and denoting a plan-view surface area of a sub-pixel region as H, and (ii) defining a region of a candidate first space that overlaps with a sub-pixel region as an overlap region, and denoting a plan-view surface area of the overlap region as I, wherein the candidate first space is the first space when the dam portion is formed at the candidate forming position, when $I<\alpha\times H$ is fulfilled, where $\alpha$ fulfills $0.05<\alpha<0.9$, and the candidate first space does not overlap with any second bank in plan view, the dam portion is formed at the candidate forming position according to a first forming method.

According to the bank repair method pertaining to one aspect of the present disclosure, a dam formed in a concave space partitions an ink layer formed in the concave space when inks of different light-emission colors are applied with respect to the adjacent concave spaces to form organic functional layers. Thus, even if a color mixture region is formed in the concave space due to inks of different light-emission colors mixing via the defect portion, the color mixture region is prevented from spreading into the second space, which is outside the vicinity of the defect portion. As such, the spread of the color mixture region is prevented and display failures are prevented from occurring in the organic EL display device.

Further, according to the bank repair method pertaining to one aspect of the present disclosure, bank repair is performed by forming a dam portion around the defect portion. Thus, bank repair can be performed relatively easily even if the detect portion is produced by a foreign particle.

Further, according to the bank repair method pertaining to one aspect of the present disclosure, the dam portion is formed at the provisional forming position when $I<\alpha\times H$ is fulfilled. Thus, it is possible to ensure that the color mixture region has as small a surface area as possible in plan view, and thereby prevent display failures occurring due to display color failure.

Note that the dam portions in the present disclosure, which are formed around defect portions, should not be construed as being banks (e.g., first and second banks), which are formed over the entire display area of a display device. Accordingly, for example, in a structure including first banks and second banks perpendicular to the first banks, neither the first banks nor the second banks should be considered as corresponding to dam portions, which are formed separately from the first banks and the second banks.

Further, the first banks and the second banks are typically formed at boundaries between pixels and subpixels. However, the dam portions, in addition to being formed at such boundaries, may be formed within pixels and sub-pixels.

In the bank repair method pertaining to one aspect of the present disclosure, a height of the second banks from the top surface of the substrate may be smaller than a height of the first banks from the top surface of the substrate, and when $\alpha\times H\le I$ is fulfilled and, the candidate first space does not overlap with any second bank in plan view or one of two ends of the candidate first space in the first direction overlaps with a second bank in plan view, the dam portion may be a pair of dams formed according to a second forming method forming the dam portion at higher speed than the first forming method, the dams, in plan view, each extending in the second direction from the first bank having the defect portion to an adjacent first bank, and respectively formed on two adjacent second banks between which the defect portion is located in the first direction.

When $\alpha\times H\le I$ is fulfilled, an entire sub-pixel is perceived as a dark spot even when forming the dam portion accurately at the provisional forming position. This means that the outcome would be the same even if the entire sub-pixel region were allowed to become a color mixture region. Accordingly, when the height of the second banks from the top surface of the substrate is smaller than a height of the first banks from the top surface of the substrate, or that is, in a line bank structure, the dam portion may be a pair of dams respectively formed on two adjacent second banks between which the defect portion is located.

Further, in this case, since the second banks are formed by using an electrically-insulating material, the areas above the second banks become non-light-emitting areas. Further, the second banks have a considerable width. Thus, the dams to be formed need not have so thin a width, and further, the forming of dams need not be performed while controlling the positions where dams are formed, the shapes of the dams, etc., so precisely. As such, the dam portion may be a pair of dams formed according to the second forming method, which forms the dam portion at higher speed than the first forming method, and may be respectively formed on two adjacent second banks between which the defect portion is located. This reduces the amount of time required for the forming of the dam portion compared to when the dam portion is formed according to the first formation method.

In the bank repair method pertaining to one aspect of the present disclosure, the dam portion may be a pair of dams extending from different ones of two points on the first bank having the defect portion to an adjacent first bank, the defect portion being located between the two points in the first direction:

Thus, the dam portion can be formed relatively easily.

In the bank repair method pertaining to one aspect of the present disclosure, when $I<\alpha\times H$ is fulfilled and one of two first-direction ends of the candidate first space overlaps with a second bank in plan view, the dam portion may be a pair of dams composed of one dam formed according to the second forming method on the second bank with which the one of two first-direction ends of the candidate first space overlaps, and one dam formed according to the first forming method at a corresponding candidate forming position.

According to this, when I<α×H is fulfilled and one of the two candidate forming positions overlaps with a second bank, the dam portion may be a pair of dams composed of one dam formed according to the second forming method on the second bank with which the one of two candidate forming positions overlaps, and one dam formed according to the first forming method. Thus, the amount of time required for forming the dam portion is reduced compared to when forming both dams according to the first formation method.

In the bank repair method pertaining to one aspect of the present disclosure, when the candidate first space, in plan view, spans over a second bank and across two sub-pixel regions between which the second bank is located in the first direction, when (i) defining a region of one of the two sub-pixel regions that overlaps with the candidate first space as a first overlap region, and denoting a plan-view surface area of the first overlap region as Ia, the one of the two sub-pixel regions being a sub-pixel region in which one first-direction end of the candidate first space is located, and (ii) defining a region of the other one of the two sub-pixel regions that overlaps with the candidate first space as a second overlap region, and denoting a plan-view surface area of the second overlap region as Ib, the other one of the two sub-pixel regions being a sub-pixel region in which the other first-direction end of the candidate first space is located, the dam portion may be a pair of a first dam and a second dam, the first dam corresponding to the one first-direction end of the candidate first space and the second dam corresponding to the other first-direction end of the candidate first space, wherein the first dam may be formed according to the first forming method at a corresponding candidate forming position when Ia<α×H is fulfilled, and may be formed according to the second forming method on one of two second banks adjacent to the second bank with which the candidate first space overlaps that is at a side of the one first-direction end of the candidate first space when α×H≤Ia is fulfilled, and the second dam may be formed according to the first forming method at a corresponding candidate forming position when Ib<α×H is fulfilled, and may be formed according to the second forming method on the other one of the two second banks adjacent to the second bank with which the candidate first space overlaps, which is at a side of the other first-direction end of the candidate first space, when α×H≤Ib is fulfilled.

In the line bank structure, the candidate first space may span over a second bank. In such a situation, even if the entire candidate first space appears to fulfill α×H≤I, the two sub-pixel regions that the candidate first space spans across may be considered separately, and one of the pair of dams composing the dam portion may be formed according to the first forming method when I<α×H is fulfilled in one of the sub-pixel regions, or that is, when the surface area of a portion of the candidate first space that extends beyond the second bank into the sub-pixel region is smaller than α×H. This ensures that the color mixture region formed in this sub-pixel regions has as small a surface area as possible, and thereby prevents the occurrence of display failures.

Further, considering the two sub-pixel regions that the candidate first space spans across separately, an entire sub-pixel region in which α×H≤I is fulfilled may be allowed to become a color mixture region. As such, the other one of the pair of dams may be formed according to the second forming method on a second bank that does not overlap with the candidate first space. This reduces the amount of time required for forming the dam portion, compared to a case where the other one of the pair of dams is formed according to the first forming method.

In the bank repair method pertaining to one aspect of the present disclosure, the dam portion may be a pair of dams extending along the second direction.

Thus, the dam portion can be formed relatively easily.

In the bank repair method pertaining to one aspect of the present disclosure, the dam portion may be a pair of dams extending in parallel in a direction intersecting with the second direction.

This allows forming the dam portion to correspond with the shape of the defect portion even if the defect portion is not positioned straightly on a first bank.

In the bank repair method pertaining to one aspect of the present disclosure, the dam portion may be a pair of dams located at a distance from one another, the distance decreasing with increasing distance from the first bank having the defect portion.

Typically, when ink flows from one concave space into an adjacent concave space, the flow intensity is greatest near the defect portion. Thus, in this structure, the distance between the dams composing the dam portion is relatively great near the defect portion, to prevent the outflow of ink over the dams. In addition, this structure ensures that the surface area of space surrounded by the dam portion, which becomes the color mixture region, is as small as possible.

In the bank repair method pertaining to one aspect of the present disclosure, the dam portion may extend between two points on the first bank having the defect portion while detouring around the defect portion, the defect portion being located between the two points in the first direction.

This achieves forming the dam portion to have a shape detouring around and surrounding the defect portion, and prevents the occurrence of display failures by confining the mixture of inks of different colors within the first space.

In the bank repair method pertaining to one aspect of the present disclosure, when I<α×H is fulfilled and one of two first-direction ends of the candidate first space overlaps with a second bank in plan view, the dam portion may be formed at the candidate forming position according to the first forming method.

When I<α×H is fulfilled and one of two first-direction ends of the candidate first space overlaps with a second bank in plan view, forming the dam portion at the provisional forming position to have a shape detouring around and surrounding the defect portion ensures that the color mixture region has a small surface area and prevents a sub-pixel region from being perceived as a dark spot.

In the bank repair method pertaining to one aspect of the present disclosure, when the candidate first space, in plan view, spans over a second bank and across two sub-pixel regions between which the second bank is located in the first direction, when (i) defining a region of one of the two sub-pixel regions that overlaps with the candidate first space as a first overlap region, and denoting a plan-view surface area of the first overlap region as Ia, the one of the two sub-pixel regions being a sub-pixel region in which one first-direction end of the candidate first space is located, and (ii) defining a region of the other one of the two sub-pixel regions that overlaps with the candidate first space as a second overlap region, and denoting a plan-view surface area of the second overlap region as Ib, the other one of the two sub-pixel regions being a sub-pixel region in which the other first-direction end of the candidate first space is located, the dam portion may be formed according to the first forming method at the candidate forming position when $Ia<\alpha \times H$ and $Ib<\alpha \times H$ are fulfilled, and the dam portion may be a pair of dams formed according to a second forming method forming the dam portion at higher speed than the first forming method when $\alpha \times H \leq Ia$ and $\alpha \times H \leq Ib$ are fulfilled, the dams, in plan view, each extending in the second direction from the first bank having the defect portion to an adjacent first bank, and respectively formed on two second banks adjacent to the second bank with which the candidate first space overlaps.

When the candidate first space, in plan view, spans over a second bank and across two sub-pixel regions between which the second bank is located in the first direction and the regions of the two sub-pixel regions that overlap with the candidate first space both have surfaces areas smaller than $\alpha \times H$, forming the dam portion at the provisional forming position to have a shape detouring around and surrounding the defect portion ensures that the color mixture region has a small surface area.

Meanwhile, when the regions of the two sub-pixel regions that overlap with the candidate first space both have surfaces areas greater than equal to than $\alpha \times H$, forming the dam portion at the provisional forming position would result in the two sub-pixel regions both being perceived as dark spots. Thus, in this case, the dam portion is a pair of dams formed according to the second forming method, which forms the dam portion at higher speed than the first forming method, and respectively formed on second banks. This confines the color mixture area within the two sub-pixel regions, and thus achieves the effect of preventing the occurrence of display failures at substantially a similar level as when forming the dam portion at the provisional forming position. In addition, this reduces the amount of time required for the forming of the dam portion compared to when forming the dam portion according to the first formation method.

In the bank repair method pertaining to one aspect of the present disclosure, when the candidate first space, in plan view, spans over a second bank and across two sub-pixel regions between which the second bank is located in the first direction, and $Ia<\alpha \times H$ and $\alpha \times H \leq Ib$ are fulfilled, when denoting a length of a sub-pixel region in the first direction as L, and denoting a distance in the first direction between the one first-direction end of the candidate first space and an end portion of the second bank with which the candidate first space overlaps that is at a side of the one first-direction end of the candidate first space as da, the dam portion may be a pair of a first dam and a second dam when $da<\alpha \times L$ is fulfilled, the first dam formed according to the first forming method at a position corresponding to the one first-direction end of the candidate first space and the second dam formed according to the second forming method on one of two second banks adjacent to the second bank with which the candidate first space overlaps that is at a side of the other first-direction end of the candidate first space, and the dam portion may be formed according to the first forming method at the candidate forming position when $\alpha \times L \leq da$ is fulfilled.

When the candidate first space spans over a second bank and across two sub-pixel regions between which the second bank is located in the first direction, and $Ia<\alpha \times H$ and $\alpha \times H \leq Ib$ are fulfilled, where Ia denotes a surface area of a region of one of the two sub-pixel regions that is at a side of one first-direction end of the candidate first space that overlaps with the candidate first space and Ib denotes a surface area of a region of the other one of the two sub-pixel regions that is at a side of the other first-direction end of the candidate first space that overlaps with the candidate first space, forming the dam portion to have a shape detouring around and surrounding the defect portion would result in the other one of the two sub-pixel regions being perceived as a dark spot. Thus, in this structure, a dam is formed according to the second forming method on a second bank adjacent to the second bank with which the candidate first space overlaps that is at a side of the other first-direction end of the candidate first space. This reduces the amount of time required for forming the dam portion.

Here, a dam portion having a shape detouring around and surrounding the defect portion cannot be divided into two parts, one at the side of the one first-direction end of the candidate first space and the other at the side of the other first-direction end of the candidate first space. As such, when forming a dam according to the second forming method on a second bank adjacent to the second bank with which the candidate first space overlaps that is at a side of the other first-direction end of the candidate first space as described above, the dam portion would be a pair of dams each extending from the first bank having the defect portion to an adjacent first bank.

Specifically, when $da<\alpha \times L$ is fulfilled, the dam at the side of the one first-direction end of the candidate first space is formed according to the first forming method at a position corresponding to the one first-direction end of the candidate first space. This ensures that the surface area of the color mixture region in the one of the two sub-pixel regions that is at the side of the one first-direction end of the candidate first space is smaller than $\alpha \times H$, and thereby prevents this sub-pixel region from being perceived as a dark spot.

Meanwhile, when $\alpha \times L \leq da$ is fulfilled, forming the dam at the side of the one first-direction end of the candidate first space according to the first forming method at a position corresponding to the one first-direction end of the candidate first space would result in the surface area of the color mixture region in the one of the two sub-pixel regions that is at the side of the one first-direction end of the candidate first space being greater than or equal to $\alpha \times H$, and consequently, in this sub-pixel region being perceived as a dark spot. However, it is not clear whether forming the dam at the side of the one first-direction end of the candidate first space at a position providing the color mixture region in the one of the two sub-pixel regions that is at the side of the one first-direction end of the candidate first space with a surface area smaller than $\alpha \times H$ is desirable, since it is not clear whether such a position would be located at a sufficient margin from the defect portion. Accordingly, in this case, the dam at the side of the one first-direction end of the candidate first space is formed according to the first formation method at the provisional forming position. This ensures that the surface area of the color mixture region in the one of the two sub-pixel regions that is at the side of the one first-direction end of the candidate first space is smaller than $\alpha \times H$, and thereby prevents this sub-pixel region from being perceived as a dark spot.

In the bank repair method pertaining to one aspect of the present disclosure, the dam portion may come in contact with a first bank adjacent to the first bank having the defect portion at some point along a path between the two points.

This reduces the surface area of the color mixture region surrounded by the dam portion, and prevents the occurrence of display failures.

In the bank repair method pertaining to one aspect of the present disclosure, the dam portion may not come in contact with a first bank adjacent to the first bank having the defect portion.

This further reduces the surface area of the color mixture region, and prevents the occurrence of display failures.

In the bank repair method pertaining to one aspect of the present disclosure, in the forming of the dam portion, a protruding portion may be formed in addition to the dam portion, the protruding portion protruding upward from a top surface of each of the first bank having the defect portion and an adjacent first bank at a portion coming in contact with the dam portion.

According to this, even when ink droplets applied by using the inkjet method arrive on dams composing the dam portion when the forming of the light-emitting layers is performed after the forming of the dam portion, the ink droplets are prevented from spreading along the top surfaces of the dams into adjacent concave spaces. Thus, this presents the occurrence of color mixture.

In the bank repair method pertaining to one aspect of the present disclosure, a height of the second banks from the top surface of the substrate may be equal to a height of the first banks from the top surface of the substrate, and the dam portion may not be formed in a sub-pixel region in which $\alpha \times H \leq I$ is fulfilled.

When the height of the second banks from the top surface of the substrate is equal to the height of the first banks from the top surface of the substrate, or that is, in the pixel bank structure, first banks and second banks partition sub-pixels from one another. As such, in the pixel bank structure, a mixture of inks of different colors can be kept within a sub-pixel region and can be prevented from spreading without forming the dam portion provided that the sub-pixel region fulfills $\alpha \times H \leq I$. This reduces the amount of time required for the repair of banks, due to the procedure of forming the dam portion becoming unnecessary.

In the bank repair method pertaining to one aspect of the present disclosure, the first forming method may form the dam portion by using a needle dispenser.

This enables forming the dam portion with an accurate shape at an accurate position.

In the bank repair method pertaining to one aspect of the present disclosure, the second forming method may form the dam portion by using a nozzle dispenser.

This enables reducing the amount of time required for forming the dam portion compared to when the dam portion is formed by using a needle dispenser.

In the bank repair method pertaining to one aspect of the present disclosure, $\alpha=0.2$ may be fulfilled.

Typically, when a color mixture area covers 20% or more of the surface area of a sub-pixel region, the human eye perceives the sub-pixel region as a dark spot. Setting the reference value $\alpha$ enables efficiently setting the forming position, the forming method, etc., of the dam portion.

One aspect of the present disclosure is a manufacturing method of an organic EL display device, including: forming the dam portion according to any bank repair method described above; and after forming the dam portion, forming the light-emitting layers in the concave spaces by ejecting ink droplets into the concave spaces by using a nozzle head, wherein in the forming of the light-emitting layers, ink droplets are ejected from the nozzle head to arrive in both the first space and the second space.

This achieves ensuring that the color mixture area has as small an area as possible even when a defect portion is present, and thereby prevents the occurrence of display failures. In addition, droplets of ink for forming light-emitting layers arrive in both the first space and the second space. Accordingly, the organic EL display device that is yielded has excellent display performance, due to problems such as light-emission failure and current leakage, which occur due to insufficient covering with ink for forming light-emitting layers, being prevented.

One aspect of the present disclosure is an organic EL display device including: a substrate; first banks and second banks disposed over the substrate; and light-emitting layers disposed in concave spaces that the first banks define over the substrate, wherein the first banks are elongated in a first direction and spaced away from one another in a second direction, and the second banks are elongated in the second direction and spaced away from one another in the first direction, the first direction and the second direction being different directions along a top surface of the substrate and intersecting with one another, the first banks include a first bank having a defect portion, the defect portion being a foreign particle or a missing portion of the first bank, and a dam portion is disposed in each of adjacent concave spaces between which the first bank having the defect portion is located in the second direction, a dam portion formed in a concave space partitioning a light-emitting layer disposed in the concave space into a first light-emitting layer in a vicinity of the defect portion and a second light-emitting layer outside the vicinity of the defect portion.

In the organic EL display device pertaining to one aspect of the present disclosure, a dam portion formed in a concave space partitions a light-emitting layer disposed in the concave space into a first light-emitting layer and a second light-emitting layer. The first light-emitting layer is a part of the light-emitting layer in which color mixture has occurred due to the presence of the defect portion. Meanwhile, the second light-emitting layer is a normal part of the light-emitting layer. In other words, the dam portion confines the color mixture area, which is a part of the light-emitting layer where color mixture has occurred, within the first light-emitting layer. Thus, the color mixture region has relatively small surface area compared to when the dam portion is not provided to partition the light-emitting layer, whereby the occurrence of display failures in the organic EL display device is prevented.

In the organic EL display device pertaining to one aspect of the present disclosure, a light-emission color of the first light-emitting layer may differ from a light-emission color of the second light-emitting layer, and the light-emission color of the first light-emitting layer may be a mixture of light-emission colors of second light-emitting layers respectively disposed in the adjacent concave spaces.

This confines the part of the light-emitting layer in which color mixture has occurred within the first light-emitting layer, ensures that the color mixture region has as small a surface area as possible, and yields an organic EL display device in which the occurrence of display failures is prevented.

In the organic EL display device pertaining to one aspect of the present disclosure, a height of the second banks from the top surface of the substrate may be smaller than a height of the first banks from the top surface of the substrate, and when (i) defining a region surrounded by a pair of adjacent first banks and a pair of adjacent second banks as a sub-pixel region, and denoting a plan-view surface area of a sub-pixel region as H, and (ii) denoting a plan-view surface area of the first light-emitting layer as I, $I < \alpha \times H$ may be fulfilled, where a fulfills $0.05 < \alpha < 0.9$, in plan view, the first light-emitting layer may not overlap with any second bank, or one of two first-direction ends of the first light-emitting layer may overlap with a second bank, and the dam portion may have a first width.

This ensures that the color mixture region has as small a surface area as possible in an organic EL display device with the line bank structure, and yields an organic EL display device in which the occurrence of display failures is prevented.

In the organic EL display device pertaining to one aspect of the present disclosure, a height of the second banks from the top surface of the substrate may be smaller than a height of the first banks from the top surface of the substrate, when defining a region surrounded by a pair of adjacent first banks and a pair of adjacent second banks as a sub-pixel region, the first light-emitting layer, in plan view, may span over a second bank and across two sub-pixel regions between which the second bank is located in the first direction, when (i) denoting a plan-view surface area of a sub-pixel region as H, (ii) defining a region of one of the two sub-pixel regions that overlaps with the first light-emitting layer as a first overlap region, and denoting a plan-view surface area of the first overlap region as Ia, the one of the two sub-pixel regions being a sub-pixel region in which one first-direction end of the light-emitting layer is located, and (iii) defining a region of the other one of the two sub-pixel regions that overlaps with the first light-emitting layer as a second overlap region, and denoting a plan-view surface area of the second overlap region as Ib, the other one of the two sub-pixel regions being a sub-pixel region in which the other first-direction end of the light-emitting layer is located, Ia<α×H and Ib<α×H may be fulfilled, and the dam portion may have a first width.

This yields an organic EL display device with the line bank structure in which the occurrence of display failures is prevented to substantially the same extent as in the case where it is ensured that the color mixture region has as small a surface area as possible.

In the organic EL display device pertaining to one aspect of the present disclosure, the dam portion may be a pair of dams each having a first width and extending from different ones of two points on the first bank having the defect portion to an adjacent first bank, the defect portion being located between the two points in the first direction.

This enables forming a dam portion surrounding the defect portion with ease.

In the organic EL display device pertaining to one aspect of the present disclosure, the dams may extend along the second direction.

This enables forming the dam portion with ease.

In the organic EL display device pertaining to one aspect of the present disclosure, the dams may extend in parallel in a direction intersecting with the second direction.

This allows forming the dam portion to correspond with the shape of the defect portion even if the defect portion is not positioned straightly on a first bank.

In the organic EL display device pertaining to one aspect of the present disclosure, the dams may be located at a distance from one another, the distance decreasing with increasing distance from the first bank having the defect portion.

Typically, when ink flows from one concave space into an adjacent concave space in the forming of light-emitting portions, the flow intensity is greatest near the defect portion. Thus, in this structure, the distance between the dams composing the dam portion is relatively great near the defect portion, to prevent the outflow of ink over the dams. In addition, this structure ensures that the surface area of space surrounded by the dam portion, which becomes the color mixture region, is as small as possible. This ensures that the color mixture region has as small a surface area as possible, and yields an organic EL display device in which the occurrence of display failures is prevented.

In the organic EL display device pertaining to one aspect of the present disclosure, the dam portion may extend between two points on the first bank having the defect portion while detouring around the defect portion, the defect portion being located between the two points in the first direction.

This confines the first light-emitting layer, which is the part of the light-emitting layer in which color mixture has occurred, within the region surrounded by the dam portion having a shape detouring around and surrounding the dam portion. As such, this yields an organic EL display device in which the color mixture region has as small a surface area as possible, and in which the occurrence of display failures is prevented.

In the organic EL display device pertaining to one aspect of the present disclosure, the dam portion may come in contact with a first bank adjacent to the first bank having the defect portion at some point along a path between the two points.

This confines the first light-emitting layer, which is the color mixture area, within the region surrounded by the dam portion. As such, this yields an organic EL display device in which the color mixture region has as small a surface area as possible, and in which the occurrence of display failures is prevented.

In the organic EL display device pertaining to one aspect of the present disclosure, the dam portion may not come in contact with a first bank adjacent to the first bank having the defect portion.

This further reduces the surface area of the first light-emitting layer, and yields an organic EL display device in which the occurrence of display failures is prevented in an increasingly effective manner.

In the organic EL display device pertaining to one aspect of the present disclosure, a height of the second banks from the top surface of the substrate may be smaller than a height of the first banks from the top surface of the substrate, when defining a region surrounded by a pair of adjacent first banks and a pair of adjacent second banks as a sub-pixel region, the first light-emitting layer, in plan view, may span over a second bank across two sub-pixel regions between which the second bank is located in the first direction, the dam portion may have a first width and may extend between two points on the first bank having the defect portion while detouring around the defect portion, the defect portion being located between the two points in the first direction, when (i) denoting a plan-view surface area of a sub-pixel region as H, (ii) defining a region of one of the two sub-pixel regions that overlaps with the first light-emitting layer as a first overlap region, and denoting a plan-view surface area of the first overlap region as Ia, the one of the two sub-pixel regions being a sub-pixel region in which one first-direction end of the light-emitting layer is located, (iii) defining a region of the other one of the two sub-pixel regions that overlaps with the first light-emitting layer as a second overlap region, and denoting a plan-view surface area of the second overlap region as Ib, the other one of the two sub-pixel regions being a sub-pixel region in which the other first-direction end of the light-emitting layer is located, (iv) denoting a length of a sub-pixel region in the first direction as L, and (v) denoting a distance in the first direction between the one first-direction end of the first light-emitting layer and an end portion of the second bank with which the first light-emitting layer overlaps at a side of the one first direction end of the first light-emitting layer as da, Ia<α×H, α×H≤Ib, and α×L≤du may be fulfilled.

This prevents one of the two sub-pixel regions from becoming a dark spot, and yields an organic EL display device in which the occurrence of display failures is prevented.

In the organic EL display device pertaining to one aspect of the present disclosure, a height of the second banks from the top surface of the substrate may be smaller than a height of the first banks from the top surface of the substrate, when defining a region surrounded by a pair of adjacent first banks and a pair of adjacent second banks as a sub-pixel region, the first light-emitting layer, in plan view, may span over a second bank and across two sub-pixel regions between which the second bank is located in the first direction, the dam portion may be a pair of a first dam and a second dam, the first dam may have a first width, may be disposed at one first-direction side of the second bank with which the first light-emitting layer overlaps, and may extend in the second direction from the first bank having the defect portion to an adjacent first bank, the second dam may have a second width greater than the first width, may be disposed on a second bank that is adjacent to the second bank with which the first light-emitting layer overlaps and is located at the other first-direction side of the second bank with which the first light-emitting layer overlaps, and may extend in the second direction from the first bank having the defect portion to the adjacent first bank, and when (i) denoting a plan-view surface area of a sub-pixel region as H, and (ii) defining a region of one of the two sub-pixel regions that overlaps with the first light-emitting layer as a first overlap region, and denoting a plan-view surface area of the first overlap region as Ia, the one of the two sub-pixel regions being a sub-pixel region at the one first-direction side of the second bank with which the first light-emitting layer overlaps, Ia<α×H may be fulfilled.

This prevents one of the two sub-pixel regions in which the first dam is formed from becoming a dark spot, and yields an organic EL display device in which the occurrence of display failures is prevented. Further, the second dam is disposed on a second bank. Since the areas above the second banks become non-light-emitting areas, the forming of the second dam need not be performed with precise control. As such, the second dam can be formed easily. Further, this reduces the amount of time required for forming the dam portion.

In the organic EL display device pertaining to one aspect of the present disclosure, a height of the second banks from the top surface of the substrate may be smaller than a height of the first banks from the top surface of the substrate, the defect portion may not overlap with any second bank in plan view, and the dam portion may be a pair of dams each having a second width, the dams respectively disposed on two adjacent second banks between which the defect portion is located in the first direction and each extending in the second direction from the first bank having the defect portion to an adjacent first bank.

This enables forming the dam portion with ease and reducing the amount of time required for forming the dam portion when the defect portion has a large size and the entirety of the sub-pixel region in which the defect portion is present inevitably becomes a dark spot, since the dam portion defining the first light-emitting layer, which is a color mixture area, is composed of a pair of dams each having a second width.

In the organic EL display device pertaining to one aspect of the present disclosure, a height of the second banks from the top surface of the substrate may be smaller than a height of the first banks from the top surface of the substrate, the defect portion may overlap with a second bank in plan view, and the dam portion may be a pair of dams each having a second width, the dams respectively disposed on two second banks between which the second bank overlapping with the defect portion is located in the first direction and each extending in the second direction from the first bank having the defect portion to an adjacent first bank.

This yields an organic EL display device in which the occurrence of display failures is prevented when a defect portion with a large size spans over a second bank and across two sub-pixel regions between which the second bank is located, due to the first light-emitting layer, which is a color mixture area, being confined within the two sub-pixel regions by a pair of dams having the second width.

Further, this enables forming the dam portion with ease and reduces the amount of time required for forming the dam portion, since the dam portion is composed of a pair of dams having the second width.

The organic EL display device pertaining to one aspect of the present disclosure may further include a protruding portion protruding upward from a top surface of each of the first bank having the defect portion and an adjacent first bank at a portion coming in contact with the dam portion.

This prevents ink from flowing from one concave space into an adjacent concave space along the dam portion when the forming of light-emitting layers is performed due to the protrusion portion being provided. Accordingly, this ensures that the color mixture region has as small a surface area as possible, and yields an organic EL display device in which the occurrence of display failures is prevented with higher certainty.

In the organic EL display device pertaining to one aspect of the present disclosure, a height of the second banks from the top surface of the substrate may be equal to a height of the first banks from the top surface of the substrate, when (i) defining a region surrounded by a pair of adjacent first banks and a pair of adjacent second banks as a sub-pixel region, and denoting a plan-view surface area of a sub-pixel region as H, and (ii) denoting a plan-view surface area of the first light-emitting layer as I, I<α×H may be fulfilled, where a fulfills 0.05<α<0.9, and the dam portion may have a first width.

This ensures that the color mixture region has as small a surface area as possible in an organic EL display device with the line bank structure, and yields an organic EL display device in which the occurrence of display failures is prevented.

In the organic EL display device pertaining to one aspect of the present disclosure, the first width may be between 5 µm and 20 µm.

This allows forming dams having the first width by using a needle dispenser, which can be precisely controlled for accurate positions, accurate shapes, etc., ensures that the color mixture area has as small a surface area as possible with higher accuracy, and yields an organic EL display device in which the occurrence of display failures is prevented in an increasingly effective manner.

In the organic EL display device pertaining to one aspect of the present disclosure, the second width may be between 10 µm and 50 µm.

This allows forming dams having the second width by using a nozzle dispenser, which forms dams at higher speed than a needle dispenser, and yields an organic EL display device in which the occurrence of display failures is prevented and which can be manufactured in a relatively short amount of time.

Embodiment

Overall Structure of Organic EL Display Device

Figure 1:
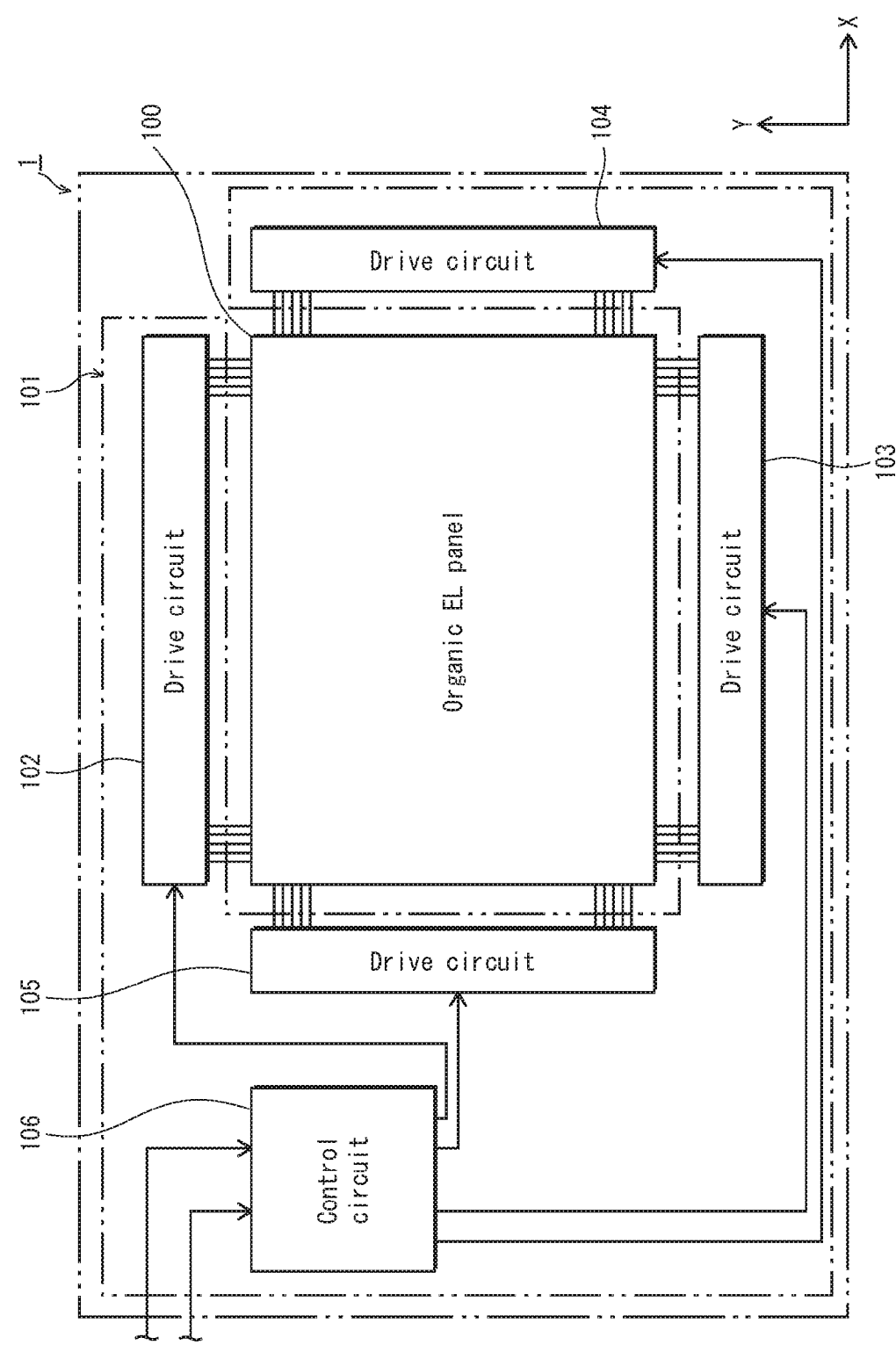
FIG. 1 is a schematic block diagram illustrating the structure of an organic EL display device pertaining to an embodiment.

FIG. 1 is a schematic block diagram illustrating the structure of an organic EL display device 1 having a display panel 100 pertaining to the embodiment.

Figure 2:
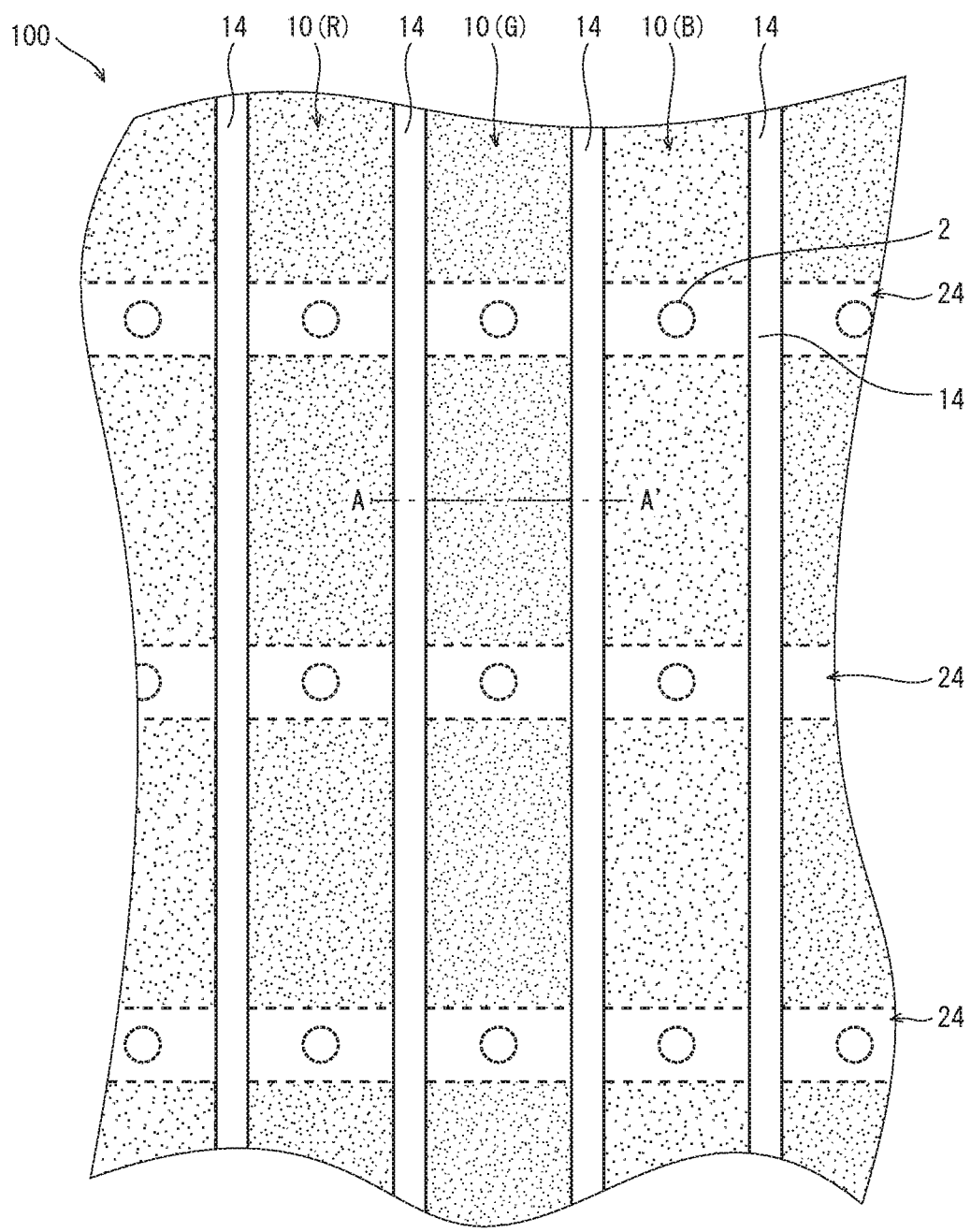
FIG. 2 is a schematic plan view illustrating a part of a display panel pertaining to the embodiment.

As illustrated in FIG. 1, the organic EL display device 1 includes the display panel 100 and a drive controller 101 connected thereto. The display panel 100 is a panel using the electroluminescence effect of an organic material. In the display panel 100, light-emitting elements (organic EL elements) 10 are arranged over a substrate to form a matrix, as illustrated in FIG. 2. The drive controller 101 includes four drive circuits, namely drive circuits 102, 103, 104, and 105, and a control circuit 106.

The arrangement of the drive controller 101 with respect to the display panel 100 is not limited to that illustrated in FIG. 1.

[Structure of Organic EL Display Panel]

Figure 3:
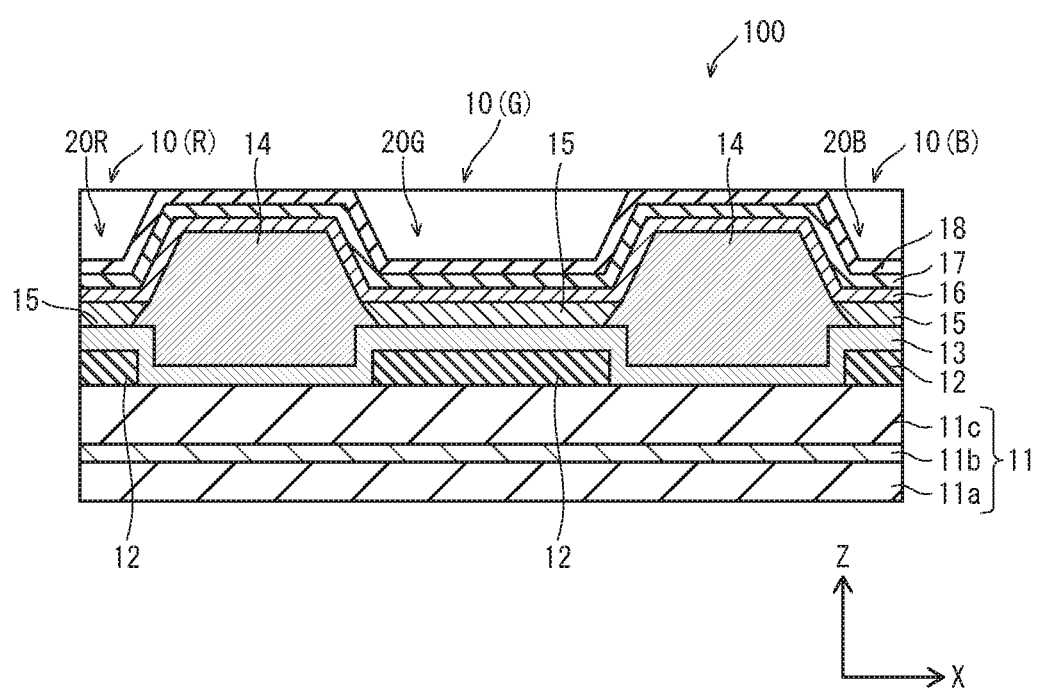
FIG. 3 is a cross-sectional view illustrating a part of the display panel pertaining to the embodiment taken along line A-A' of FIG. 2, in magnified state.

FIG. 2 schematically illustrates the overall structure of the display panel 100, when viewed in plan view from above a display surface thereof. FIG. 3 is a cross-sectional view illustrating a part of the display panel 100 taken along line A-A' of FIG. 2, in magnified state. The display panel 100 is a top-emission-type panel, and the display surface of the display panel 100 is located in the Z direction in FIG. 3.

The following describes the structure of the display panel 100, with reference to FIG. 2 and FIG. 3.

As illustrated in FIG. 3, the display panel 100 includes, as main components thereof, a ground substrate 11, pixel electrodes 12, a hole injection layer 13, first banks 14, organic light-emitting layers 15, an electron transport layer 16, a common electrode 17, and a sealing layer 18.

The hole injection layer 13, the organic light-emitting layers 15, and the electron transport layer 16 are functional layers, and thus, the functional layers are disposed between the pixel electrodes 12 and the common electrode 17.

Each light-emitting element 10 includes an organic light-emitting layer 15 of a corresponding light-emission color. That is, the light-emitting elements 10R, 10G, and 10B include organic light-emitting layers 15 of the colors red (R), green (G), and blue (B), respectively. Each light-emitting element 10 serves as a sub-pixel of the display panel 100, and sub-pixels are arranged to form a matrix in the display panel 100, as illustrated in FIG. 2.

FIG. 2 illustrates a state where the electron transport layer 16, the common electrode 17, and the sealing layer 18 are removed.

[Ground Substrate]

The ground substrate 11 includes a substrate body 11a, thin-film transistor (TFT) layers 11b, and an interlayer insulation layer 11c.

The substrate body 11a serves as the base of the display panel 100, and may be formed by using, for example, an electrically-insulating material such as non-alkali glass, soda glass, polycarbonate resin, polyester resin, or aluminum oxide.

The TFT layers 11b are provided one-to-one for sub-pixels of the display panel 100, on the surface of the substrate body 11a. Each TFT layer 11b has formed therein a pixel circuit that includes a TFT element.

The interlayer insulation layer 11c is formed on the TFT layers 11b. The interlayer insulation layer 11c is formed by using an organic electrically-insulating material such as a polyimide resin, an acrylic resin, or a novolac-type phenol resin, or an inorganic electrically-insulating material such as SiO (silicon oxide) or SiN (silicon nitride). The interlayer insulation layer 11c secures electrical insulation between the TFT layers 11b and the pixel electrodes 12. In addition, the interlayer insulation layer 11c planarizes any level difference on the top surfaces of the TFT layers 11b, and thereby suppresses the influence that such level differences would otherwise have with respect to the surface on which the pixel electrodes 12 are formed.

[Pixel Electrodes]

The pixel electrodes 12 are provided one-to-one for sub-pixels of the display panel 100, on the ground substrate 11. The pixel electrodes 12 are formed by using an optically-reflective electrically-conductive material, such as Ag (silver), Al (aluminum), aluminum alloy, Mo (molybdenum), or APC (an alloy of silver, palladium, and copper). In the embodiment, the pixel electrodes 12 serve as anodes.

A conventional light-transmissive electrically-conductive film may be additionally provided on the surface of each pixel electrode 12. This light-transmissive electrically-conductive film may be formed, for example, by using indium tin oxide (ITO) or indium zinc oxide (IZO). The light-transmissive electrically-conductive films are disposed between the pixel electrodes 12 and the hole injection layer 13, and improve inter-layer joining.

[Hole Injection Layer]

The hole injection layer 13 is formed, for example, by using an oxide of a metal such as silver (Ag), molybdenum (Mo), chromium (Cr), vanadium (V), tungsten (W), nickel (Ni), or iridium (Ir), or an electrically-conductive polymer material such as PEDOT (a mixture of polythiophene and polystyrene sulfate). The hole injection layer 13, when formed by using a metal oxide, assists hole generation and ensures stable injection and transportation of holes to the organic light-emitting layers 15.

[Banks]

A plurality of parallel, linear first banks 14 are provided on the surface of the hole injection layer 13. In plan view, each of the first banks 14 is elongated and extends in the Y direction (first direction), and has a rectangular shape. The first banks 14 are formed by using an organic electrically-insulative material (for example, an acrylic resin, a polyimide resin, or a novolac-type phenol resin).

As illustrated in FIG. 3, each of the first banks 14 has a trapezoidal cross-section. Further, a pair of first banks 14 defines a concave space 20, whereby a plurality of concave spaces 20 (concave spaces 20R, 20G, 20B) are partitioned from one another by the first banks 14. At the bottom portion of each concave space 20, a plurality of pixel electrodes 12 are arranged along the Y direction, and above the pixel electrodes 12, functional layers are disposed. The functional layers include the hole injection layer 13, the organic light-emitting layers 15, and the electron transport layers 16.

The first banks 14 partition light-emitting elements 10 that are adjacent in the X direction from one another, and also serve as structural members that, when a wet process is performed for forming the organic light-emitting layers 15, prevent applied ink from overflowing.

As illustrated in FIG. 2, the display panel 100 also includes a plurality of second banks 24. The second banks 24 have smaller height than the first banks 14, as illustrated in FIG. 6. Further, a plurality of second banks 24 are disposed in each concave space 20, each between pixel electrodes 12 that are adjacent in the Y direction. The second banks 24 partition light-emitting elements 10 that are adjacent in the Y direction from one another. As such, the display panel 100 is an organic EL display panel that has the so-called line bank structure.

The second banks 24 are disposed at the same Y-direction positions in every concave space 20. Each second bank 24 connects with adjacent second banks 24 by extending in the X direction (second direction) below first banks 14, and thus, when viewed as a whole, each second bank 24 has a rectangular shape elongated in the X direction. Accordingly, the first banks 14 and the second banks 24 form a lattice structure over the ground substrate 11, as illustrated in FIG. 2.

[Organic Light-Emitting Layers]

The organic light-emitting layers 15 emit light through recombination of carriers (i.e., holes and electrons) occurring therein, and each contain an organic material corresponding to one of the colors R, G, and B.

The organic light-emitting layers 15 are disposed in the concave spaces 20 (refer to the concave spaces 20R, 20G, and 20B illustrated in FIG. 6A and FIG. 6B), which are partitioned from one another by the first banks 14, are elongated and extend in the Y direction, and have groove-like shapes.

In FIG. 6, each concave space 20R is a concave space in which light-emitting layers of the color R will be formed and thus, light-emitting elements 10R corresponding to the color R will be formed. Similarly, each concave space 20G is a concave space in which light-emitting layers of the color G will be formed and thus, light-emitting elements 10G corresponding to the color G will be formed, and each concave space 20B is a concave space in which light-emitting layers of the color B will be formed and thus, light-emitting elements 10B corresponding to the color B will be formed.

As such, each first bank 14 is disposed between two groups of organic light-emitting layers 15, which differ in terms of color.

The organic light-emitting layers 15 may be formed, for example, by using a fluorescent substance such as polyphenylene vinylene (PPV), polyfluorene, oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of a 8-hydroxyquinoline compound, metal complex of a 2-bipyridine compound, complex of a Schiff base and a group III metal, metal complex of oxine, or rare earth metal complex.

[Electron Transport Layer]

The electron transport layer 16 transports electrons injected thereto from the common electrode 17 to the organic light-emitting layers 15, and is formed by using, for example, an oxidiazole derivative (OXD), a triazole derivative (TAZ), or a phenanthroline derivative (BCP, Bphen).

[Common Electrode]

The common electrode 17 is, for example, formed by using a light-transmissive material having electrically-conductive properties, such as ITO or IZO. The common electrode 17 extends across all sub-pixels of the display panel 100.

In the embodiment, the common electrode 17 serves as a cathode.

[Sealing Layer 18]

The sealing layer 18 is disposed to protect the hole injection layer 13, the organic light-emitting layers 15, the electron transport layer 16, and the common electrode 17 from water and oxygen.

Although not depicted in the drawings, black matrices, color filters, and/or the like may also be formed over the sealing layer 18.

[Display Panel Manufacturing Method]

Figure 4:
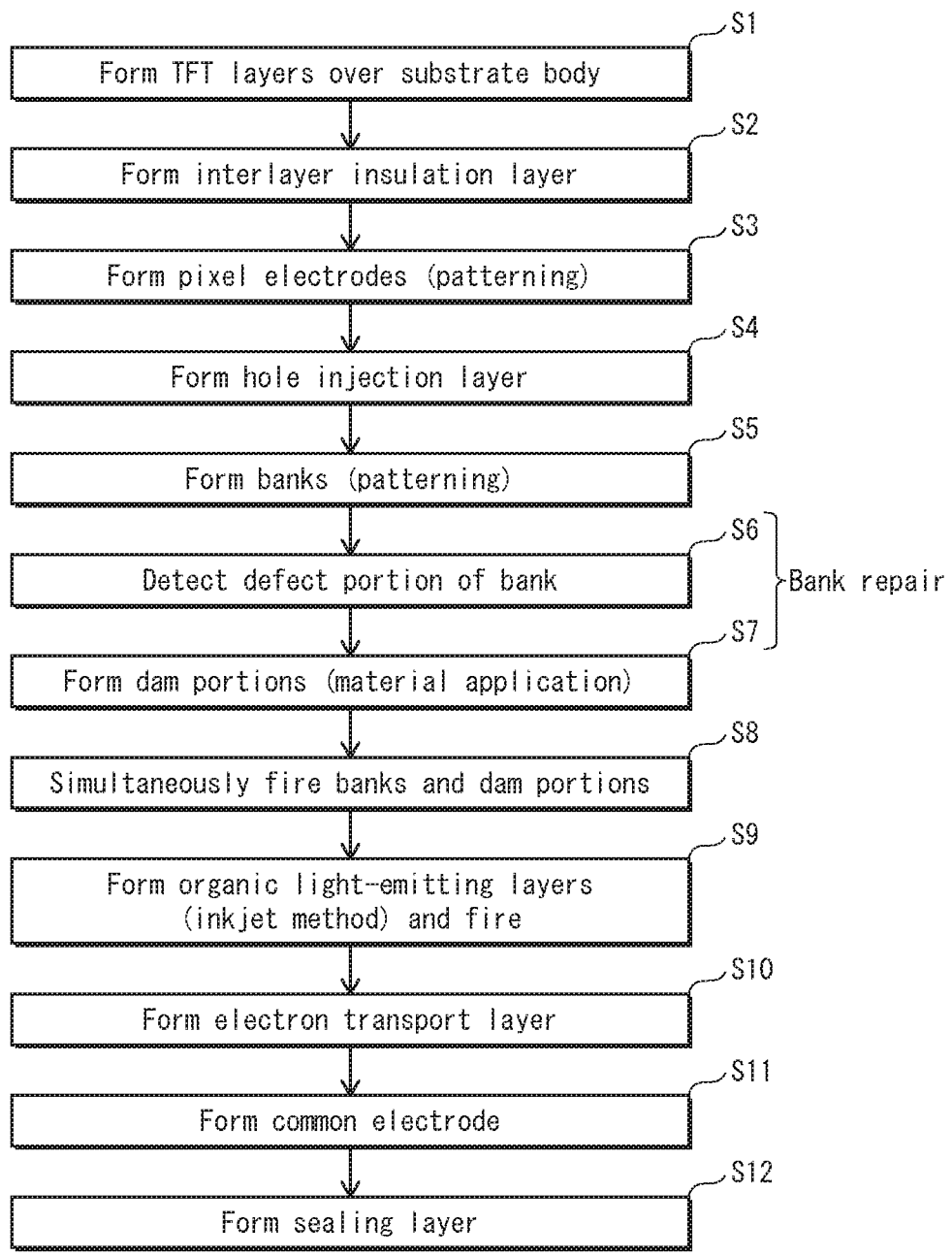
FIG. 4 schematically illustrates procedures of a manufacturing process of the display panel pertaining to the embodiment.

FIG. 4 is a schematic process diagram illustrating a manufacturing process of the display panel 100.

Each of FIG. 5A through FIG. 5E is a schematic cross-sectional view illustrating a procedure of the manufacturing process of the display panel 100.

The manufacturing method of the display panel 100 is described in accordance with FIG. 4, which illustrates procedures involved in the manufacturing process, and with further reference to FIG. 3 and FIG. 5A through FIG. 5E.

First, the TFT layers 11b are formed on the substrate body IIa (Step S1).

Subsequently, the interlayer insulation layer 11c is formed on the TFT layers 11b by using an organic material providing excellent electrical insulation and through a photoresist method, with which the preparation of the ground substrate 11 is completed (step S2). The thickness of the interlayer insulation layer 11c is approximately 4 μm, for example. Although not depicted in the cross-sectional view of FIG. 3 nor in FIG. 4, which illustrates the procedures involved in the manufacturing process, contact holes 2 (see FIG. 2) are also formed during the forming of the interlayer insulation layer 11c.

Next, the pixel electrodes 12 are formed, one for each sub-pixel, from a metallic material having a thickness of approximately 400 nm, through vacuum vapor deposition or sputtering (Step S3).

Then, the hole injection layer 13 is formed by uniformly forming a film of tungsten oxide over the ground substrate 11 and the pixel electrodes 12 through sputtering or the like (Step S4).

Subsequently, the first banks 14 and the second banks 24 are formed through photolithography (Step S5), as described in the following.

First, bank material (e.g., a photosensitive photoresist material) for forming the second banks 24 is applied uniformly over the hole injection layer 13.

Then, a photomask having openings matching the pattern of the second banks 24 is placed over the layer of the applied bank material, and developing is performed through UV irradiation. The forming of the second banks 24 is completed by subsequently removing unhardened, excess bank material by using a developing fluid.

Subsequently, bank material (e.g., a negative photosensitive resin composition) for forming the first banks 14 is applied uniformly over the substrate over which the second banks 24 have been formed.

Then, bank patterning is performed by placing a mask having openings matching the pattern of the first banks 14 over the layer of the applied bank material, and performing irradiation with light from over the mask. The patterning of the first banks 14 having a predetermined pattern is completed by washing away any excess bank material with an alkaline developing fluid.

Figure 5A:
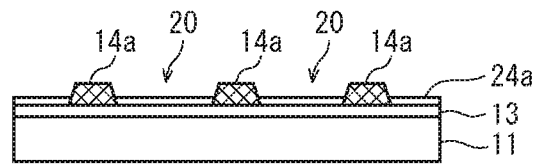

Unfired first banks 14a and unfired second banks 24a are formed as a result of such patterning, as illustrated in FIG. 5A. At this point, a concave space 20 has already been formed between each pair of adjacent first banks 14a.

Next, the unfired first banks 14a, formed through the above-described patterning, are examined to detect defect portions (Step S6). Any defect portion detected is repaired.

Figure 5B:
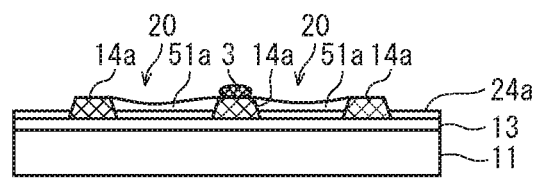

The repair is described in more detail later. Broadly speaking, a defect portion is repaired by forming dam portions in concave spaces 20, in the vicinity of the defect portion (Step S7). The dam portions are formed by applying a repair material with respect to the concave spaces and then drying the applied repair material. FIG. 5B illustrates a state where unfired first dams 51a have been formed by applying the repair material with respect to concave spaces 20.

Then, the first banks 14, the second banks 24, and first dams 51 (dam portions 50) are respectively produced by simultaneous thermal firing of the unfired first banks 14a, the unfired second banks 24a, and the unfired first dams 51a, thereby completing the repair of a defect portion 3 (Step S8). The simultaneous firing is, for example, performed by heating the unfired first banks 14a, the unfired second banks 24a, and the unfired first dams 51a at a temperature between 150° C. and 210° C. for 60 minutes.

Figure 5C:
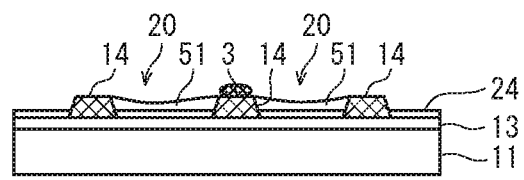

FIG. 5C illustrates a state where the first dams 51, as well as the first banks 14 and the second banks 24, have been formed by this firing, or in other words, a state where any defect portion 3 has been repaired.

The first banks 14 formed in this manner may be further subjected to a process of adjusting contact angle with respect to ink to be applied in the subsequent procedure. Alternatively, in order to provide hydrophobic properties to the surfaces of the first banks 14, processing such as surface processing using a predetermined alkaline solution, water, an organic solvent, etc., or plasma processing may be performed.

Figure 5D:
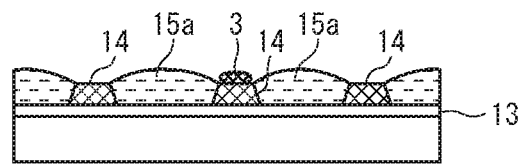

Next, inks for forming the organic light-emitting layers 15 are applied with respect to the concave spaces 20, as illustrated in FIG. 5D. Each ink is a mixture of an organic material for the corresponding organic light-emitting layers 15 and a solvent, and is applied with respect to the inside of concave spaces 20 using an inkjet method.

Figure 5E:

Ink layers 15a formed through the ink application are then dried by causing the solvent contained in the ink layers 15a to evaporate, and thermal firing is performed when necessary. Thus, the organic light-emitting layers 15 are formed in the concave spaces 20, as illustrated in FIG. 5E (Step S9).

Next, the electron transport layer 16 is formed over the organic light-emitting layers 15 and the first banks 14 by depositing a film of a material for the electron transport layer 16 through vacuum vapor deposition (Step S10).

The common electrode 17 is then formed by depositing a film of a material such as ITO or IZO through sputtering or the like (Step S11).

Then, the sealing layer 18 is formed by depositing a film of a light-transmissive material such as SiN or SiON over the surface of the common electrode 17 through sputtering, CVD, or the like (Step S12).

The manufacturing of the display panel 100 is completed through the above-described procedures.

[Method for Detecting and Repairing Defect Portion]

As described above in connection with the manufacturing method, but in more precise terms, the first banks 14, the second banks 24, and the first dams 51 are respectively formed by thermal firing and curing of the unfired first banks 14a, the unfired second banks 24a, and the unfired first dams 51a having been formed. However, the unfired first banks 14a, the unfired second banks 14, and the unfired first dams 51a are somewhat solidified and already have stable shapes. As such, in the present disclosure, description is provided while simply referring to the unfired first banks 14a, the unfired second banks 24a, and the unfired first dams 51a by using the terms first banks 14a, second banks 24a, and first dams 51a, respectively.

[Defect Portion 3]

First, a defect portion 3 of a first bank 14a is described.

A defect portion 3 of a first bank 14a may be a foreign particle present at the first bank 14a, or may be a missing portion of the first bank 14a.

The foreign particle may be, for example, a piece of metal originating in manufacturing equipment, or dust/dirt originating in the atmosphere. The dust/dirt tends to be a piece of fabric.

FIG. 6A illustrates an example in which a foreign particle has adhered onto one first bank 14a and has become a defect portion 3. FIG. 6B is a schematic perspective view illustrating a state where dam portions 50, each composed of a pair of first dams 51 disposed with the defect portion 3 therebetween in the Y direction (first direction), have been formed. FIG. 7A illustrates an example in which a foreign particle having a greater size than that illustrated in FIG. 6A has adhered onto one first bank 14a and has become a defect portion 3. FIG. 7B is a schematic perspective view illustrating a state where dam portions 50, each composed of a pair of second dams 52 disposed with the defect portion 3 therebetween in the Y direction (first direction), have been formed. As such, in the embodiment, a dam portion 50 is composed of a pair of first dams 51 or a pair of second dams 52, disposed with the defect portion 3 therebetween in the Y direction (first direction). Further, one pair of first dams 51 is disposed in each of concave spaces 20 between which the first bank 14a having the defect portion 3 is located, and the first dams 51 composing the pair extend in the X direction (second direction) from two points on the first bank 14a having the defect portion 3 to an adjacent first bank 14a.

Further, the first dams 51 are dams formed by using a needle dispenser. In the present disclosure, the method of forming dams by using a needle dispenser is referred to as a first forming method. Further, in the present disclosure, the plan-view width of the first dams 51 is referred to as a first width, and specifically, the first width is between 5 μm and 20 μm, for example.

When dome-shaped ink layers 15a are formed as illustrated in FIG. 5D by applying ink with respect to adjacent concave spaces 20 between which a first bank 14a having a foreign particle is located, there is a risk of the ink layers 15a coming in contact with the foreign particle. Consequently, some of the ink applied with respect to each of the concave spaces 20 may flow into the other, adjacent concave space 20, which results in inks of different light-emission colors (e.g., red ink and green ink) mixing.

The dam portions 50 pertaining to the embodiment stop the mixed ink from spreading any further, and thus prevent color mixture regions from spreading any further.

Note that the defect portion 3 need not be a foreign particle having adhered onto the first bank 14a. For example, as illustrated in FIG. 8A, the defect portion 3 may be a foreign particle that has entered the inside of the first bank 14a and penetrates through a wall surface of the first bank 14 from one concave space 20 to an adjacent concave space 20. For example, as illustrated in FIG. 8B, the defect portion 3 may be a foreign particle that has slipped beneath the first bank 14a and penetrates the first bank 14a from one concave space 20 to an adjacent concave space 20. With a foreign particle inside or beneath a first bank 14a, a gap serving as an ink flow channel may be formed in the first bank 14a, given poor adhesion between the foreign particle and the bank material. Particularly, when the foreign particle is a piece of fabric, the foreign particle itself unfortunately serves as an ink flow channel by absorbing ink. As such, even when the defect portion 3 is a foreign particle inside or beneath a first bank 14a, the defect portion 3 may bring about color mixture between ink layers 15a formed in adjacent concave spaces between which the foreign particle is located.

Further, FIG. 8C illustrates an example where a portion of one first bank 14a has collapsed and has become a defect portion 3. A portion of a first bank 14a may collapse in such a manner, for example, when a portion of a bank material layer not having undergone sufficient polymerization in the bank material layer light exposure process, due to not being exposed to enough light, is washed away during the subsequent developing process. Even when the defect portion 3 is a collapsed portion of the first bank 14a, the collapsed portion may mediate color mixture between ink layers 15a formed in adjacent concave spaces between which the collapsed portion is located.

When the display panel 100 is manufactured using a panel whose light-emitting layer has a color mixture region, the color mixture region emits light of a color differing from the originally intended color. Typically, when fluorescent substances of different light-emission colors are mixed, the light-emission color having longer wavelength becomes dominant.

For example, a color mixture region produced through mixing of red ink and green ink, such as the color mixture region illustrated in FIG. 13C, emits red light. Accordingly, a color mixture region formed in a region intended to emit green light turns out to emit red light, and thus, when the color mixture region spreads, light-emission in an undesired color (referred to in the following as light-emission color failure) may occur.

As described above, mixture of inks of different light-emission colors occurs at a portion of a first bank 14a where a foreign particle is present and at a collapsed portion of a first bank 14a, and the mixture of such inks may lead to light-emission color failure. As such, such portions of first banks 14a are referred to as defect portions 3 of the first banks 14a.

Further, light with a relatively long wavelength is typically perceived as being darker than light with a relatively short wavelength. Thus, when color mixture occurs in an organic light-emitting layer 15, the portion where color mixture has occurred is perceived as being darker than a portion of the organic light-emitting layer 15 where color mixture has not occurred.

Further, when a foreign particle is present inside or beneath a first bank 14a as illustrated in FIG. 8A and FIG. 8B, the first bank 14 bulges upwards and has relatively great height at the portion where the foreign particle is present. Meanwhile, when a portion of a first bank 14a has collapsed as illustrated in FIG. 8C, the first bank 14 has relatively small height at the portion.

[Detection of Defect Portion 3 and Forming of Dam Portions 50]

The detection of a defect portion 3 of a first bank 14a is performed by, for example, capturing an image of the surfaces of the first banks 14a formed over the ground substrate 11, and performing a pattern search on the image.

FIG. 9 illustrates the overall structure of one example of a repair device used for detecting and repairing bank defect portions.

The repair device illustrated in FIG. 9 (repair device 200) includes a base 201, and a table 202 and a head portion 210 over the base 201. The table 202 is a table on which the ground substrate 11 is placed. The head portion 210 has attached thereto an image capture element 211, a nozzle dispenser 212, and a needle dispenser 213. The table 202 is moveable along the Y direction in accordance with an instruction from a CPU 231 of a controller 230. The head portion 210 is likewise moveable along the X direction and the Z direction in accordance with an instruction from the CPU 231.

Accordingly, in accordance with an instruction from the CPU 231, the nozzle dispenser 212 and the needle dispenser 213, which are attached to the head portion 210, are capable of moving above the ground substrate 11 and in the X direction, the Y direction, and the Z direction relative to the ground substrate 11, which is placed on the table 202.

Here, the ground substrate 11 is in a state where the pixel electrodes 12, the hole injection layer 13, the first banks 14a, and the second banks 24a have already been formed over the ground substrate 11.

(First Implementation)

FIG. 10A is a schematic plan view illustrating where a dam portion 50 pertaining to a first implementation of the embodiment is to be formed. FIG. 10C is a schematic plan view illustrating a state where dam portions 50 pertaining to the first implementation have been formed.

As illustrated in FIG. 10A, when a defect portion 3 is detected on a first bank 14a, coordinates positions Ya and Yb respectively indicating the first and second end portions of the defect portion 3 (a foreign particle in this example) in the Y direction (first direction) are acquired. Further, values Ta and Tb are calculated by adding a tolerance value a to the respective coordinate values Ya and Yb. The values Ta and Tb so calculated are set as candidate forming positions for the dam portion 50. Specifically, the dam portion 50 in the first implementation is composed of a pair of first dams 51. Accordingly, the values Ta and Tb indicate the respective candidate forming positions of the two first dams 51. Here, the value Ta indicates a candidate forming position of one of the two first dams 51 that is located upstream in the Y direction (the lower direction in FIG. 10A and FIG. 10C), and the value Tb indicates a candidate forming position of one of the two first dams 51 that is located downstream in the Y direction (the upper direction in FIG. 10A and FIG. 10C).

Subsequently, a plan-view surface area I of an overlap region OL is calculated. The overlap region OL is a region of a candidate first space TSA that would overlap with a sub-pixel region SP in plan view. The candidate first space TSA is a region surrounded by adjacent first banks 14a and the dam portion 50, if dams were formed at the candidate forming positions. Here in the first implementation, the entire candidate first space TSA is located within one sub-pixel region. In other words, the candidate first space TSA does not overlap with any second bank 24a. As such, the candidate first space TSA equals the overlap region OL, and thus the surface area I equals the surface area of the candidate first space TSA. Note that in the following, a plan-view surface area of a given region is simply referred to as the surface area of the region.

Typically, when the proportion of a color mixture region to a sub-pixel region is equal to or greater than a predetermined proportion, the human eye perceives the entire sub-pixel region as a dark spot. In the embodiment, this predetermined proportion is denoted as "$\alpha$". For example, $\alpha=0.2$ (i.e., 20%) in the embodiment. However, values other than 0.2 may be set to $\alpha$. Specifically, any value may be set to $\alpha$, as long as the value ensures that the entire sub-pixel region is not perceived as a dark spot or the value ensures that the drop in luminance of the sub-pixel region is within an acceptable range. Specifically, any value between 0.05 and 0.9 may be set to $\alpha$. Preferably, any value between 0.1 and 0.3 may be set to $\alpha$. This similarly applies to all implementations and modifications described in the following.

Here, a region that is in the vicinity of the defect portion 3 and that is partitioned from the outside by the dam portion 50, or that is, the candidate first space TSA becomes a color mixture region. Further, in the first implementation, the proportion of the surface area of the candidate first space TSA, which becomes a color mixture region, to a surface area H of the sub-pixel region is lower than the predetermined proportion $\alpha$. Accordingly, $1 < \alpha \times H$ holds true in the first implementation. As such, forming first dams 51 at the candidate forming positions Ta and Tb results in the color mixture region being confined within the candidate first space TSA (which becomes a first space SA after dam forming), and the sub-pixel not being perceived as a dark spot.

In the first implementation, the two first dams 51 that are formed both extend along the X direction. Due to this, the proportion of the surface area I of the candidate first space TSA to the surface area H of the sub-pixel region SP may be calculated by calculating a ratio of a distance J to a length L. Here, the distance J is the Y-direction distance between the two first dams 51, and the length L is the Y-direction length of the sub-pixel region SP.

Here, it is important to provide a normal region of the sub-pixel region (i.e., the rest of the sub-pixel region, excluding the color mixture region) with as large a surface area as possible. In other words, it is important to reduce the surface area of the candidate first space TSA, which becomes the color mixture region, as much as possible. In order to achieve this, the first dams 51 are to be formed accurately at their forming positions with accurate shapes, with as small a width as necessary. In view of this, the pair of first dams 51 is formed by using the needle dispenser in the first implementation. FIG. 10A illustrates points $P_1$ through $P_4$, each of which is an application position of the needle dispenser. Specifically, as illustrated in FIG. 10A, in each of the adjacent groove spaces partitioned by the first bank 14a having the defect portion 3, application points $P_1$, $P_2$, $P_3$, $P_4$ are set along each of (i) a dam forming line extending in the X direction through point $A_1$ and (ii) a dam forming line extending in the X direction through point $A_2$. Points $A_1$ and $A_2$ are points located at a distance corresponding to the tolerance value a in the Y direction from the respective end portions of the defect portion 3.

Here the tolerance value a is to be set appropriately so that the entire defect portion 3 is between point $A_1$ and point $A_2$. However, setting an overly great value to the tolerance value a is not preferable.

FIG. 10B is a schematic cross-sectional view illustrating a cross-section of the ground substrate 11 taken along the dam forming line passing through point $A_1$.

FIG. 11A through FIG. 11G are diagrams illustrating how a first dam 51 is formed by applying the repair material with respect to the application points $P_1$, $P_2$, and so on one after another.

The repair device 200 forms a first dam 51 by applying the repair material with respect to the application points $P_1$, $P_2$, $P_3$, $P_4$, which have been set as described above, one after another by using a needle 213a. The needle dispenser 213 has a tank 213b attached at a tip portion thereof. The tank 213b stores the repair material. The needle dispenser 213 is capable of applying the repair material in microliter units by moving the needle 213a up and down through the tank 213b to cause the repair material to adhere to the needle 213a.

First, as illustrated in FIG. 11A and FIG. 11B, with the needle 213a and the tank 213b positioned at application point $P_1$, the needle 213a is moved downward so that the repair material adheres to the needle 213a. Then, the needle 213a is moved toward application point $P_1$ to apply the repair material with respect to application point $P_1$.

The repair material has fluidity until application. However, after application, the repair material maintains a mound shape. Thus, as illustrated in FIG. 11C, a mound of the repair material is formed at application point $P_1$.

Subsequently, as illustrated in FIG. 11D, the needle 213a is withdrawn upwards into the tank 213b, and the needle 213a and the tank 213b are moved to application point $P_2$. Subsequently, as illustrated in FIG. 11E, the needle 213a is moved downward so that the repair material adheres to the needle 213a, and then the needle 213a is moved toward application point $P_2$ to apply the repair material with respect to application point $P_2$.

Then, the mound of the repair material that is formed at application point $P_2$ connects to the mound of the repair material having been formed at application point $P_1$, as illustrated in FIG. 11F.

Then, as illustrated in FIG. 11G, the needle 213a is withdrawn upwards and moved to application point $P_3$. Then, in a similar manner as described above, a mound of the repair material is formed at application point $P_3$, which connects to the mound of the repair material having been formed at application point $P_2$.

As such, mounds of the repair material are formed continuously on a line extending from point $A_1$ on the first bank 14a having the defect portion 3 to an adjacent first bank 14a. Then, the mounds of the repair material so applied are dried and exposed to light as needed, thereby forming a first dam 51.

Note that the subsequent simultaneous firing process causes the repair material so applied to harden. Thus, the first dam 51 is provided with even higher physical stability.

By executing the process described above for two first dams 51, a dam portion 50 is formed.

Through the above-described dam portion forming process, a pair of first dams 51 is formed in each of concave spaces 20 partitioned from one another by a first bank 14 having a defect portion 3, as illustrated in FIG. 6B. The first dams 51 in each concave space 20 partition the concave space 20 into a first space SA in the vicinity of the defect portion 3, and two second spaces SB outside the vicinity of the defect portion 3. Further, the defect portion 3 is surrounded by two first spaces SA.

When the subsequent light-emitting layer forming process of Step S9 (refer to FIG. 4) is performed after repairing any defect portion 3 in such a manner, ink is applied with respect to the first space SA and the second spaces SB while ink mixture is confined within a specific region as described in detail later, and organic light-emitting layers 15 are formed.

Note that the repair material may be any resin composition that hardens when exposed to light, heat, or the like.

The resin may be, for example, a curable resin containing an ethylene double bond, such as a (meth)acryloyl group, an aryl group, a vinyl group, or a vinyloxy group.

Also, a cross-linking agent, such as an epoxy compound or a polyisocyanate compound, that forms a cross-link with the resin may also be contained in the repair material as an additive.

The resin in the repair material may be a fluoride polymer, in which fluoride atoms are included in the resin structure. Using resin including fluoride atoms as the repair material provides ink repellency to dam portions 50 formed by using the repair material. Alternatively, various ink repelling agents may be added to the resin. In any case, the content of the ink repelling agent should be between 0.01 wt % and 10 wt %. Adding an ink repelling agent by an amount within this range ensures that the resin compound is stable during storage, and also provides dam portions 50 formed by using the repair material with high ink repellency.

Also, the same material as the bank material used for forming the first banks 14a may be used as the repair material. Here, it should be noted that bank material typically includes an acid component that is soluble to an alkaline developing fluid. However, it is preferable that the repair material for forming the dams does not include such an acid component. This is because developing is not performed in the forming of dam portions 50, and accordingly, acid component remaining in the dam portions 50 would provide the dam portions 50 with low resistance to solvents.

Further, the resin composition in the repair material may contain a solvent and a photopolymerization initiator as additives, when necessary.

The solvent is a solvent dissolving the resin, and one or more types of solvents having a boiling point approximately within the range between 150° C. and 250° C. may be used.

The photopolymerzation initiator may be any type of photopolymerization initiator available on the market.

Further, upon the application of the repair material, the repair material is adjusted so that the content of solid components in the repair material is between, for example, 20 wt % and 90 wt %, and the repair material has a viscosity between, for example, 10 cP and 50 cP (where cP is the unit centipoise).

Further, the amount of the photopolymerization initiator added is adjusted in accordance with the amount of light exposure in the light exposure process performed before the firing process. For example, the amount of the photopolymerzation initiator added is to be adjusted such that the content of the photopolymerzation initiator with respect to the total solid component of the repair material is between 0.1 wt % and 50 wt %, and more preferably, between 5 wt % and 30 wt %.

As such, a first dam 51a in any concave space 20 is formed by using the needle dispenser 213 and applying the repair material with respect to a plurality of predetermined positions along a line (dam forming line) on which the first bank 51 is to be formed.

(Second Implementation)

FIG. 12A is a schematic plan view illustrating a defect portion 3, a candidate first space TSA, and dam portions 50 in a display panel pertaining to a second implementation of the embodiment. FIG. 12B is a schematic cross-sectional view illustrating how a second dam 52 is formed in the second implementation. In the second implementation, each dam portion 50 is composed of a pair of second dams 52.

The second dams 52 are dams formed by using a nozzle dispenser. In the present disclosure, the method of forming dams by using a nozzle dispenser is referred to as a second forming method. Further, in the present disclosure, the plan-view width of the second dams 52 is referred to as a second width. The second width is greater than the first width, and specifically, the second width is between 10 μm and 50 μm, for example.

The defect portion 3 in the second implementation (a foreign particle in this example) has a greater size than that in the first implementation, as illustrated in FIG. 12A. The second implementation is similar to the first implementation in that coordinates positions Ya and Yb respectively indicating the first and second end portions of the defect portion 3 in the Y direction (first direction) are acquired. Further, values Ta and Tb are calculated by adding a tolerance value a to the respective coordinate values Ya and Yb. The values Ta and Tb so calculated are set as candidate forming positions for a dam portion 50. Specifically, the dam portion 50 in the second implementation is composed of a pair of dams. Accordingly, the values Ta and Tb indicate the respective candidate forming positions of the two dams.

Further, a plan-view surface area I of an overlap region OL is calculated. The overlap region OL is a region of a candidate first space TSA that overlaps with a sub-pixel region SP in plan view. The candidate first space TSA is a region surrounded by adjacent first banks 14a and dams, if formed at the candidate forming positions. As described above, in the first implementation, the entire candidate first space TSA is located within one sub-pixel region. In other words, the candidate first space TSA does not overlap with any second bank 24a in the first implementation. As such, in the first implementation, the candidate first space TSA equals the overlap region OL, and thus the surface area I equals the surface area of the candidate first space TSA.

Here, if dams were formed at the candidate forming positions Ta and Tb, the candidate first space TSA would become a color mixture region. However, in the second implementation, the proportion of the surface area I (equals the surface area of the candidate first space TSA) of the overlap region OL, which would become a color mixture region, to the surface area H of a sub-pixel region is equal to or greater than the predetermined proportion α. Accordingly, $\alpha \times H \leq I$ holds true in the second implementation. Thus, in the second implementation, the entire sub-pixel would be perceived as a dark spot even if dams were formed at the candidate forming positions Ta and Tb by using a needle dispenser. This means that the outcome would be the same even if the entire sub-pixel region were allowed to become a color mixture region. Accordingly, in the second implementation, two dams are respectively formed on two second banks 24a which are adjacent in the Y direction and between which the defect portion 3 is located. Note that the second banks 24a are formed by using an electrically-insulating material, and thus the areas above the second banks 24a become non-light-emitting areas. Further, the second banks 24 have a considerable width (e.g., 25 μm to 30 μm). Due to this, the dams on the second banks 24 need not be formed so accurately at their forming positions, need not have so accurate a shape, and may have a certain level of width. This means that in the second implementation, dams need not be formed by employing a method that enables precise control, such as the method using a needle dispenser, and instead, dams may be formed by using a nozzle dispenser, for example. With a nozzle dispenser, dams can be formed at a higher speed than with a needle dispenser, and thus the use of a nozzle dispenser reduces the amount of time required for the forming of dams.

Note that the second implementation is similar to the first implementation in that the pair of dams that define the candidate first space both extend along the X direction. Due to this, also in the second implementation, the proportion of the surface area I of the candidate first space TSA to the surface area H of the sub-pixel region SP may be calculated by calculating a ratio of the distance J to the length L, where the distance J is the Y-direction distance between the two dams, and the length L is the Y-direction length of the sub-pixel region SP.

[Effect of Dam Portions of Preventing Color Mixture]

The following describes how ink color mixture can be prevented by repairing a detect portion 3 by forming dam portions 50.

FIG. 13A is a plan view illustrating a state where, in a display panel pertaining to the first implementation, dam portions 50 have been formed around a first bank 14 having a defect portion 3, and an ink layer 15a (R) has been formed in one of adjacent concave spaces 20 between which the first bank 14 having the defect portion 3 is located through the application of red ink and an ink layer 15a (G) has been formed in the other one of the adjacent concave spaces 20 through the application of green ink. FIG. 13B is a plan view illustrating a state where, in a display panel pertaining to the second implementation, dam portions 50 have been formed around a first bank 14 having a defect portion 3, and an ink layer 15a (R) has been formed in one of adjacent concave spaces 20 between which the first bank 14 having the defect portion 3 is located through the application of red ink and an ink layer 15a (G) has been formed in the other one of the adjacent concave spaces 20 through the application of green ink. Meanwhile, FIG. 13C is a plan view illustrating a state where, in a comparative example in which dam portions 50 are not formed, an ink layer 15a (R) and an ink layer 15a (G) have been formed in adjacent concave spaces 20 between which a first bank 14 having a defect portion 3 is located.

As illustrated in FIG. 13C, without the dam portions 50 formed around the first bank 14 having the defect portion 3, the red ink and the green ink mix via the defect portion 3 and produce, in each of the two ink layers 15a, a color mixture region that extends in the Y direction. This color mixture region extends far along the Y direction, and the length thereof may extend to around 1 cm.

Once the manufacturing of the display panel 100 is completed, these color mixture regions emit light having a color different from the originally intended color. Specifically, as already described above, a color mixture region formed by mixing of red ink and green ink emits red light. Accordingly, when such a color mixture region is formed in a region intended to emit green light, the color mixture region emits red light, and causes light-emission color failure. Further, red light has a longer wavelength than green light, and thus the color mixture region is typically perceived as being dark. Accordingly, the color mixture region is perceived by the human eye as a dark spot and brings about image quality degradation.

In view of this, in the first implementation, dam portions 50 each composed of a pair of first dams 51 are disposed around a first bank 14 having a defect portion 3. Each dam portion 50 partitions a concave space 20 into a first space SA that is the space between the two first dams 51 and that is in the vicinity of the defect portion 3, and two second spaces SB that are located outside the two first dams 51 and that are not in the vicinity of the defect portion 3.

Similarly, in the second implementation, dam portions 50 each composed of a pair of second dams 52 are disposed around a first bank 14 having a defect portion 3. Each dam portion 50 partitions a concave space 20 into a first space SA that is the space between the two second dams 52 and that is in the vicinity of the defect portion 3, and two second spaces SB that are located outside the two second dams 52 and that are not in the vicinity of the defect portion 3. Due to this, the color mixture region is confined within a specific area, as described in the following.

FIG. 14A is a cross-sectional view taken along line C-C in FIG. 13A, and shows a Y-direction cross-section illustrating a state where an ink layer 15a (G) has been formed by applying ink with respect to a concave space 20 in which a dam portion 50 has been formed. FIG. 14B is a cross-sectional view taken along line E-E of FIG. 13B, and shows a Y-direction cross-section illustrating a state where ink for forming an ink layer 15a (G) has been applied with respect to a concave space 20 in which a dam portion 50 has been formed.

Specifically, when ink for forming light-emitting layers is applied with respect to the concave spaces 20 between first banks 14, an ink layer 15a (G) is formed in the first space SA between the dams composing the dam portion 50 (i.e., a pair of first dams 51 or a pair of second dams 52) and in each of the two second spaces SB outside the dams composing the dam portion 50, as illustrated in each of FIG. 14A and FIG. 14B.

Here, there are cases where the first space SA becomes a color mixture region due to red ink and green ink mixing via the defect portion 3, which is the case with the first implementation illustrated in FIG. 14A. However, the ink layer 15a formed in the first space SA and the ink layers 15a formed in the second spaces SB, which are outside the pair of first dams 51, do not mix with one another due to the first dams 51 serving as partitions therebetween.

Accordingly, even if a color mixture region is formed in the first space SA, the color mixture region does not spread beyond the first dams 51 into the second spaces SB.

This similarly applies to the second implementation illustrated in FIG. 14B.

Further, an organic light-emitting layer 15 is formed by drying (and thermal firing, when necessary) the ink layers 15a illustrated in each of FIG. 13A and FIG. 13B. In the organic light-emitting layer 15 formed in such a manner, the ink layer 15a in the first space SA (i.e., a layer including a mixture of inks of different colors) becomes a first light-emitting layer 15A that emits light with a color being a mixture of two different intended colors. Meanwhile, the ink layers 15a in the second spaces SB become second light-emitting layers 15B that emit light with a normal color.

As such, the first and second implementations achieve the effect of confining the color mixture region produced due to the defect portion 3 within the first space SA, which is a relatively small space in the vicinity of the defect portion 3. Thus, the first and second implementations achieve the effect of preventing the spread of the color mixture region, and thus prevent display failure and image quality degradation in the display panel 100 that would be otherwise brought about by light-emission color failure.

In particular, in a display panel with concave spaces 20 partitioned from one another by linear first banks 14, such as the display panels pertaining to the first and second implementations, display failure and image quality degradation brought about by light-emission color failure tend to stand out. This is due to any color mixture region produced by mixing of inks of different colors readily spreading when ink is applied with respect to concave spaces 20 partitioned from one another by linear first banks 14. Accordingly, the bank repair method pertaining to the embodiment, which involves the forming of the dam portion 50 pertaining to the embodiment, is particularly advantageous when applied to an organic EL display panel having a line bank structure.

(Third Implementation)

FIG. 15A is a schematic plan view illustrating a defect portion 3 and a candidate first space TSA in a third implementation of the embodiment. FIG. 15B is a schematic plan view illustrating a state where dam portions 50 have been formed in a display panel pertaining to the third implementation.

The third implementation is similar to the first implementation in that the defect portion 3 has a relatively small size. The third implementation is also similar to the first implementation in that the proportion of the surface area I of the overlap region OL to the surface area H of a sub-pixel region SP is lower than the predetermined proportion α. As already described above, the overlap region OL is a region of the candidate first space TSA that overlaps with the sub-pixel region SP in plan view. Accordingly, I<α×H holds true in the third implementation. As such, two first dams 51 may be formed at the candidate forming positions Ta and Tb by using a needle dispenser, as the dam portion 50. This is similar to the first implementation. Meanwhile, it should be noted that in the third implementation, one Y-direction end of the candidate first space TSA overlaps with a second bank 42a in plan view. Specifically, the candidate forming position Tb is located on a second bank 24a, as illustrated in FIG. 15A. As such, the dam to be formed at the candidate forming position Tb does not need to be formed according to the time-consuming first forming method, and instead, may be formed according to the time-saving second forming method, in which a nozzle dispenser is used.

As such, in the third implementation, when one Y-direction end of the candidate first space TSA overlaps a second bank 24a in plan view as illustrated in FIG. 15B, one of the two dams to be formed that does not overlap a second bank 24a is formed by using a needle dispenser, whereas the other one of the two dams that overlaps a second bank 24a is formed by using a nozzle dispenser. Thus, the amount of time required for the forming of dams is reduced compared to when forming both dams by using a needle dispenser.

In the bank repair method pertaining to the third implementation, dam portions 50 each composed of a set of one first dam 51 and one second dam 52 are disposed around a first bank 14 having a defect portion 3. Each dam portion 50 partitions a concave space 20 into a first space SA that is in the vicinity of the defect portion 3 and a second space SB that is not in the vicinity of the defect portion 3. Accordingly, similar to the first and second implementations, even if a color mixture region is formed in the first space SA, the color mixture region is confined within the first space SA and does not spread into the second space SB. Thus, the third implementation also prevents display failure and image quality degradation.

In the third implementation, the proportion of the surface area of the overlap region OL to the surface area H of the sub-pixel region SP may be calculated by calculating a ratio of a distance d to a length L. Here, the distance d is the distance between one of the candidate forming positions that does not overlap with a second bank 24a (i.e., the candidate forming position Ta) and an end portion of the second bank 24a with which the candidate first space TSA overlaps that is in the direction of the candidate forming position that does not overlap with a second bank 24a, and the length L is the Y-direction length of the sub-pixel region SP.

Meanwhile, when α×H≤I holds true and one of the two Y-direction ends of the candidate first space TSA overlaps with a second bank 24a, which is the case in the third implementation, two second dams 52 are respectively formed on two second banks 24a which are adjacent in the Y direction and between which the defect portion 3 is located, similar to the second implementation.

(Fourth Implementation)

FIG. 16A is a schematic plan view illustrating a defect portion 3 and a candidate first space TSA in a fourth implementation of the embodiment. FIG. 16B is a schematic plan view illustrating a state where dam portions 50 have been formed in a display panel pertaining to the fourth implementation. In the fourth implementation, the candidate first space TSA overlaps with a second bank 24a in plan view, and in addition, spans across two sub-pixel regions between which the second bank 24a with which the candidate first space TSA overlaps is located in the Y direction.

The fourth implementation is similar to the second implementation in that the defect portion 3 has a relatively great size. Further, the fourth implementation is also similar to the second implementation in that the proportion of the surface area of the candidate first space TSA to the area H of a sub-pixel region is equal to or greater than the predetermined proportion α. Based on this, it may appear as though it suffices to form two second dams 52 respectively on two second banks 24a between which the defect portion 3 is located in the Y direction, similar to the second implementation.

However, in the fourth implementation, while the candidate first space TSA overlaps with a second bank 24a in plan view, neither Y-direction end portion of the candidate first space TSA overlaps with this second bank 24a. This means that the candidate first space TSA spans across two sub-pixel regions that are adjacent to one another in the Y direction, crossing over a second bank 24a. With such a candidate first space TSA, even if the surface area of the candidate first space TSA is equal to or greater than α×H, it does not necessarily mean that the candidate first space TSA is equal to or greater than α×H in each of the two sub-pixel areas that the candidate first space TSA spans across. That is, when denoting a region of the candidate first space TSA that overlaps with one of the two sub-pixel areas as overlap region OLa and a region of the candidate first space TSA that overlaps with the other one of the two sub-pixel areas as overlap region OLb, and further denoting the surface area of the overlap region OLa as Ia and denoting the surface area of the overlap region OLb as Ib, α×H≤Ia and α×H≤Ib are not necessarily fulfilled. Specifically, in, the fourth implementation, Ib<α×H and α×H≤Ia are fulfilled.

Accordingly, in the bank repair method pertaining to the fourth implementation, a first bank 51 is formed at the candidate forming position Tb in the sub-pixel region in which the candidate forming position Tb is set (i.e., the sub-pixel region in which the overlap region OLb is located), in order to limit the size of the color mixture region in the sub-pixel region to as small a size as possible. Meanwhile, in the bank repair method pertaining to the fourth implementation, a second dam 52 is formed in the sub-pixel region in which the candidate forming position Ta is set (i.e., the sub-pixel region in which the overlap region OLa is located), on one of the two second banks 24a defining the sub-pixel region that does not overlap with the candidate first space TSA, since it is permissible to allow the entirety of this sub-pixel region to become a color mixture region.

In the above-described case where the candidate first space TSA spans across two sub-pixel regions, allowing both sub-pixel regions to become color mixture regions in their entirety results in both sub-pixel regions becoming dark spots. Meanwhile, the bank repair method pertaining to the fourth implementation limits the surface area of the color mixture region formed in the sub-pixel region in which the candidate forming portion Tb is set to as small a surface area as possible, and thus prevents this sub-pixel region from becoming a dark spot. Thus, the bank repair method pertaining to the fourth implementation effectively prevents image quality degradation. In addition, compared to when both dams are formed by using a needle dispenser in the above-described case, the bank repair method pertaining to the fourth implementation reduces the amount of time required for forming dams.

In the fourth implementation, the proportion of the surface area Ia of the overlap region OLa to the surface area H of the sub-pixel region may be calculated by using a distance du. The distance da is the distance between the candidate forming position Ta and an end portion Ga of the second bank 24a with which the candidate first space TSA overlaps, which is one of the two end portions of this second bank 24a at a side of the candidate forming position Ta. Similarly, the proportion of the surface area Ib of the overlap region OLb to the surface area H of the sub-pixel region may be calculated by using a distance db. The distance db is the distance between the candidate forming position Tb and an end portion Gb of the second bank 24a with which the candidate first space TSA overlaps, which is one of the two end portions of this second bank 24a at a side of the candidate forming position Tb.

Note that when Ia<α×H and Ib<α×H are fulfilled in the above-described case where the candidate first space TSA spans across two sub-pixel regions, first dams 51 are formed at the candidate forming positions Ta and Tb.

Meanwhile, when α×H≤Ia and α×H≤Ib are fulfilled in the above-described case where the candidate first space TSA spans across two sub-pixel regions, two second dams 52 are respectively formed on two second banks 24a between which the second bank 24a overlapping with the candidate first space TSA in plan view is located in the Y direction. In this case, both the two sub-pixels that the candidate first space TSA spans across become color mixture regions, and thus become dark spots.

[Bank Repair Method]

The following describes the bank forming methods described in the first through fourth implementations, based on the specific contents of the processing executed by the repair device 200 and with reference to FIG. 17 and FIG. 18.

FIG. 17 is a flowchart illustrating one example of the contents of dam portion setting processing executed by the repair device 200. In the dam portion setting processing, the repair device 200 detects a defect portion 3, and specifies configurations to be applied in forming dam portions 50 (i.e., positions where the dam portions 50 are to be formed, and the method(s) to be used for forming the dam portions 50). This processing is actually executed by the CPU 231 of the controller 230, and the configurations specified are set and stored to a storage unit 232 of the repair device 200. The configurations specified through the dam portion setting processing illustrated in FIG. 17 are used in the subsequent dam portion forming processing, in which dam portions 50 are formed according to the flowchart illustrated in FIG. 18.

(Dam Portion Setting Processing)

First, description is provided of the contents of the dam portion setting processing illustrated in FIG. 17. First, image data of a top surface of the ground substrate 11 (an image including the first banks 14a and the second banks 24a) is acquired by using the image capture element 211, and the image data is stored in the storage unit 232 of the controller 230 (Step S20).

Subsequently, initial value "1" is set to value B (Step S21), and then, it is examined whether or not the $B^{th}$ first bank 14a (the $B^{th}$ first bank 14a immediately following the setting of B=1 is the $1^{st}$ first bank 14a) has a defect portion 3 (Step S22). Note that in the flowchart in FIG. 17, B indicates identification numbers provided to the first banks 14a formed over the ground substrate 11.

In this process of detecting defect portions, the CPU 231 compares portions of the first banks 14a in the image data one after another, and detects differences between the first banks 14a as defect portions 3.

Further, in this process of detecting defect portions, there is a possibility of defect portions 3 being detected in several of the first banks 14a formed over the ground substrate 11, and also there is a possibility of no defect portion 3 being detected in any of the first banks 14a. When a defect portion 3 is found, the defect portion 3 is repaired through the forming of dam portions.

When it is detected that the $B^{th}$ first bank 14a has a defect portion 3 (YES in Step S23), a determination is made of whether α×H≤I is fulfilled (Step S24).

When α×H≤I is not fulfilled, or in other words, when I<α×H is fulfilled (NO in Step S24), a determination is made of whether the candidate forming position Ta is located on a second bank 24a (i.e., whether the candidate forming position Ta overlaps with a second bank 24a in plan view) (Step S25).

When the candidate forming position Ta is not located on any second bank 24a (NO in Step S25), the candidate forming position Ta is set as an actual forming position Fa1 (Step S26).

In the following, actual forming positions of a pair of dams to be formed are denoted such that: actual forming position Fa denotes where one of the dams relatively upstream in the Y direction is to be actually formed, and actual forming position Fb denotes where the other one of the dams, which is located relatively downstream in the Y direction, is to be actually formed. Further, an actual forming position where a first dam 51 is to be formed according to the first forming method (the method utilizing the needle dispenser) is denoted by addition of the Arabic numeral "1" (i.e., actual forming position Fa1, actual forming position Fb1), and an actual forming position where a second dam 52 is to be formed according to the second forming method (the method utilizing the nozzle dispenser) is denoted by addition of the Arabic numeral "2" (i.e., actual forming position Fa2, actual forming position Fb2).

When the candidate forming position Ta is located on a second bank 24a (YES in Step S25), the candidate forming position Ta is set as an actual forming position Fa2 (Step S27).

Subsequently, a determination is made of whether the candidate forming position Tb is located on a second bank 24a (Step S28).

When the candidate forming position Tb is not located on any second bank 24a (NO in Step S28), the candidate forming position Tb is set as an actual forming position Fb1 (Step S29).

When the candidate forming position Tb is located on a second bank 24a (YES in Step S28), the candidate forming position Tb is set as an actual forming position Fb2 (Step S30).

Following this, a determination is made of whether the current value of B is the final value (Step S31).

When the current value of B is the final value (YES in Step S31), processing is terminated.

When the current value of B is not the final value (NO in Step S31), B is incremented by one (Step S32), and returning to Step S22, it is examined whether or not the first bank 14a identified by the incremented value has a defect portion 3.

When $\alpha \times H \leq I$ is fulfilled in Step S24, or in other words, when $I \geq \alpha \times H$ is fulfilled in Step S24 (YES in Step S24), a determination is made of whether the candidate first space TSA overlaps with a second bank 24a in plan view (i.e., a determination is made of whether the candidate first space TSA has a region overlapping with a second bank 24a in plan view) (Step S33).

When the candidate first space TSA does not overlap with any second bank 24a (NO in Step S33), the candidate forming positions Ta and Tb are cancelled, and actual forming positions Fa2 and Fb2 are set on two second banks 24a which are adjacent in the Y direction and between which the candidate forming position TSA is located (Step S34). Then, processing proceeds to Step S31.

When the candidate first space TSA overlaps with a second bank 24a in Step S33 (YES in Step S33), a determination is made of whether the candidate forming position Ta is located on the second bank 24a (Step S35).

When the candidate forming position Ta is located on the second bank 24a (YES in Step S35), the candidate forming position Ta is set as an actual forming position Fa2, the candidate forming position Tb is cancelled, and an actual forming position Fb2 is set on an adjacent second bank 24a (Step S36). Then, processing proceeds to Step S31.

When the candidate forming position Ta is not located on the second bank 24a (NO in Step S35), a determination is made of whether the candidate forming position Tb is located on the second bank 24a (Step S37).

When the candidate forming position Tb is located on the second bank 24a (YES in Step S37), the candidate forming position Tb is set as an actual forming position Fb2, the candidate forming position Ta is cancelled, and an actual forming position Fa2 is set on an adjacent second bank 24a (Step S36). Then, processing proceeds to Step S31.

When the candidate forming position Tb is not located on any second bank 24a (NO in Step S37), the candidate first space TSA in plan view overlaps with two sub-pixel regions SP that are adjacent in the Y direction, crossing over a second bank 24a. Accordingly, a determination is subsequently made of whether $\alpha \times H \leq Ia$ is fulfilled (Step S39). As described above, Ia denotes the surface area of the overlap region OLa, which is a region of the candidate first space TSA that overlaps with one of the two sub-pixel regions SP that is located upstream in the Y direction.

When $\alpha \times H \leq Ia$ is not fulfilled (NO in Step S39), the candidate forming position Ta is set as an actual forming position Fa1 (Step S40).

When $\alpha \times H \leq Ia$ is fulfilled (YES in Step S39), the candidate forming position Ta is cancelled, and an actual forming position Fa2 is set on a second bank 24a that is adjacent to and located upstream in the Y direction than the second bank 24a with which the candidate first space TSA overlaps (Step S41).

Subsequently, a determination is made of whether $\alpha \times H \leq Ib$ is fulfilled (Step S42). As described above, Ib denotes the surface area of the overlap region OLb, which is a region of the candidate first space TSA that overlaps with one of the two sub-pixel regions SP that is located downstream in the Y direction.

When $\alpha \times H \leq Ib$ is not fulfilled (NO in Step S42), the candidate forming position Tb is set as an actual forming position Fb1 (Step S43), and processing proceeds to Step S31.

When $\alpha \times H \leq Ib$ is fulfilled (YES in Step S42), the candidate forming position Tb is cancelled, and an actual forming position Fb2 is set on a second bank 24a that is adjacent to and located downstream in the Y direction than the second bank 24a with which the candidate first space TSA overlaps (Step S44). Subsequently, processing proceeds to Step S31.

Following this, processing proceeds in the order of Step S31, Step S32, and Step S22, and the processing between Step S23 and Step S44 is repeated until it is determined in Step S31 that the current value of B is the final value (YES in Step S31).

(Dam Portion Forming Processing)

Through the dam portion setting processing, the positions where dam portions 50 are to be formed and the method(s) to be used for forming the dam portions 50 are specified. The following describes the dam portion forming processing, in which dam portions 50 are actually formed based on the configurations specified through the dam portion setting processing.

FIG. 18 is a flowchart illustrating one example of the contents of the dam portion forming processing.

First, actual forming positions Fa1 and Fb1 having been set in the dam portion setting processing are put into group F1, actual forming positions Fa2 and Fb2 having been set in the dam portion setting processing are put into group F2, and the actual forming positions in each group are numbered sequentially (Step S50).

Then, initial value "1" is set to value n (Step S51).

Subsequently, a first dam 51 is formed at the $n^{th}$ actual forming position in group F1 (the $n^{th}$ actual forming position immediately following the setting of n=1 is the $1^{st}$ first dam 51) (Step S52).

Following this, a determination is made of whether the current value of n is the final value in group F1 (Step S53).

When the current value of n is not the final value in group F1 (NO in Step S53), n is incremented by one (Step S54), and processing returns to Step S52.

When the current value of n is the final value in group F1 (YES in Step S53), all dams scheduled to be formed according to the first forming method have actually been formed. Accordingly, initial value "1" is subsequently set to value n once again (Step S55).

Subsequently, a second dam 52 is formed at the $n^{th}$ actual forming position in group F2 (the $n^{th}$ actual forming position immediately following the setting of n=1 is the second dam 52) (Step S56).

Following this, a determination is made of whether the current value of n is the final value in group F2 (Step S57).

When the current value of n is not the final value in group F2 (NO in Step S57), n is incremented by one (Step S58), and processing returns to Step S56.

When the current value of n is the final value in group F2 (YES in Step S57), all dams scheduled to be formed according to the second forming method have actually been formed. In this case, the dam portion forming processing is terminated.

As such, even if a color mixture region is formed due to the presence of a defect portion 3 when ink application is performed, the bank repair method pertaining to the embodiment confines the color mixture region within a first space SA with a dam portion 50. As such, the bank repair method pertaining to the embodiment prevents display failure and image quality degradation.

Meanwhile, another possible measure for preventing the mixture of inks of different colors due to the presence of a defect portion 3 is repairing the defect portion 3 by covering the defect portion 3 itself with a repair material similar to that described above. However, in order to reliably prevent the mixture of inks of different colors by using such a measure, it is necessary for instance, to cover the entire foreign particle making up the defect portion 3 with the repair material or to repair the collapsed portion making up the defect portion 3 with the repair material. In particular, repairing the defect portion 3 in such a manner by using a dispenser or the like requires performing application while precisely controlling the position of the application needle of the dispenser. Also, when the defect portion 3 is a foreign particle, there are many cases where the defect portion 3 cannot be repaired properly due to the foreign particle repelling the repair material, and thus the application of the repair material is technically difficult. In contrast, with a repair method such as that described in the embodiment, in which dam portions 50 are formed around a first bank 14 having a defect portion 3, the repair material is not directly applied onto the defect portion 3 but is rather applied so as to surround the defect portion 3. Thus, with such a repair method, the repair material can be applied relatively easily without the risk of the repair material being repelled by the foreign particle.

(Height and Width of Dam Portions 50)

The following is a consideration regarding the height of dam portions 50 (i.e., the height of dam portions 50 from bottom surfaces of concave spaces 20).

In the process in Step S9 of forming the organic light-emitting layers 15, ink is applied with respect to a first space SA and second spaces SB. The first space SA is partitioned from the second spaces SB by a dam portion 50. Thus, an ink layer 15a is formed, in the first space SA and in each of the second spaces SB.

As illustrated in FIG. 13A and FIG. 13B, the ink layer 15a in the first space SA is partitioned from the ink layers 15a in the second spaces SB by a dam portion 50.

Here, when the height of the dam portion 50 is overly low, the function of the dam portion 50 of partitioning such ink layers 15a is impaired. That is, if the dam portion 50 were to have overly low height, the ink layer 15a in the first space SA would mix with the ink layers 15a in the second spaces SB, and the color mixture region would spread to the second spaces SB. For instance, in the example illustrated in FIG. 14A and FIG. 14B, if the dam portion 50 were to have overly low height, the green ink layer 15a in the first space SA, having red ink mixed therein, would mix with the green ink layers 15a (G) in the second spaces SB, and the color mixture region containing a mixture of red ink and green ink would spread to the second spaces SB.

Accordingly, the height of the dam portion 50 is preferably set to a height sufficient for the dam portion 50 to achieve the function of partitioning the ink layer 15a in the first space SA from the ink layers 15a in the second spaces SB.

Meanwhile, if the dam portion 50 were to have overly high height, the risk would increase of tier cutting occurring in layers to be formed above the dam portion 50, e.g., the electron transport layer 16 and the common electrode 17.

Based on this consideration, it is preferable to set the height of the dam portions 50 to be no less than 50% and no more than 200% of the height of the first banks 14. It is more preferable to set the height of the dam portions 50 to be similar to the height of the first banks 14.

Meanwhile, it is preferable that the width of the dams composing a dam portion 50, or more specifically, the width of the dams composing a dam portion 50 in a direction perpendicular to the dam forming lines (the Y direction), be set to be no more than 50 μm. This is since dams with excessively great width pose a risk of the dams themselves being noticeable when the display panel 100 is viewed.

(Insufficient Covering with Ink)

A dam portion 50 pertaining to the embodiment partitions a concave space 20 into a first space SA and second spaces SB. Accordingly, when causing ink droplets to be ejected according to the inkjet method in the process of forming the organic light-emitting layers 15, it is significant that the ink droplets ejected arrive in both the first space SA and the second spaces SB and cover both the first space SA and the second spaces SB. For example, if no ink droplets arrive in the first space SA and thus the first space SA is not covered with ink, an organic light-emitting layer 15 is not formed in the first space SA. When an organic light-emitting layer 15 is not formed, the part becomes a non-light-emitting area and causes display failure. In addition, the part that is not covered with ink would have electrical resistance differing from that of surrounding parts, and is not desirable for the risk of bringing about problems such as current leakage.

First Modification

In the first through fourth implementations pertaining to the embodiment, the first dams 51 and the second dams 52 both extend along the X direction. However, dams need not extend along the X direction.

FIG. 19A is a schematic plan view illustrating a state where dam portions 50b pertaining to the first modification have been formed. The dam portions 50b pertaining to the first modification are each composed of a pair of first dams 51b. The two first dams 51b composing a pair are parallel, and intersect with the X direction at a certain angle.

When the defect portion to be repaired is an elongated foreign particle adhering onto a first bank 14a oblique to the Y direction, the angle of the first dams 51b composing a dam portion 50b pertaining to the first modification can be adjusted in accordance with the angle of the defect portion. Thus, the dam portions 50b pertaining to the first modification allow effectively confining the color mixture region within the first space.

The modification of disposing dams to intersect with the X direction at a certain angle may be similarly applied to the second dams 52. However, when making this modification, it is preferable that the angle be set so that the modified second dams do not extend out from above the second banks 24 by much.

Second Modification

FIG. 19B is a schematic plan view illustrating a state where dam portions 50c pertaining to the second modification have been formed. The dam portions 50c pertaining to the second modification are each composed of a pair of first dams 51c. The two first dams 51c composing a pair each intersect with the X direction at a certain angle, and approach one another as the X-direction distance from the defect portion 3 increases.

When ink flows from one concave space 20 into an adjacent concave space 20 over a defect portion, it can be assumed that the flow intensity is greatest near the defect portion. In view of this, the dam portions 50c pertaining to the second modification are provided. Specifically, the Y-direction distance between the two first dams 51*c* composing a dam portion 50*c* is relatively great near the defect portion 3 so as to prevent the outflow of ink over the first dams 51*c*. Meanwhile, the Y-direction distance between the two first dams 51*c* is relatively small at greater distance from the defect portion 3 to keep the plan-view surface area of the first space SA, which becomes the color mixture region, as small as possible.

This modification of disposing dams approach one another with increasing X-direction distance from the first bank 14 having the defect portion 3 increases may also be similarly applied to the second dams 52. However, when making this modification, it is preferable that the angle be set so that the modified second dams do not extend out from above the second banks 24 by much.

Third Modification

FIG. 20A is a schematic perspective view illustrating the shape of dam portions 50*d* pertaining to the third modification, and FIG. 20B is a schematic plan view illustrating a state where ink layers have been formed after the dam portions 50*d* have been formed in concave spaces 20.

Each dam portion 50*d* pertaining to the present modification has the shape illustrated in FIG. 20B. Specifically, in plan view of the X-Y plane, each dam portion 50*d* extends between two points (point $A_1$ and point $A_2$) between which the defect portion 3 is located in the Y direction, while detouring around the defect portion 3. Also, each dam portion 50*d* comes in contact with a first bank 14 adjacent to the first bank 14*a* having the defect portion 3 at point $A_3$ located at some point along the path between point $A_1$ and point $A_2$.

The dam portions 50*d* can be formed by using a method similar to the method described in the embodiment with reference to FIG. 11A through FIG. 11G. Specifically, each dam portion 50*d* can be formed by using a needle dispenser and applying the repair material with respect to a plurality of application points set along a dam forming line that extends between point $A_1$ and point $A_2$ via point $A_3$, one after another.

By disposing the dam portions 50*d* in adjacent concave spaces 20 between which the first bank 14 having the defect portion 3 is located, each of the concave spaces 20 is partitioned by a dam portion 50*d* into a first space SA in the vicinity of the defect portion 3, and two second spaces SB outside the vicinity of the defect portion 3, as illustrated in FIG. 20A and FIG. 20B. Further, the defect portion 3 is surrounded by two first spaces SA.

Accordingly, the dam portions 50*d* pertaining to the third modification achieve the effect of confining the color mixture region, similar to the dam portions 50 pertaining to the embodiment. Specifically, as illustrated in FIG. 20B, even if a color mixture region is formed in a concave space 20 between first banks 14 by red ink and green ink mixing via a defect portion 3 when inks for forming light-emitting layers are applied, the color mixture region does not spread beyond the dam portion 50*d* into the second spaces SB. As such, the color mixture region produced by the defect portion 3 is confined within the first space SA, which is a relatively small space in the vicinity of the defect portion 3. Thus, the dam portions 50*d* pertaining to the third modification reduce the risk of light-emission color failure occurring in the display panel 100.

Also, the dam portions 50*d* are formed by applying the repair material so as to surround the defect portion 3. As such, the third modification is similar to the embodiment in that the defect portion 3 can be repaired easily, and further, in that problems such as non-light-emission and current leakage do not occur at the first spaces SA partitioned from the outside by the dam portions 50*d*, after the display panel 100 has been manufactured.

Meanwhile, the dam portions 50*d* in the third modification form first spaces SA with smaller surface areas than the first spaces SA formed by the dam portions 50 in the embodiment. Thus, the third modification prevents display failure and image quality degradation of the display panel 100 to a further extent.

It suffices to form a dam portion 50*d* according to the first forming method as illustrated in FIG. 20A and FIG. 20B, when the candidate first space TSA, which is in this case a space that is in the vicinity of the defect portion 3 and that is partitioned from the outside by the dam portion 50*d*, does not overlap with any second bank 24*a* in plan view, and $I < \alpha \times H$ is fulfilled.

Meanwhile, when the candidate first space TSA does not overlap with any second bank 24*a* in plan view, and $\alpha \times H \leq I$ is fulfilled, it suffices to form two second dams 52 respectively on two second banks 24*a* which are adjacent in the Y direction and between which the defect portion 3 is located.

Further, when one of Y-direction end portions Ea and Eb of the candidate first space TSA of a dam portion 50*d* overlaps with a second bank 24*a* as illustrated in FIG. 21A and FIG. 21B (where Ea is illustrated as overlapping with a second bank 24*a*), dam forming can be performed as follows.

When $I < \alpha \times H$ holds true as illustrated in FIG. 21A, a dam portion 50*d* is formed according to the first forming method at a candidate forming position of the dam portion 50*d*.

Meanwhile, when $\alpha \times H \leq I$ holds true as illustrated in FIG. 21B, instead of forming a dam portion 50*d* at the candidate forming position, two second dams 52 are formed according to the second forming method, respectively on two second banks 24*a* which are adjacent in the Y direction and between which the defect portion 3 is located.

Further, when the candidate first space TSA of a dam portion 50*d* overlaps with a second bank 24*a*, and in addition, spans across two sub-pixel regions between which the second bank 24*a* with which the candidate first space TSA overlaps is located in the Y direction, dam forming can be performed as follows.

In the example illustrated in FIG. 22A, $Ia < \alpha \times H$ is fulfilled. Further, $Ib < \alpha \times H$ is also fulfilled. In this case, a dam portion 50*d* is formed at the candidate forming position according to the first forming method.

Meanwhile, in the example illustrated in FIG. 22B, $Ia < \alpha \times H$ is fulfilled. Further, $\alpha \times H \leq Ib$ is fulfilled.

In this example, distance da fulfills $da < \alpha \times L$. Here, the distance da is the Y-direction distance between the end portion Ea of the dam portion 50*d*, which is relatively upstream in the Y direction, and the second bank 24*a* with which candidate first space TSA overlaps. As such, in this example, even if a first dam 51 is formed at the end portion Ea according to the first forming method instead of forming a dam portion 50*d*, the surface area of a part of the first space SA that overlaps with the upstream sub-pixel region SP is smaller than $\alpha \times H$. As such, even if a first dam 51 is formed at the end portion Ea instead of forming a dam portion 50*d*, the upstream sub-pixel is not perceived as a dark spot.

Meanwhile, the downstream sub-pixel would be perceived as a dark spot even if a dam portion 50*d* is formed. Thus, as illustrated in FIG. 23A, a second dam 52 is formed according to the second forming method, on a second bank 24*a* that is adjacent to and located downstream in the Y direction than the second bank 24a with which the candidate first space TSA overlaps in plan view. Compared to forming a dam portion 50d according to the first forming method, this method of forming a pair of a first dam 51 and a second dam 52 reduces the amount of time required for the forming of dams while preventing display failure and image quality degradation to a substantially similar extent.

Meanwhile, in the example illustrated in FIG. 23B, Ia<α× H and α×H≤Ib are fulfilled. However, in the example illustrated in FIG. 23B, α×L≤da is fulfilled. Accordingly, if a first dam 51 is formed at the end portion Ea, the surface area of the part of the first space SA that overlaps with the upstream sub-pixel region SP is α×H or greater. As such, the upstream sub-pixel would be perceived as a dark spot if a first dam 51 is formed at the end portion Ea. However, it is not clear whether forming a first dam 51 at a position providing the part of the first space SA that overlaps with the upstream sub-pixel region SP with a surface area smaller than α×H is desirable, since it is not clear whether such a position would be located at a sufficient margin from the defect portion 3. Thus, in this example, a dam portion 50d is formed at the candidate forming position of the dam portion 50d according to the first forming method.

Note that in this example, an alternative approach may be taken of forming only a Y-direction upstream part of a dam portion 50d, or that is, only a half of a dam portion 50d from point $A_2$ and point $A_3$, according to the first forming method, and forming a second dam 52 on a second bank 24a that is adjacent to and located downstream in the Y direction than the second bank 24a with which the candidate first space TSA overlaps in plan view.

In the present modification, the two dam portions 50d between which the defect portion 3 is located in the X direction (second direction) both extend between the same points (point $A_1$ and point $A_2$). However, the two dam portions may have different start points and different end points.

Further, the Y-direction coordinate position of the point $A_3$, which is the point where the dam portions 50d between which the defect portion 3 is located in the X direction each come in contact with an adjacent first bank 14a, may differ between the two dam portions 50d.

Fourth Modification

FIG. 24A is a schematic perspective view illustrating the shape of dam portions 50e pertaining to the fourth modification, and FIG. 24B is a schematic plan view illustrating a state where ink layers have been formed after the dam portions 50e have been formed in concave spaces 20.

Each dam portion 50e pertaining to the present modification has the shape illustrated in FIG. 24B. Thus, the dam portions 50e pertaining to the present modification are similar to the dam portions 50d pertaining to the third modification in that in plan view of the X-Y plane, each dam portion 50e extends between two points (point $A_1$ and point $A_2$) between which the defect portion 3 is located in the Y direction, while detouring around the defect portion 3. However, the dam portions 50e pertaining to the present modification differ from the dam portions 50d pertaining to the third modification in that the each dam portion 50e does not come in contact with a first bank 14 adjacent to the first bank 14a having the defect portion 3. In other words, the dam portions 50e pertaining to the fourth modification are such that a maximum X-direction distance b between each dam portion 50e and a center of the defect portion 3 is set so as to be smaller than the width (X-direction width) of a concave space 20.

The dam portions 50e can also be formed by using a method similar to the method described in the embodiment with reference to FIG. 11A through FIG. 11G. Specifically, each dam portion 50e can be formed by using a needle dispenser and applying the repair material with respect to a plurality of application points set along a dam forming line that extends between point $A_1$ and point $A_2$, one after another.

By disposing the dam portions 50e in adjacent concave spaces 20 between which the first bank 14 having the defect portion 3 is located, each of the concave spaces 20 is partitioned by a dam portion 50e into a first space SA in the vicinity of the defect portion 3, and a second space SB outside the vicinity of the defect portion 3, as illustrated in FIG. 24A and FIG. 24B. Accordingly, the dam portions 50e pertaining to the fourth modification achieve the effect of confining the color mixture region, similar to the dam portions 50 pertaining to the embodiment.

Specifically, as illustrated in FIG. 24B, even if a color mixture region is formed in a concave space 20 between first banks 14 by red ink and green ink mixing via the defect portion 3 when inks for forming light-emitting layers are applied, the color mixture region does not spread beyond the dam portion 50e into the second space SB.

Also, the dam portions 50e are formed by applying the repair material so as to surround the defect portion 3. As such, the fourth modification is similar to the embodiment in that the defect portion 3 can be repaired easily, and further, in that problems such as non-light-emission and current leakage do not occur at the first spaces SA partitioned from the outside by the dam portions 50e, after the display panel 100 has been manufactured.

Meanwhile, the dam portions 50e in the fourth modification form first spaces SA with smaller surface areas than the first spaces SA formed by the dam portions 50d in the third modification. Thus, the fourth modification prevents display failure and image quality degradation of the display panel 100 to a further extent.

In FIG. 24B, the two dam portions 50e are located at the same maximum X-direction distance b from the center of the defect portion 3. However, the maximum distance b may differ between the two dam portions 50e.

Further, the two dam portions 50e between which the defect portion 3 is located in the X direction (second direction) both extend between the same points (point $A_1$ and point $A_2$). However, the two dam portions may have different start points and different end points.

Further, when one of two Y-direction end portions of the candidate first space TSA of a dam portion 50e overlaps with a second bank 24a in plan view, dam forming performed in the similar case in the third modification can be performed. Also, when the candidate first space TSA of a dam portion 50e overlaps with a second bank 24a, and in addition, spans across two sub-pixel regions between which the second bank 24a with which the candidate first space TSA overlaps is located in the Y direction, dam forming performed in the similar case in the third modification can be performed. However, since the dam portions 50e pertaining to the present modification do not come in contact with first banks adjacent to the first bank having the defect portion, the option of forming only a Y-direction upstream/downstream part of a dam portion 50e according to the first forming method is not applicable to the present modification.

Fifth Modification

FIG. 25A is a schematic perspective view illustrating the shape of dam portions 50f pertaining to the fifth modification, and FIG. 25B is a schematic cross-sectional view illustrating a state where ink is being applied after the dam portions 50f have been formed in concave spaces 20.

The present modification is similar to the embodiment in terms of the shapes of the first dams 51 formed in adjacent concave spaces 20 between which a first bank 14a having a defect portion 3 is located in the process of repairing the defect portion 3, as illustrated in FIG. 25A. However, the fifth modification differs from the embodiment in that protruding portions 7a protruding upwards from top portions of first banks 14a are formed, where first banks 14a are in contact with the first dams 51.

The protruding portions 7a can be formed by applying the repair material used for forming the first dams 51 with respect to the top portions of first banks 14a by using a needle dispenser, and then drying the repair material so applied.

After being formed in such a manner, the protruding portions 7a are hardened, alongside the first banks 14a, the second banks 24a, the first dams 51, and the second dams 52 in the simultaneous firing process (Step S8 of FIG. 4), whereby they become stable protruding portions 7.

A protruding portion 7 formed in such a manner achieves the effect of preventing ink applied with respect to one concave space 20 in the process in Step S9 of forming the organic light-emitting layers 15 from spreading beyond a first bank 14 into an adjacent concave space 20.

Specifically, in the application of ink, ink droplets arriving directly on a first dam 51 are repelled at the top portion of the first dam 51, and flow along the top portion of the first dam 51 in the X direction, as indicated by the arrows in FIG. 25B. Here, without the protruding portions 7, the ink droplets flowing in the X direction would head towards adjacent concave spaces 20 over first banks 14. Meanwhile, with the structure pertaining to the fifth modification, the protruding portions 7 present at the end portions of the first dams 51 block the ink droplets heading towards the adjacent concave spaces 20, whereby ink is prevented from spreading into the adjacent concave spaces 20.

The protruding portions 7 may also be formed at portions of the first banks 14a that are in contact with the second dams 52, in addition to being formed at portions of the first banks 14a that are in contact with the first dams 51.

Sixth Modification

The embodiment and the first through fifth modifications provide description of repair performed with respect to a defect portion in a line bank structure. Meanwhile, the technology pertaining to the present disclosure is similarly applicable to the repair of a defect portion in a pixel bank structure.

Each of FIG. 26A through FIG. 26D is a schematic plan view illustrating an example of repairing a defect portion in a display panel having a pixel bank structure.

Each of FIG. 26A through FIG. 26D illustrates a pixel bank structure composed of a plurality of first banks 14 elongated and extending in the Y direction and a plurality of second banks 24 elongated and extending in the X direction. Here, the height (Z-direction height) of the first banks 14 from the top surface of the ground substrate 11 is equal to the height (Z-direction height) of the second banks 24 from the top surface of the ground substrate 11. Further, light-emitting elements are disposed in rectangular concave spaces (sub-pixel regions) 20 defined by the first banks 14 and the second banks 24.

In each example, a dam portion is formed in each of adjacent concave spaces 20 between which a first bank 14 having a defect portion 3 is located in the X direction. A dam portion formed in a concave space 20 partitions the concave space 20 into a first space SA in the vicinity of the defect portion 3 and one or more second spaces SB outside the vicinity of the defect portion 3. Note that in a display panel having a pixel bank structure, the concave spaces 20 correspond to the sub-pixel regions, in plan view.

FIG. 26A illustrates a sixth modification. In the sixth modification, a pair of first dams 51 is formed in each of concave spaces 20 between which the first bank 14 having the defect portion 3 is located in the X direction. The two first dams 51 extend between different ones of points $A_1$ and $A_2$ and a first bank 14 that is adjacent to the first bank 14 having the defect portion 3 in the X direction. This is similar to the first implementation of the embodiment.

As such, even if a color mixture region is formed due to the presence of the defect portion 3 when ink application is performed, this modification confines the color mixture region within a first space SA, which is the space between a pair of first dams 51. As such, this modification also prevents light-emission color failure. Further, when the organic light-emitting layers 15 are formed, a first light-emitting layer 15A is formed within the first space SA, and second light-emitting layers 15B are formed within the second spaces SB.

Further, protruding portions 7a may also be formed in the present modification at portions where the first dams 51 and the first banks 14 come in contact, similar to the fifth modification.

Seventh Modification

FIG. 26B illustrates a seventh modification. In the seventh modification, a dam portion 50d is formed in each of concave spaces 20 between which the first bank 14 having the defect portion 3 is located in the X direction. The dam portion 50d extends between points $A_1$ and $A_2$, detouring around the defect portion 3. This is similar to the third modification. Each dam portion 50d pertaining to the seventh modification is in contact with an adjacent first bank 14 at a point $A_3$ located at some point along the path between point $A_1$ and point $A_2$, as illustrated in FIG. 26B.

As such, even if a color mixture region is formed due to the presence of the defect portion 3 when ink application is performed, this modification confines the color mixture region within a first space SA, which is the space surrounded by a dam portion 50d. As such, this modification also prevents light-emission color failure. Further, when the organic light-emitting layers 15 are formed, a first light-emitting layer 15A is formed within the first space SA, and second light-emitting layers 15B are formed within the second spaces SB.

While not depicted in any of the drawings, the dam portions 50e pertaining to the fourth modification may also be applied with respect to the pixel bank structure. That is, the dam portions in the seventh modification need not come in contact with first banks 14. This modification also prevents light-emission color failure.

Further, protruding portions 7a may also be formed in the present modification at portions where the dam portions 50d and the first banks 14 come in contact, similar to the fifth modification.

Eighth Modification

FIG. 26C illustrates an eighth modification. In the eighth modification, a first bank 14 has a defect portion 3 at a position relatively close to a second bank 24. Further, a dam portion 50g is formed in each of concave spaces 20 between which the first bank 14 having the defect portion 3 is located in the X direction. The dam portion 50g extends between point $A_1$ and the second bank 24, detouring around the defect portion 3.

As such, even if a color mixture region is formed due to the presence of the defect portion 3 when ink application is performed, the eighth modification confines the color mixture region within a first space SA, which is the space surrounded by a dam portion 50g, a first bank 14, and a second bank 24. As such, this modification also prevents light-emission color failure. Further, when the organic light-emitting layers 15 are formed, a first light-emitting layer 15A is formed within the first space SA, and a second light-emitting layer 15B is formed within the second space SB.

Further, protruding portions 7a may also be formed in the present modification at portions where the dam portions 50g and the first banks 14 come in contact, similar to the fifth modification.

Ninth Modification

FIG. 26D illustrates a ninth modification. In the ninth modification, a defect portion 3 exists at a position where a first bank 14 and a second bank 24 intersect, and the defect portion 3 affects four concave spaces 20.

Further, a dam portion 50h is formed in each of these four concave spaces 20.

Specifically, among the four dam portions 50h that are formed, two dam portions 50h each extend between point $A_1$ and the second bank 24 while detouring around the defect portion 3, and the two remaining dam portions 50h each extend between point $A_2$ and the second bank 24 while detouring around the defect portion 3.

In this case, due to the presence of the defect portion 3, color mixture may occur between the four concave spaces 20 when ink application is performed. However, even if color mixture regions are actually formed, the color mixture regions are confined within the first spaces SA surrounded by the dam portions 50h. As such, this modification also prevents light-emission color failure. Further, when the organic light-emitting layers 15 are formed, a first light-emitting layer 15A is formed within the first space SA, and a second light-emitting layer 15B is formed within the second space SB.

Further, protruding portions 7a may also be formed in the present modification at portions where the dam portions 50h and the first banks 14 come in contact, similar to the fifth modification.

Tenth Modification

The embodiment, the implementations, and the modifications describe bank repair methods and forms of banks while taking a top emission organic EL panel as an example. However, the technology pertaining to the present disclosure is also applicable to a bottom emission organic EL panel.

The technology pertaining to the present disclosure is applicable to an organic EL display device used, for example, in various display devices, television devices, portable electronic device displays, and so on used in private homes, public facilities, and for commercial use.

Although the technology pertaining to the present disclosure has been fully described by way of examples with reference to the accompanying drawings, it is to be noted that various changes and modifications will be apparent to those skilled in the art. Therefore, unless such changes and modifications depart from the scope of the present disclosure, they should be construed as being included therein.

The invention claimed is:

1. A bank repair method in a manufacturing process of an organic EL display device including: a substrate; first banks and second banks disposed over the substrate; and light-emitting layers disposed in concave spaces that the first banks define over the substrate, the first banks elongated in a first direction and spaced away from one another in a second direction, the second banks elongated in the second direction and spaced away from one another in the first direction, the first direction and the second direction being different directions along a top surface of the substrate and intersecting with one another, the bank repair method comprising:
   detecting a defect portion of a first bank;
   when the defect portion of the first bank is detected, setting a candidate forming position for a dam portion in each of adjacent concave spaces between which the first bank having the defect portion is located in the second direction; and
   forming the dam portion in each of the adjacent concave spaces, the dam portion formed in a concave space partitioning the concave space into a first space in a vicinity of the defect portion and a second space outside the vicinity of the defect portion, wherein
   when (i) defining a region surrounded by a pair of adjacent first banks and a pair of adjacent second banks as a sub-pixel region, and denoting a plan-view surface area of a sub-pixel region as H, and (ii) defining a region of the candidate first space that overlaps with a sub-pixel region as an overlap region, and denoting a plan-view surface area of the overlap region as I, wherein the candidate first space is the first space when the dam portion is formed at the candidate forming position,
   when I<α×H is fulfilled, where α fulfills 0.05<α<0.9, and the candidate first space does not overlap with any second bank in plan view, the dam portion is formed at the candidate forming position according to a first forming method.

2. The bank repair method of claim 1, wherein
   a height of the second banks from the top surface of the substrate is smaller than a height of the first banks from the top surface of the substrate, and when α×H≤I is fulfilled and, the candidate first space does not overlap with any second bank in plan view or one of two ends of the candidate first space in the first direction overlaps with a second bank in plan view, the dam portion is a pair of dams formed according to a second forming method forming the dam portion at higher speed than the first forming method, the dams, in plan view, each extending in the second direction from the first bank having the defect portion to an adjacent first bank, and respectively formed on two adjacent second banks between which the defect portion is located in the first direction.

3. The bank repair method of claim 2, wherein
when I<α×H is fulfilled and one of two first-direction ends of the candidate first space overlaps with a second bank in plan view,
the dam portion is a pair of dams composed of one dam formed according to the second forming method on the second bank with which the one of two first-direction ends of the candidate first space overlaps, and one dam formed according to the first forming method at a corresponding candidate forming position.

4. The bank repair method of claim 3, wherein
when the candidate first space, in plan view, spans over a second bank and across two sub-pixel regions between which the second bank is located in the first direction,
when (i) defining a region of one of the two sub-pixel regions that overlaps with the candidate first space as a first overlap region, and denoting a plan-view surface area of the first overlap region as Ia, the one of the two sub-pixel regions being a sub-pixel region in which one first-direction end of the candidate first space is located, and (ii) defining a region of the other one of the two sub-pixel regions that overlaps with the candidate first space as a second overlap region, and denoting a plan-view surface area of the second overlap region as Ib, the other one of the two sub-pixel regions being a sub-pixel region in which the other first-direction end of the candidate first space is located,
the dam portion is a pair of a first dam and a second dam, the first dam corresponding to the one first-direction end of the candidate first space and the second dam corresponding to the other first-direction end of the candidate first space, wherein
the first dam is formed according to the first forming method at a corresponding candidate forming position when Ia<α×H is fulfilled, and is formed according to the second forming method on one of two second banks adjacent to the second bank with which the candidate first space overlaps that is at a side of the one first-direction end of the candidate first space when α×H≤Ia is fulfilled, and
the second dam is formed according to the first forming method at a corresponding candidate forming position when Ib<α×H is fulfilled, and is formed according to the second forming method on the other one of the two second banks adjacent to the second bank with which the candidate first space overlaps, which is at a side of the other first-direction end of the candidate first space, when α×H≤Ib is fulfilled. direction,
when (i) defining a region of one of the two sub-pixel regions that overlaps with the candidate first space as a first overlap region, and denoting a plan-view surface area of the first overlap region as Ia, the one of the two sub-pixel regions being a sub-pixel region in which one first-direction end of the candidate first space is located, and (ii) defining a region of the other one of the two sub-pixel regions that overlaps with the candidate first space as a second overlap region, and denoting a plan-view surface area of the second overlap region as Ib, the other one of the two sub-pixel regions being a sub-pixel region in which the other first-direction end of the candidate first space is located,
the dam portion is a pair of a first dam and a second dam, the first dam corresponding to the one first-direction end of the candidate first space and the second dam corresponding to the other first-direction end of the candidate first space, wherein
the first dam is formed according to the first forming method at a corresponding candidate forming position when Ia<α×H is fulfilled, and is formed according to the second forming method on one of two second banks adjacent to the second bank with which the candidate first space overlaps that is at a side of the one first-direction end of the candidate first space when α×H≤Ia is fulfilled, and
the second dam is formed according to the first forming method at a corresponding candidate forming position when Ib<α×H is fulfilled, and is formed according to the second forming method on the other one of the two second banks adjacent to the second bank with which the candidate first space overlaps, which is at a side of the other first-direction end of the candidate first space, when α×H≤Ib is fulfilled.

5. The bank repair method of claim 2, wherein
the second forming method forms the dam portion by using a nozzle dispenser.

6. The bank repair method of claim 1, wherein
the dam portion is a pair of dams extending from different ones of two points on the first bank having the defect portion to an adjacent first bank, the defect portion being located between the two points in the first direction.

7. The bank repair method of claim 6, wherein
the dam portion is a pair of dams extending along the second direction.

8. The bank repair method of claim 6, wherein
the dam portion is a pair of dams extending in parallel in a direction intersecting with the second direction.

9. The bank repair method of claim 6, wherein
the dam portion is a pair of dams located at a distance from one another, the distance decreasing with increasing distance from the first bank having the defect portion.

10. The bank repair method of claim 1, wherein
the dam portion extends between two points on the first bank having the defect portion while detouring around the defect portion, the defect portion being located between the two points in the first direction.

11. The bank repair method of claim 10, wherein
when I<α×H is fulfilled and one of two first-direction ends of the candidate first space overlaps with a second bank in plan view,
the dam portion is formed at the candidate forming position according to the first forming method.

12. The bank repair method of claim 10, wherein
when the candidate first space, in plan view, spans over a second bank and across two sub-pixel regions between which the second bank is located in the first direction,
when (i) defining a region of one of the two sub-pixel regions that overlaps with the candidate first space as a first overlap region, and denoting a plan-view surface area of the first overlap region as Ia, the one of the two sub-pixel regions being a sub-pixel region in which one first-direction end of the candidate first space is located, and (ii) defining a region of the other one of the two sub-pixel regions that overlaps with the candidate first space as a second overlap region, and denoting a plan-view surface area of the second overlap region as Ib, the other one of the two sub-pixel regions being a sub-pixel region in which the other first-direction end of the candidate first space is located, the dam portion is formed according to the first forming method at the candidate forming position when Ia<α×H and Ib<α×H are fulfilled, and the dam portion is a pair of dams formed according to a second forming method forming the dam portion at higher speed than the first forming method when α×H≤Ia and α×H≤Ib are fulfilled, the dams, in plan view, each extending in the second direction from the first bank having the defect portion to an adjacent first bank, and respectively formed on two second banks adjacent to the second bank with which the candidate first space overlaps.

13. The bank repair method of claim 12, wherein when the candidate first space, in plan view, spans over a second bank and across two sub-pixel regions between which the second bank is located in the first direction, and Ia<α×H and α×H≤Ib are fulfilled, when denoting a length of a sub-pixel region in the first direction as L, and denoting a distance in the first direction between the one first-direction end of the candidate first space and an end portion of the second bank with which the candidate first space overlaps that is at a side of the one first-direction end of the candidate first space as da, the dam portion is a pair of a first dam and a second dam when da<α×L is fulfilled, the first dam formed according to the first forming method at a position corresponding to the one first-direction end of the candidate first space and the second dam formed according to the second forming method on one of two second banks adjacent to the second bank with which the candidate first space overlaps that is at a side of the other first-direction end of the candidate first space, and the dam portion is formed according to the first forming method at the candidate forming position when α×L≤da is fulfilled.

14. The bank repair method of claim 10, wherein the dam portion comes in contact with a first bank adjacent to the first bank having the defect portion at some point along a path between the two points.

15. The bank repair method of claim 10, wherein the dam portion does not come in contact with a first bank adjacent to the first bank having the defect portion.

16. The bank repair method of claim 1, wherein in the forming of the dam portion, a protruding portion is formed in addition to the dam portion, the protruding portion protruding upward from a top surface of each of the first bank having the defect portion and an adjacent first bank at a portion coming in contact with the dam portion.

17. The bank repair method of claim 1, wherein a height of the second banks from the top surface of the substrate is equal to a height of the first banks from the top surface of the substrate, and the dam portion is not formed in a sub-pixel region in which α×H≤I is fitted.

18. The bank repair method of claim 1, wherein the first forming method forms the dam portion by using a needle dispenser.

19. The bank repair method of claim 1, wherein

α=0.2.

20. A manufacturing method of an organic EL display device, comprising:
forming the dam portion according to the bank repair method of claim 1; and after forming the dam portion, forming the light-emitting layers in the concave spaces by ejecting ink droplets into the concave spaces by using a nozzle head, wherein in the forming of the light-emitting layers, ink droplets are ejected from the nozzle head to arrive in both the first space and the second space.

21. An organic EL display device comprising:
a substrate;
first banks and second banks disposed over the substrate; and
light-emitting layers disposed in concave spaces that the first banks define over the substrate, wherein
the first banks are elongated in a first direction and spaced away from one another in a second direction, and the second banks are elongated in the second direction and spaced away from one another in the first direction, the first direction and the second direction being different directions along a top surface of the substrate and intersecting with one another,
the first banks include a first bank having a defect portion, the defect portion being a foreign particle or a missing portion of the first bank, and
a dam portion is disposed in each of adjacent concave spaces between which the first bank having the defect portion is located in the second direction, the dam portion formed in a concave space partitioning a light-emitting layer disposed in the concave space into a first light-emitting layer in a vicinity of the defect portion and a second light-emitting layer outside the vicinity of the defect portion.

22. The organic EL display device of claim 21, wherein a light-emission color of the first light-emitting layer differs from a light-emission color of the second light-emitting layer, and
the light-emission color of the first light-emitting layer is a mixture of light-emission colors of second light-emitting layers respectively disposed in the adjacent concave spaces.

23. The organic EL display device of claim 21, wherein a height of the second banks from the top surface of the substrate is smaller than a height of the first banks from the top surface of the substrate, and
when (i) defining a region surrounded by a pair of adjacent first banks and a pair of adjacent second banks as a sub-pixel region, and denoting a plan-view surface area of a sub-pixel region as H, and (ii) denoting a plan-view surface area of the first light-emitting layer as I,
I<α×H is fulfilled, where a fulfills 0.05<α<0.9,
in plan view, the first light-emitting layer does not overlap with any second bank, or one of two first-direction ends of the first light-emitting layer overlaps with a second bank, and
the dam portion has a first width.

24. The organic EL display device of claim 23, wherein the first width is between 5 μm and 20 μm.

25. The organic EL display device of claim 21, wherein a height of the second banks from the top surface of the substrate is smaller than a height of the first banks from the top surface of the substrate,
when defining a region surrounded by a pair of adjacent first banks and a pair of adjacent second banks as a sub-pixel region, the first light-emitting layer, in plan view, spans over a second bank and across two sub-pixel regions between which the second bank is located in the first direction, when (i) denoting a plan-view surface area of a sub-pixel region as H, (ii) defining a region of one of the two sub-pixel regions that overlaps with the first light-emitting layer as a first overlap region, and denoting a plan-view surface area of the first overlap region as Ia, the one of the two sub-pixel regions being a sub-pixel region in which one first-direction end of the light-emitting layer is located, and (iii) defining a region of the other one of the two sub-pixel regions that overlaps with the first light-emitting layer as a second overlap region, and denoting a plan-view surface area of the second overlap region as Ib, the other one of the two sub-pixel regions being a sub-pixel region in which the other first-direction end of the light-emitting layer is located, Ia<α×H and Ib<α×H are fulfilled, and the dam portion has a first width.

26. The organic EL display device of claim 21, wherein the dam portion is a pair of dams each having a first width and extending from different ones of two points on the first bank having the defect portion to an adjacent first bank, the defect portion being located between the two points in the first direction.

27. The organic EL display device of claim 26, wherein the dams extend along the second direction.

28. The organic EL display device of claim 26, wherein the dams extend in parallel in a direction intersecting with the second direction.

29. The organic EL display device of claim 26, wherein the dams are located at a distance from one another, the distance decreasing with increasing distance from the first bank having the defect portion.

30. The organic EL display device of claim 21, wherein the dam portion extends between two points on the first bank having the defect portion while detouring around the defect portion, the defect portion being located between the two points in the first direction.

31. The organic EL display device of claim 30, wherein the dam portion comes in contact with a first bank adjacent to the first bank having the defect portion at some point along a path between the two points.

32. The organic EL display device of claim 30, wherein the dam portion does not come in contact with a first bank adjacent to the first bank having the defect portion.

33. The organic EL display device of claim 21, wherein a height of the second banks from the top surface of the substrate is smaller than a height of the first banks from the top surface of the substrate, when defining a region surrounded by a pair of adjacent first banks and a pair of adjacent second banks as a sub-pixel region, the first light-emitting layer, in plan view, spans over a second bank across two sub-pixel regions between which the second bank is located in the first direction, the dam portion has a first width and extends between two points on the first bank having the defect portion while detouring around the defect portion, the defect portion being located between the two points in the first direction, when (i) denoting a plan-view surface area of a sub-pixel region as H, (ii) defining a region of one of the two sub-pixel regions that overlaps with the first light-emitting layer as a first overlap region, and denoting a plan-view surface area of the first overlap region as Ia, the one of the two sub-pixel regions being a sub-pixel region in which one first-direction end of the light-emitting layer is located, (iii) defining a region of the other one of the two sub-pixel regions that overlaps with the first light-emitting layer as a second overlap region, and denoting a plan-view surface area of the second overlap region as Ib, the other one of the two sub-pixel regions being a sub-pixel region in which the other first-direction end of the light-emitting layer is located, (iv) denoting a length of a sub-pixel region in the first direction as L, and (v) denoting a distance in the first direction between the one first-direction end of the first light-emitting layer and an end portion of the second bank with which the first light-emitting layer overlaps at a side of the one first direction end of the first light-emitting layer as da, $Ia < \alpha \times H$, $\alpha \times H \leq Ib$, and $\alpha \times L \leq da$ are fulfilled.

34. The organic EL display device of claim 21, wherein a height of the second banks from the top surface of the substrate is smaller than a height of the first banks from the top surface of the substrate, when defining a region surrounded by a pair of adjacent first banks and a pair of adjacent second banks as a sub-pixel region, the first light-emitting layer, in plan view, spans over a second bank and across two sub-pixel regions between which the second bank is located in the first direction, the dam portion is a pair of a first dam and a second dam, the first dam has a first width, is disposed at one first-direction side of the second bank with which the first light-emitting layer overlaps, and extends in the second direction from the first bank having the defect portion to an adjacent first bank, the second dam has a second width greater than the first width, is disposed on a second bank that is adjacent to the second bank with which the first light-emitting layer overlaps and is located at the other first-direction side of the second bank with which the first light-emitting layer overlaps, and extends in the second direction from the first bank having the defect portion to the adjacent first bank, and when (i) denoting a plan-view surface area of a sub-pixel region as H, and (ii) defining a region of one of the two sub-pixel regions that overlaps with the first light-emitting layer as a first overlap region, and denoting a plan-view surface area of the first overlap region as Ia, the one of the two sub-pixel regions being a sub-pixel region at the one first-direction side of the second bank with which the first light-emitting layer overlaps, $Ia < \alpha \times H$ is fulfilled.

35. The organic EL display device of claim 34, wherein the second width is between 10 μm and 50 μm.

36. The organic EL display device of claim 21, wherein a height of the second banks from the top surface of the substrate is smaller than a height of the first banks from the top surface of the substrate, the defect portion does not overlap with any second bank in plan view, and the dam portion is a pair of dams each having a second width, the dams respectively disposed on two adjacent second banks between which the defect portion is located in the first direction and each extending in the second direction from the first bank having the defect portion to an adjacent first bank.

37. The organic EL display device of claim 21, wherein a height of the second banks from the top surface of the substrate is smaller than a height of the first banks from the top surface of the substrate, the defect portion overlaps with a second bank in plan view, and the dam portion is a pair of dams each having a second width, the dams respectively disposed on two second banks between which the second bank overlapping with the defect portion is located in the first direction and each extending in the second direction from the first bank having the defect portion to an adjacent first bank.

38. The organic EL display device of claim 21 further comprising
a protruding portion protruding upward from a top surface of each of the first bank having the defect portion and an adjacent first bank at a portion coming in contact with the dam portion.

39. The organic EL display device of claim 21, wherein
a height of the second banks from the top surface of the substrate is equal to a height of the first banks from the top surface of the substrate,
when (i) defining a region surrounded by a pair of adjacent first banks and a pair of adjacent second banks as a sub-pixel region, and denoting a plan-view surface area of a sub-pixel region as H, and (ii) denoting a plan-view surface area of the first light-emitting layer as I, $I < \alpha \times H$ is fulfilled, where a fulfills $0.05 < \alpha < 0.9$, and
the dam portion has a first width.

* * * * *